(12) United States Patent
Narui et al.

(10) Patent No.: US 6,924,525 B2
(45) Date of Patent: Aug. 2, 2005

(54) SEMICONDUCTOR INTEGRATED CIRCUIT DEVICE INCLUDING MEMORY CELL SECTION HAVING CAPACITOR OVER BITLINE STRUCTURE AND WITH THE MEMORY AND PERIPHERAL SECTIONS HAVING CONTACT PLUG STRUCTURES CONTAINING A BARRIER FILM AND EFFECTING ELECTRICAL CONTACT WITH MISFETS OF BOTH MEMORY AND PERIPHERAL SECTIONS

(75) Inventors: Seiji Narui, Hamura (JP); Tetsu Udagawa, Iruma (JP); Kazuhiko Kajigaya, Iruma (JP); Makoto Yoshida, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/642,743

(22) Filed: Aug. 19, 2003

(65) Prior Publication Data

US 2004/0031980 A1 Feb. 19, 2004

Related U.S. Application Data

(63) Continuation of application No. 09/714,127, filed on Nov. 17, 2000, now Pat. No. 6,635,918, which is a continuation of application No. 08/782,351, filed on Jan. 13, 1997, now Pat. No. 6,150,689.

(30) Foreign Application Priority Data

Jan. 12, 1996 (JP) .................................. 8-3648

(51) Int. Cl.⁷ ............................................ H01L 27/108
(52) U.S. Cl. ...................................... 257/306; 257/296
(58) Field of Search ................................ 257/296, 297, 257/298, 299, 300, 306, 307, 308, 309, 310, 311, 312, 313

(56) References Cited

U.S. PATENT DOCUMENTS

| 4,937,645 A | 6/1990 | Ootsuka et al. |
| 5,188,975 A | 2/1993 | Kojima et al. |
| 5,204,286 A | 4/1993 | Doan |
| 5,240,505 A | 8/1993 | Iwasaki et al. |
| 5,264,712 A | 11/1993 | Murata et al. |
| 5,336,638 A | 8/1994 | Suzuki et al. |
| 5,471,079 A | 11/1995 | Ikeda |
| 5,567,964 A | 10/1996 | Kashihara et al. |
| 5,604,365 A * | 2/1997 | Kajigaya et al. |
| 5,726,083 A * | 3/1998 | Takaishi |
| 5,760,475 A | 6/1998 | Cronin et al. |
| 5,783,471 A | 7/1998 | Chu |
| 5,793,076 A | 8/1998 | Fazan et al. |
| 5,796,166 A | 8/1998 | Agnello et al. |

FOREIGN PATENT DOCUMENTS

| CN | 1108433 A | 9/1995 |
| JP | 64-027243 | 1/1989 |
| JP | 406053494 A | 2/1994 |
| JP | 7-106437 | 4/1995 |

OTHER PUBLICATIONS

Patent Abstracts of Japan, vol. 95, No. 7, Aug. 31, 1995, JP–7–106437A (Hitachi, Ltd.), Apr. 21, 1995.

* cited by examiner

Primary Examiner—Nathan J. Flynn
Assistant Examiner—Kevin Quinto
(74) Attorney, Agent, or Firm—Antonelli, Terry, Stout & Kraus, LLP

(57) ABSTRACT

The sheet resistance of a gate electrode 8A (a word line) of memory cell selection MISFET Q a DRAM and a sheet resistance of bit lines $BL_1$, $BL_2$ are, respectively, 2 $\Omega/\square$ or below. Interconnections of a peripheral circuit are formed during the step of forming the gate electrode 8A (the word line WL) or the bit lines $BL_1$, $BL_2$ by which the number of the steps of manufacturing the DRAM can be reduced.

4 Claims, 58 Drawing Sheets

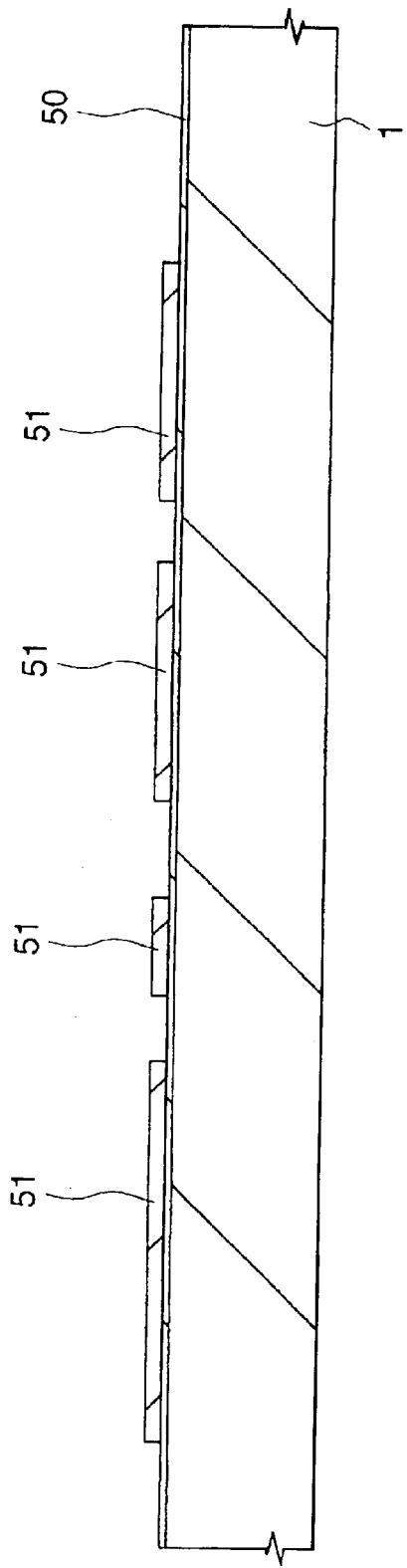
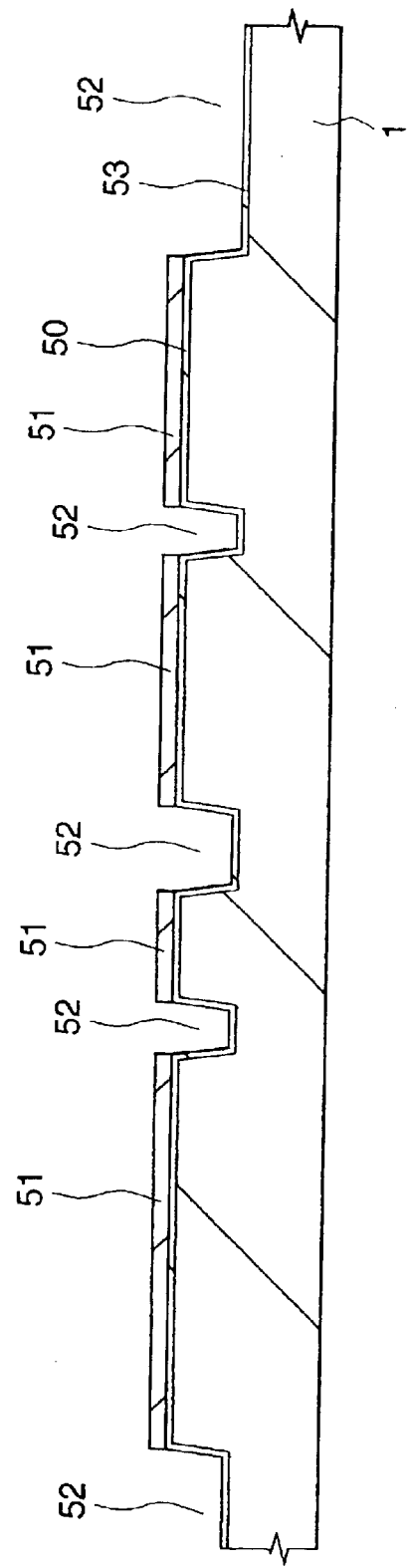

SEMICONDUCTOR INTEGRATED CIRCUIT DEVICE INCLUDING MEMORY CELL SECTION HAVING CAPACITOR OVER BITLINE STRUCTURE AND WITH THE MEMORY AND PERIPHERAL SECTIONS HAVING CONTACT PLUG STRUCTURES CONTAINING A BARRIER FILM AND EFFECTING ELECTRICAL CONTACT WITH MISFETS OF BOTH MEMORY AND PERIPHERAL SECTIONS

This application is a continuation of U.S. application Ser. No. 09/714,127, filed Nov. 17, 2000 now U.S. Pat. No. 6,635,918, which, in turn, is a continuation of U.S. application Ser. No. 08/782,351, filed Jan. 13, 1997, and now U.S. Pat. No. 6,150,689, and the entire disclosures of which are hereby incorporated by reference.

BACKGROUND OF THE INVENTION

This invention relates to a semiconductor integrated circuit device and also to a method for manufacturing the same. More particularly, the invention relates to a technique which is suitably applicable to semiconductor integrated circuit devices which include a DRAM (dynamic random access memory) provided with a memory cell having a stacked capacitor structure wherein an information storage capacitor is arranged above a MISFET for memory cell selection.

The recent DRAM with a great capacity usually has a stacked capacitor structure, wherein an information storage capacitor is arranged above a memory cell selection MISFET, in order to compensate for a storage charge reduction of an information storage capacitor as will be caused by the miniaturization of the memory cells.

The information storage capacitor having the stacked capacitor structure is formed by successively superposing a storage electrode (lower electrode), a capacity insulating film (dielectric film), and a plate electrode (upper electrode). The storage electrode of the information storage capacitor is connected with one of the semiconductor regions (source region, drain region) of a memory selection MISFET of the n channel type. The plate electrode is constituted as a common electrode for a plurality of memory cells and is supplied with a given fixed potential (plate potential).

The other semiconductor region (source region, drain region) of the memory cell selection MISFET is, in turn, connected to a bit line in order to permit data to be written in and read out. The bit line is provided between the MISFET for memory cell selection and the information storage capacitor or above the information storage capacitor. The structure wherein the information storage capacitor is provided above the bit lines is called a "capacitor over bitline" (COB) structure.

A DRAM having such a COB structure is described, for example, in Japanese Laid-open Patent Application No. 7-122654 (corresponding to a U.S. patent application Ser. No. 08/297,039, assigned to Hitachi Ltd.), and Japanese Laid-open Patent Application No. 7-106437.

The DRAM disclosed in the Japanese Laid-open Patent Application No. 7-122654 includes bit lines which are formed of a polysilicon film (or polycide film) formed above the MISFET for memory cell selection wherein a gate electrode (word line) is formed of a built-up film (polycide film) of a polysilicon film and a tungsten silicide ($WSi_x$) film. An information storage capacitor which includes a storage electrode formed of a polysilicon, a capacitance insulating film constituted of a built-up film of a silicon oxide film and a silicon nitride film, and a plate electrode formed of a polysilicon film are provided above the bit lines. In addition, a common source line made of a first layer made of an Al (aluminum) film and a word line for a shunt are formed over the information storage capacitor.

The DRAM set out in the Japanese Laid-open Patent Application No. 7-106437 includes bit lines made of a polysilicide film and formed on the MISFET for memory cell selection whose gate electrode (word line) is made of a polysilicon film. The storage electrode or plate electrode of the information storage capacitor disposed above the bit lines and the first interconnection layer of a peripheral circuit are both formed of a metal material (e.g. Pt). Thus, the step of forming the electrode of the information storage capacitor and the step of forming the metallic interconnection of the peripheral circuit are performed commonly to simplify the manufacturing process.

SUMMARY OF THE INVENTION

The DRAM having the COB structure includes a gate electrode (word line) formed of polysilicon or polycide which has a resistance greater than metallic materials such as Al or W, so that a metallic interconnection (a word line for shunt) for backing the gate electrode is formed above the information storage capacitor, thereby reducing the delay of the gate. Since the bit line is constituted of polycide which is unable to simultaneously connect n-type and p-type semiconductor regions therewith, it is not possible to use a common interconnection for the bit lines and the peripheral circuit. To avoid this, the number of interconnection layers for both the memory arrays and the peripheral circuit increases, thus presenting a problem of increasing the number of manufacturing steps.

The common use of the interconnections for the bit lines and the peripheral circuit is not possible, so that the first interconnection layer of the peripheral circuit has to be formed as an upper layer relative to the bit lines. This causes a great aspect ratio (diameter/depth) of a connection hole for connecting the first interconnection layer and the MISFETs of the peripheral circuit, with the attendant problem that the formation of the connection hole becomes difficult and it also becomes difficult to embed or fill an interconnection material in the connection hole.

Where the gate electrode (word line) is formed of polysilicon or polycide with a high resistance, it is not possible to increase the number of memory cells capable of connection with one word driver or sense amplifier. More particularly, in order to reduce the delay of the gate, an increasing number of word drivers or sense amplifiers are necessary for connection to a given number of memory cells, so that there arises the problem that the chip size has to be increased, resulting in the lowering in degree of integration.

An object of the invention is to provide a technology capable of simplifying a process of manufacturing a DRAM having the COB structure.

Another object of the invention is to provide a technology for achieving a high-speed DRAM having the COB structure.

A further object of the invention is to provide a technology for achieving a high performance DRAM having the COB structure.

A still further object of the invention is to provide a technology for achieving a highly integrated DRAM having the COB structure.

The above and other objects, and features of the invention will become apparent from the description with reference to the accompanying drawings.

Typical inventions in this application are summarized below.

The semiconductor integrated circuit device according to one aspect of the inventions comprises a DRAM which includes a memory cell constituted of a MISFET for memory cell selection and an information storage capacitor formed on the MISFET, wherein a sheet resistance of a gate electrode of the MISFET for memory cell selection and a word line connected thereto, and a sheet resistance of a bit line connected to one of a source region and a drain region of the MISFET for memory cell selection, are, respectively, 2 $\Omega/\square$ or below.

In the above one aspect of the invention, it is preferred that the sheet resistance of the gate electrode of the MISFET for memory cell selection and the word line connected thereto, and the sheet resistance of the bit line connected to one of a source region and a drain region of the MISFET for memory cell selection, are, respectively, 1 $\Omega/\square$ or below.

It is also preferred that the gate electrode of the MISFET and the word line connected thereto are, respectively, made of a built-up film comprising, at least, a polysilicon film and a metallic film or a metal silicide film formed on the polysilicon film.

Preferably, the bit line is arranged above or over the MISFET for memory cell selection, and the information storage capacitor is arranged above or over the bit line.

The bit line should preferably be constituted of a built-up film which comprises, at least, a polysilicon film and a metallic film or a metal silicide film formed on the polysilicon film.

The sheet resistance of the interconnection formed on the information storage capacitor should preferably be equal to or smaller than that of the bit line.

A given interconnection layer of a peripheral circuit of the DRAM in the semiconductor integrated circuit device of the invention should preferably include an interconnection formed in the same manufacturing step as the gate electrode of the memory cell selection MISFET and the word line connected thereto.

A given interconnection layer of a peripheral circuit of the DRAM in the semiconductor integrated circuit device of the invention should preferably include an interconnection formed in the same manufacturing step as the bit line.

Preferably, the peripheral circuit of the DRAM is provided with a resistor which is formed in the same manufacturing step as the bit line.

According to a further aspect of the invention, there is also provided a semiconductor integrated circuit device which comprises a DRAM having a memory cell which includes a MISFET for memory cell selection and an information storage capacitor formed on the MISFET, wherein the information storage capacitor has a storage electrode whose sheet resistance is 2 $\Omega/\square$ or below.

In this further aspect, it is preferred that an interconnection formed in the same manufacturing step as the storage electrode of the information storage capacitor is formed in a given interconnection layer of a peripheral circuit of the DRAM.

It is also preferred that the peripheral circuit of the DRAM is provided with a resistor which is formed in the same manufacturing step as the storage electrode of the information storage capacitor.

According to a further aspect of the invention, there is provided a semiconductor integrated circuit device which comprises a DRAM having a memory cell which includes a MISFET for memory cell selection and an information storage capacitor formed on the MISFET, wherein the information storage capacitor has a plate electrode whose sheet resistance is 2 $\Omega/\square$ or below.

In the further aspect, it is preferred that an interconnection formed in the same manufacturing step as the plate electrode of the information storage capacitor is formed in a given interconnection layer of a peripheral circuit of the DRAM.

Preferably, the peripheral circuit of the DRAM is provided with a resistor which is formed in the same manufacturing step as the plate electrode of the information storage capacitor.

According to a still further aspect of the invention, there is provided a method for manufacturing a semiconductor integrated circuit device which comprises a DRAM which includes a memory cell constituted of a MISFET for memory cell selection and an information storage capacitor formed thereon, the method comprising the steps of:

(a) forming a word line connected to a gate electrode of the MISFET for memory cell selection on a semiconductor substrate wherein the word line has a sheet resistance of 2 $\Omega/\square$ or below; and (b) forming a bit line connected to one of a source region and a drain region of the MISFET for memory cell selection on the gate electrode of the MISFET for memory cell selection and the word line connected thereto and having a sheet resistance of 2 $\Omega/\square$ or below.

Preferably, the method further comprises the step of forming an information storage capacitor on the bit line wherein at least one of a storage electrode and a plate electrode of the capacitor has a sheet resistance of 2 $\Omega/\square$ or below.

It is also preferred that the method further comprises the step of forming an interconnection having a sheet resistance, equal to or smaller than the sheet resistance of the bit line, on the capacitor.

In the method according to the above aspect of the invention, a first interconnection layer of a peripheral circuit is formed in the step (a) or (b).

Moreover, in the step of forming the storage electrode or the plate electrode of the information storage capacitor, it is preferred to form a second interconnection layer of the peripheral circuit.

Preferably, a third interconnection layer of the peripheral circuit is formed over the capacitor in the step of forming an interconnection and a Y selection line built up on the plate electrode of the information storage capacitor.

Preferably, the method of the invention should further comprise the step of simultaneously forming at least two connection holes among a first connection hole connecting the third interconnection layer and the second interconnection layer, a second connection hole connecting the third interconnection layer and the first interconnection layer, a third connection hole connecting the second interconnection layer and the first interconnection layer, and a fourth connection hole connecting the third interconnection layer, the second interconnection layer and the first interconnection layer, wherein the at least two connection holes are formed in a layer of insulating film for insulating the third interconnection layer and the second interconnection layer from each other.

It is also preferred that a dummy interconnection is formed below the first connection hole connecting the third interconnection layer and the second interconnection layer in the same step as the first interconnection layer.

Moreover, a dummy interconnection is preferably formed on the way of the second connection hole connecting the third interconnection layer and the first interconnection layer in the same step as the second interconnection layer.

Preferably, a dummy interconnection is preferably formed above the third connection hole connecting the second interconnection layer and the first interconnection layer in the same step as the third interconnection layer.

A method for manufacturing a semiconductor integrated circuit device according to a further aspect of the invention is characterized by forming a DRAM having a memory cell constituted of a MISFET for memory cell selection and an information storage capacitor formed on the MISFET, and a logic LSI on the same plane of a semiconductor substrate, wherein a sheet resistance of a gate electrode of the MISFET and a word line connected thereto, and a sheet resistance of a bit line are, respectively, 2 Ω/□ or below, and a given interconnection of the logic LSI is formed in the same step as the gate electrode of the MISFET and the word line connected thereto or the bit line.

Preferably, the above method further comprises forming, on the bit line, an information storage capacitor having a storage electrode and a plate electrode at least one of which has a sheet resistance of 2 Ω/□ or below, and forming the given interconnection of the logic LSI simultaneously at the step of forming the storage electrode or the plate electrode.

According to a further aspect of the invention, there is provided a method for manufacturing a semiconductor integrated circuit device, the method comprising the steps of:

providing a semiconductor substrate having first and second portions on the main surface thereof;

depositing a first conductor layer on the first and second portions and subjecting the first conductor layer to patterning to form a first interconnection on the first portion and a second interconnection on the second portion;

forming a first insulating film over the semiconductor substrate to cover the first and second interconnections;

depositing a second conductor layer over the first and second portions and patterning the second conductor layer to form a third interconnection as superposed on the first interconnection via the first insulating film over the first portion and a fourth interconnection as superposed on the second interconnection via the first insulating film over the second portion;

forming a second insulating film over the semiconductor substrate to cover the third and fourth interconnections therewith;

forming a first connection hole in a portion of the first portion where the first and third interconnections are superposed so that the first interconnection is exposed on the surface thereof via the second insulating film, the third interconnection and the first insulating film, and also a second connection hole in a portion of the second portion where the second and fourth interconnections are superposed so that the second interconnection is exposed on the surface thereof via the second insulating film, the fourth interconnection and the first insulating film;

filling a third conductor layer in the first and second connection holes; and depositing a fourth conductor layer over the first and second portions and patterning the fourth conductor layer to form a fifth interconnection in the first portion to cover the first connection hole and a sixth interconnection in the second portion to cover the second connection hole, wherein the third conductor layer in the first connection layer electrically connects the first, third and fifth interconnections therewith and the third conductor layer in the second connection hole electrically connects the second and fourth interconnections therewith and wherein the sixth interconnection protects the third conductor layer in the second connection hole at the time of the patterning of the fourth conductor layer.

According to a further aspect of the invention, there is provided a method for manufacturing a semiconductor integrated circuit device, the method comprising the steps of:

providing a semiconductor substrate having first and second portions on the main surface thereof;

depositing a first conductor layer on the first and second portions and subjecting the first conductor layer to patterning to form a first interconnection on the first portion and a second interconnection on the second portion;

forming a first insulating film over the semiconductor substrate to cover the first and second interconnections;

depositing a second conductor layer on the first and second portions and patterning the second semiconductor layer to form a third interconnection as superposed on the first interconnection via the first insulating film over the first portion and a fourth interconnection as superposed on the second interconnection via the first insulating film over the second portion;

forming a second insulating film over the semiconductor substrate to cover the third and fourth interconnections therewith;

forming a first connection hole in a portion of the first portion where the first and third interconnections are superposed so that the first interconnection is exposed on the surface thereof via the second insulating film, the third interconnection and the first insulating film, and also a second connection hole in a portion of the second portion where the second and fourth interconnections are superposed so that the second interconnection is exposed on the surface thereof via the second insulating film, the fourth interconnection and the first insulating film;

filling a third conductor layer in the first and second connection holes; and depositing a fourth conductor layer over the first and second portions and patterning the fourth conductor layer to form a fifth interconnection in the first portion to cover the first connection hole and also a sixth interconnection in the second portion to cover the second connection hole, wherein the third conductor layer in the first connection layer electrically connects the first, third and fifth interconnections therewith and the third conductor layer in the second connection hole electrically connects the second and fourth interconnections therewith.

According to a further aspect of the invention, there is provided a method for manufacturing a semiconductor integrated circuit device, the method comprising the steps of:

providing a semiconductor substrate having first and second portions on the main surface thereof;

depositing a first conductor layer on the first and second portions and subjecting the first conductor layer to patterning to form a first interconnection on the first portion and a second interconnection on the second portion;

forming a first insulating film over the semiconductor substrate to cover the first and second interconnections;

depositing a second conductor layer on the first and second portions and patterning the second semiconductor layer to form a third interconnection as superposed on the first interconnection over the first portion;

forming a second insulating film over the semiconductor substrate to cover the third interconnection therewith;

forming a first connection hole in the first portion so that the second interconnection is exposed on the surface thereof and also a second connection hole in the second portion so that the second interconnection is exposed on the surface thereof; and depositing a third conductor layer over the first and second portions and patterning the third conductor layer to form a fourth interconnection in the first portion to cover the first connection hole and also a fifth interconnection in the second portion to cover the second connection hole, wherein the first interconnection is superposed with the first connection hole on a plane.

According to a further aspect of the invention, there is provided a method for manufacturing a semiconductor integrated circuit device which comprises a plurality of memory cells including MISFETs for memory cell selection and information storage capacitors connected in series, a plurality of memory cell arrays having a plurality of word lines and a plurality of bit lines mutually extending in parallel to each other, and peripheral circuits located between the plural memory cell arrays, the method comprising the steps of:

providing a semiconductor substrate having a first portion wherein memory cell arrays are formed and a second portion wherein peripheral circuits are formed;

forming a first conductor layer over the semiconductor substrate and patterning the first conductor layer to form a plurality of first interconnections to form bit lines in the first portion and second and third interconnections in the second portion;

forming a first insulating film on the first, second and third interconnections;

forming a second conductor layer on the first insulating film and patterning the second conductor layer to form one of the electrodes of each information storage capacitor independently for each memory cell;

forming a third conductor layer on the one electrode of the information storage capacitor and patterning the third conductor to form the other electrode of the information storage capacitor commonly used for the plurality of memory cells in the first portion and to form a fourth interconnection on the second interconnection in the, second portion;

forming a second insulating film on the other electrode of the information storage capacitor and the fourth interconnection; and forming a first connection hole in the second portion so that the fourth interconnection is exposed on the surface thereof in the second insulating film and also a second connection hole so that the third interconnection is exposed on the surface thereof in the second insulating film, wherein the second interconnection is positioned below the first connection hole.

BRIEF DESCRIPTION OF THE DRAWINGS

FIG. 27 is a graph showing the relationship between the sheet resistance of a gate electrode (word line) of a DRAM manufactured according to the Embodiment 1 of the invention and the rise-up time of the word line;

FIGS. 34 to 38 are, respectively, a sectional view illustrating a method for manufacturing a DRAM according to Embodiment 3 of the invention;

DESCRIPTION OF THE PREFERRED EMBODIMENTS

Figure 1:
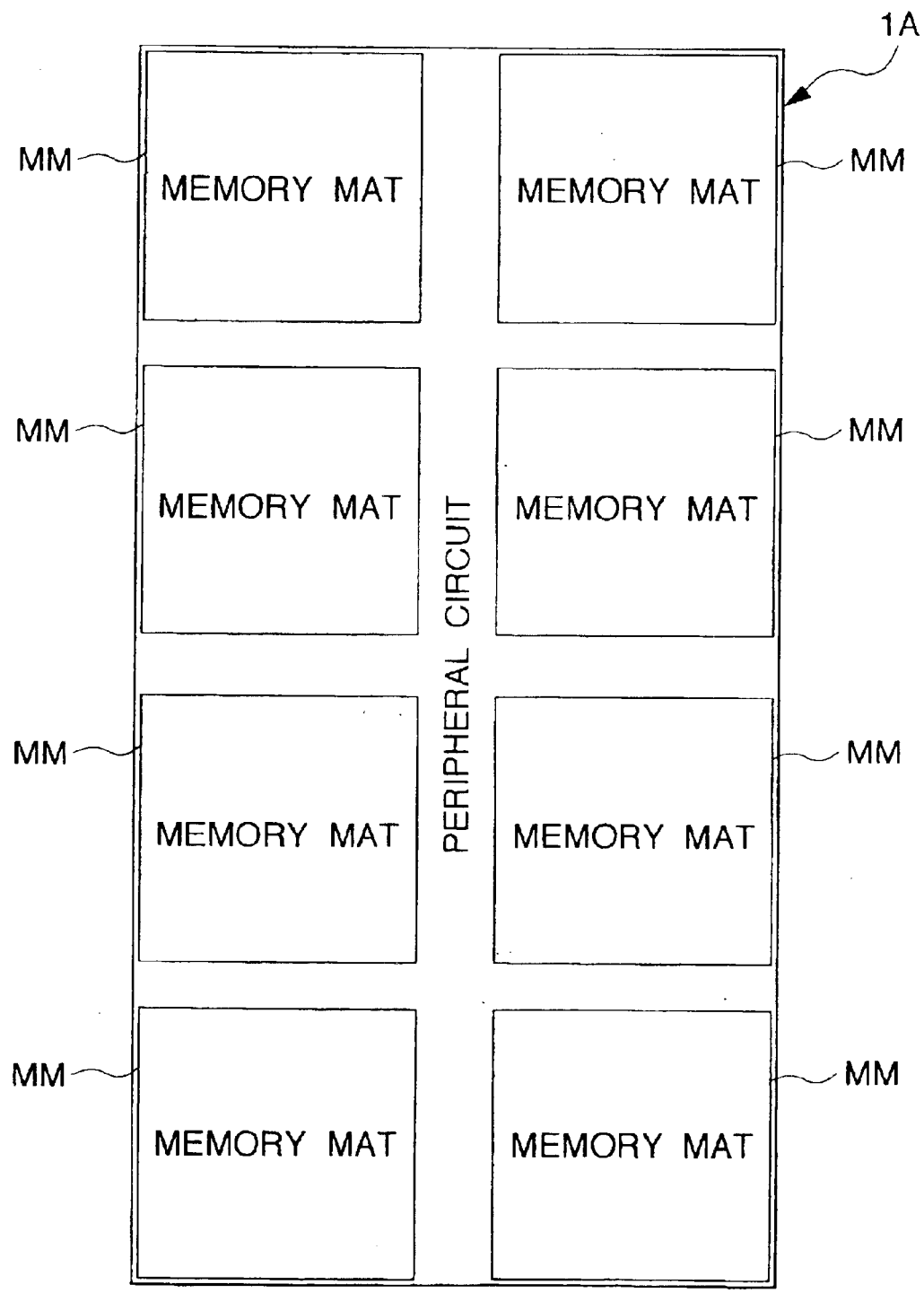
FIG. 1 is a plan view showing the entirety of a semiconductor chip forming a DRAM in accordance with Embodiment 1 of the invention.

The embodiments of the invention are described in detail with reference to the accompanying drawings, in which like reference numerals indicate like parts or members throughout the specification and when once illustrated, their illustrations may not be repeated in subsequent drawings.

(Embodiment 1)

Figure 2:
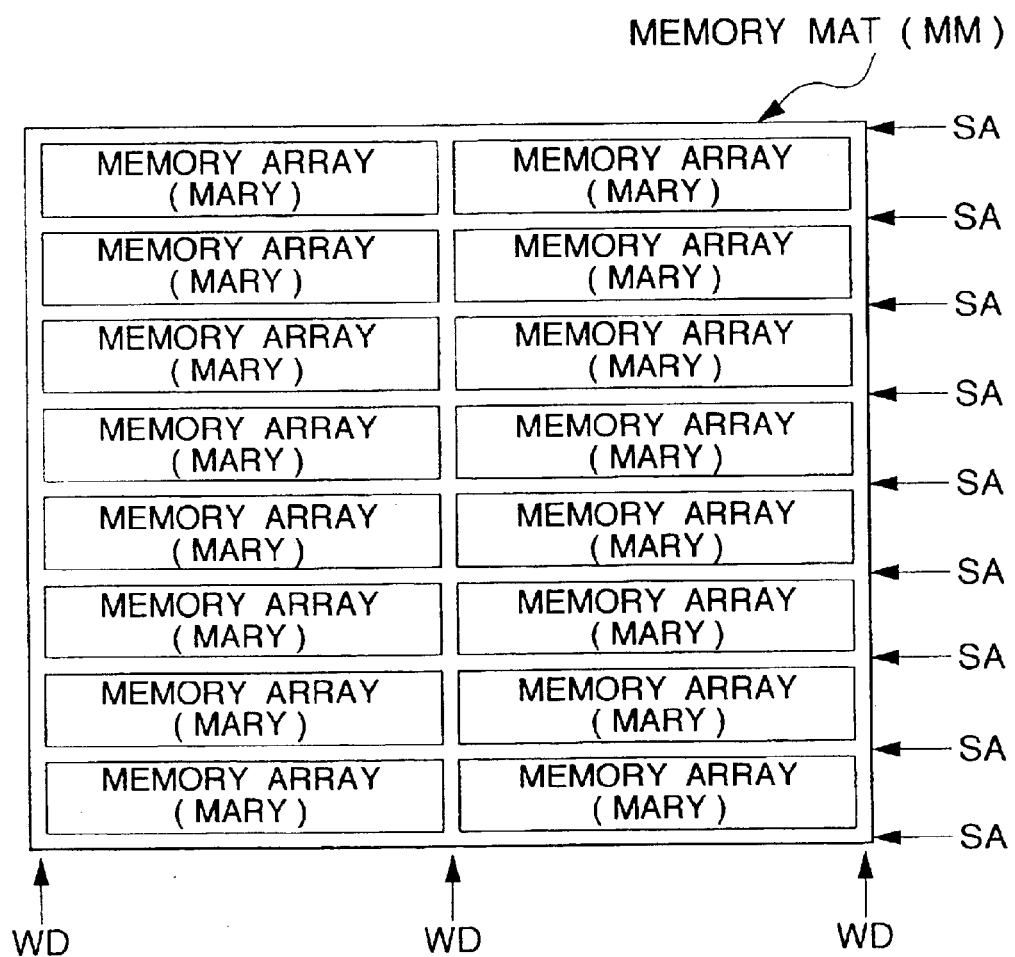
FIG. 2 is an enlarged plan view of the semiconductor chip forming a DRAM according to the Embodiment 1 of the invention.

FIG. 1 is a plan view of the entirety of a semiconductor chip having a DRAM formed according to this embodiment, and FIG. 2 is an enlarged plan view of part of the chip.

A semiconductor chip 1A comprising single crystal silicon has a main surface on which there is a DRAM having a capacity, for example, of 64 Mbits (megabits). As shown in FIG. 1, the DRAM is constituted of eight split memory mats MM and peripheral circuits disposed therearound. Each memory mat MM having a capacity of 8 M bits (megabits) is further divided into 16 memory arrays MARY as is particularly shown in FIG. 2. The memory arrays MARY are, respectively, constituted of memory cells disposed in a matrix and each having a capacity of 2 Kbits (kilobits)×256 bits=512 Kbits and are provided therearound with peripheral circuits, such as sense amplifiers SA and word drivers WD.

Figure 3:
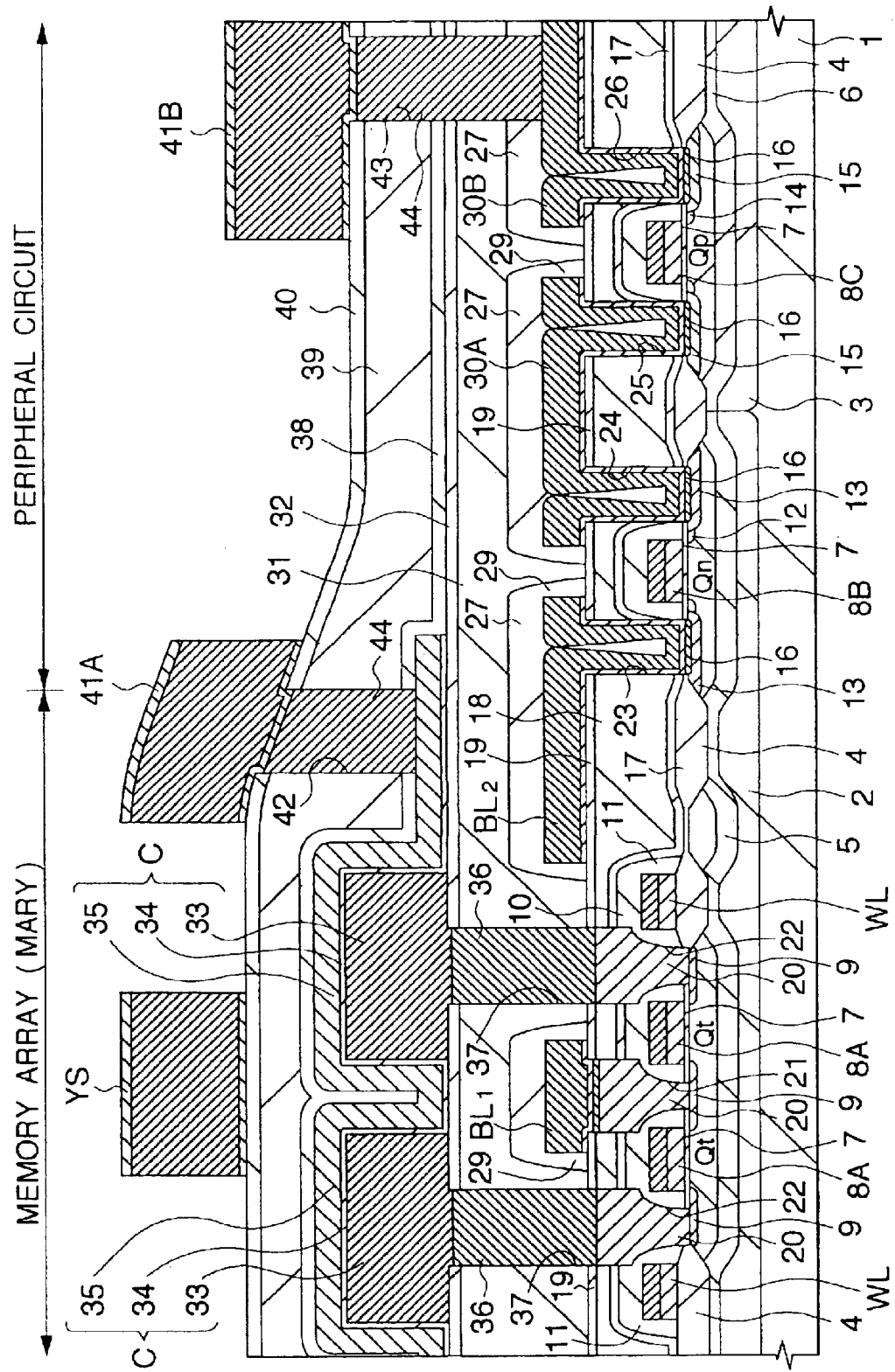
FIG. 3 is a sectional view of an essential part of a semiconductor substrate showing a method for manufacturing a DRAM according to the Embodiment 1 of the invention.
Figure 4:
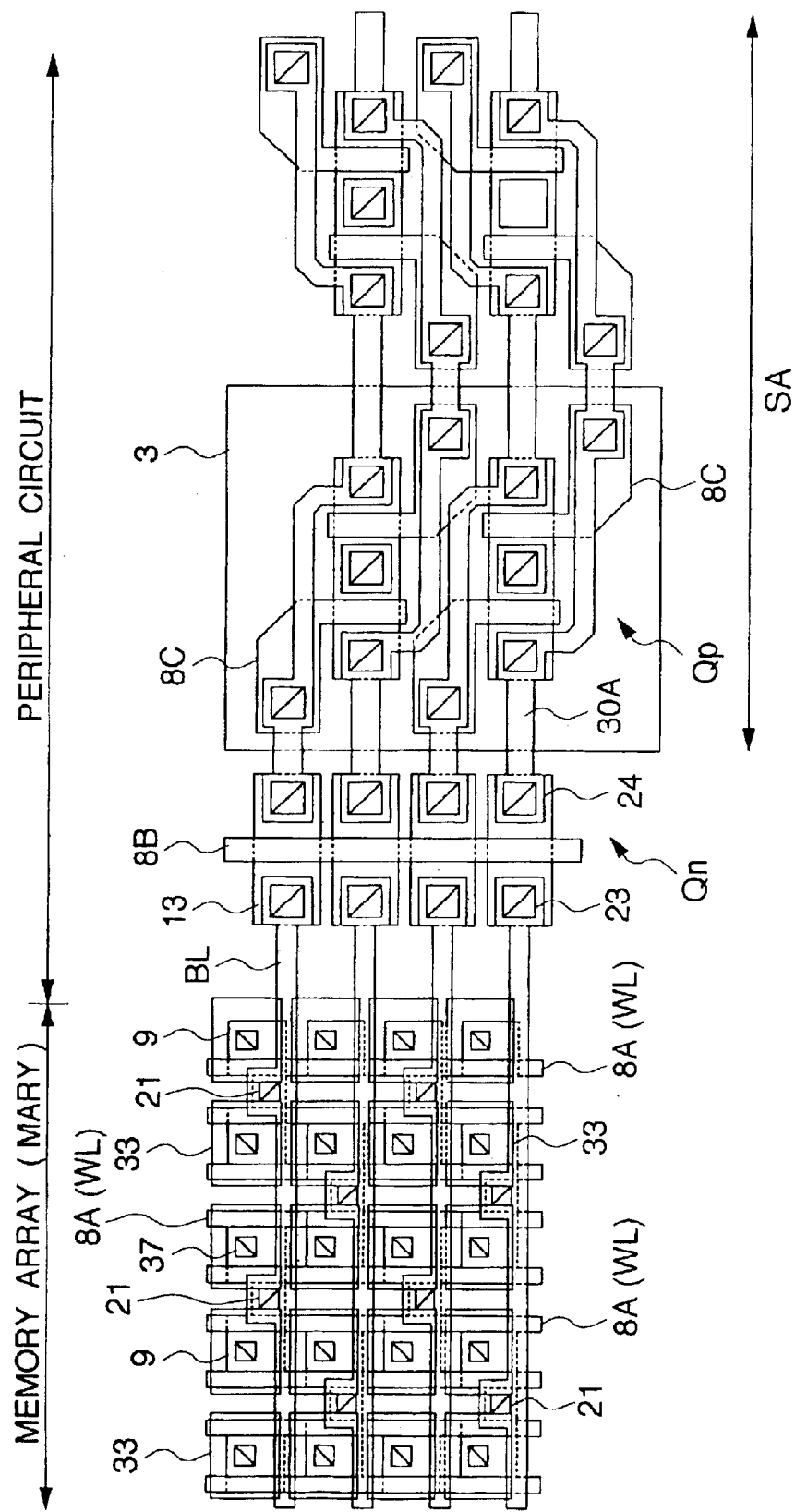
FIG. 4 is a plan view showing the respective patterns of conductor layers constituting a memory cell and of a MISFET of a peripheral circuit of a DRAM.
Figure 5:
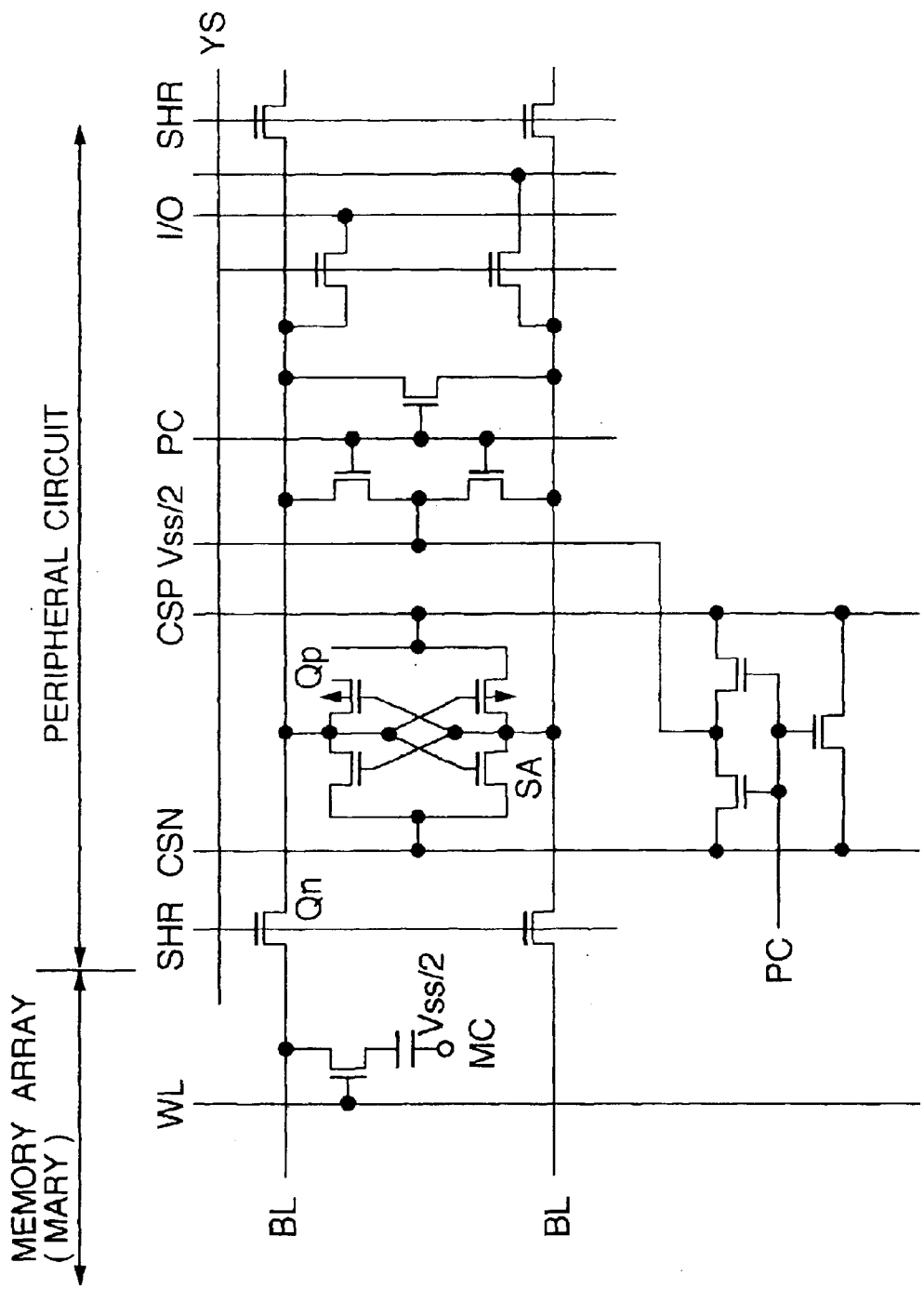
FIG. 5 is a schematic circuit diagram showing part of each of a memory array and an adjacent peripheral circuit of a DRAM according to the Embodiment 1 of the invention.

FIG. 3 is a sectional view of an essential part of a semiconductor substrate showing parts of a memory array of the DRAM and the adjacent peripheral circuit. FIG. 4 is a plan view showing the patterns of conductor layers constituting a memory cell of the DRAM and also of conductor layers constituting MISFETs of the peripheral circuit, and FIG. 5 is a circuit diagram showing part of a memory array of the DRAM and part of an adjacent peripheral circuit. In FIG. 3, the sectional structure of a pair of memory cells is shown. The sectional structures of MISFETs indicated by Qn and Qp in FIGS. 4 and 5 are shown in FIG. 3.

The semiconductor substrate 1 comprising a p-type single crystal silicon has a p-type well 2 commonly provided for the memory array MARY and a peripheral circuit, and an n-type well 3 for the peripheral circuit. In this connection, however, it may be possible to separately provide p-type wells 2 for the memory array MARAY and the peripheral circuit, respectively, without use of any common p-type well. The p-type well 2 and the n-type well 3, respectively, have a field oxide film 4 for element isolation on the surfaces thereof. The p-type well 2 has a p-type channel stopper layer 5 in the inside thereof including the lower portion of the field oxide film 4. The n-type well 3 also has an n-type channel stopper layer 6 in the inside thereof.

In an active region of the p-type well 2 of the memory array MARY, memory cells are arranged in a matrix form. Each memory cell is constituted of one memory cell section MISFET Qt and one information storage capacitor C formed above the MISFET Qt. More particularly, the memory cell has a stacked capacitor structure wherein the information storage capacitor C is provided over the memory cell selection MISFET Qt. The memory cell selection MISFET Qt and the information storage capacitor C are connected in series to form a memory cell.

The memory cell selection MISFET Qt is composed of a gate oxide film 7, a gate electrode 8A integrally formed with a word line WL, and a source region and a drain region (i.e. n-type semiconductor regions 9, 9). The gate electrode 8A (word line WL) is constituted of a two-layer conductor film comprising a low resistance polysilicon film doped with an n-type impurity (e.g. P (phosphorus)) and a W silicide ($WSi_2$) film, or a three-layer conductor film wherein a low resistance polysilicon film, a TiN (titanium nitride) film and a W film are built up in this order. The gate electrode 8A has a sheet resistance of 2 Ω/□ or below. A silicon nitride film 10 is formed over the gate electrode 8A, and a side wall spacer film 10 made of silicon nitride is formed at side walls of the gate electrode 8A. These insulating films (i.e. the silicon nitride film 10 and the side wall spacers 11) may be constituted of a silicon oxide film in place of the silicon nitride film.

In the active region of the p-type well of the peripheral circuit, an n channel-type MISFET Qn is formed. A p channel-type MISFET Qp is formed in the active region of the n-type well 3. More particularly, the peripheral circuit is constituted of a CMOS (complementary metal oxide semiconductor) obtained by combination of the n channel-type MISFET Qn and the p channel-type MISFET Qp.

The n channel-type MISFET Qn is composed of a gate oxide film 7, a gate electrode 8B, and a source region and a drain region. The gate electrode 8B is constituted of a conductor film similar to that of the gate electrode 8A (word line WL) of the memory cell selection MISFET Qt, with its sheet resistance being 2 Ω/□ or below. A silicon nitride film 10 is formed over the gate electrode 8B, and side wall spacers 11 made of silicon nitride are formed at side walls of the gate electrode 8B as shown in FIG. 3. The source and drain regions of the n channel-type MISFET Qn, respectively, have an LDD (lightly doped drain) structure which consists of an $n^-$-type semiconductor region 12 with a low impurity concentration and an $n^+$-type semiconductor region 13 with a high impurity concentration. The $n^+$-type semiconductor region 13 has a Ti silicide ($TiSi_2$) layer 16 on the surface thereof.

The p channel-type MISFET Qp is constituted of a gate oxide film 7, a gate electrode 8C, and a source region and a drain region. The gate electrode 8C is constituted of a conductor film similar to that of the gate electrode 8A (word line WL) of the memory cell selection MISFET Qt, with its sheet resistance being 2 Ω/□ or below. A silicon nitride film 10 is formed over the gate electrode 8C, and sidewall spacers 11 composed of silicon nitride are formed at side walls of the gate electrode 8C. The source and drain regions of the p channel-type MISFET Qp, respectively, have an LDD structure which consists of a $p^-$-type semiconductor region 14 with a low impurity concentration and a $p^+$-type semiconductor region 15 with a high impurity concentration. The $p^+$-type semiconductor region 15 has a Ti silicide ($TiSi_2$) layer 16 on the surface thereof.

A silicon oxide film 17, a BPSG (boron-doped phosphosilicate glass) film 18 and a silicon oxide film 19 are formed over the memory cell selection MISFET Qt, the n channel-type MISFET Qn and the p channel-type MISFET Qp in this order.

Bit lines BL ($BL_1$, $BL_2$) are formed on the silicon oxide film 19 of the memory array MARY. The bit lines $BL_1$, $BL_2$ are, respectively, constituted of a two-layer conductor film wherein a TiN film and a W film are built up, with their sheet resistance being 2 Ω/□ or below. The bit line $BL_1$ is electrically connected to one of the source region and the drain region (n-type semiconductor region 9) of the memory cell selection MISFET Qt via a connection hole 21 in which a P or As-doped polysilicon plug 20 is placed or embedded. The bit line $BL_2$ is electrically connected to one of the source region and the drain region ($n^+$-type semiconductor region 13) of the n channel-type MISFET Qn of the peripheral circuit through a connection hole 23 but without use of any polysilicon plug. The $n^+$-type semiconductor region 13 of the n channel-type MISFET Qn has a Ti silicide layer 16 of low resistance on the surface thereof, so that the contact resistance with the bit line $BL_2$ is reduced.

First interconnection layers 30A, 30B are formed over the silicon oxide film 19 of the peripheral circuit. The interconnections 30A, 30B are, respectively, composed of a two-layer conductor film, like the bit lines $BL_1$, $BL_2$, wherein a TiN film and a W film are built up. The sheet resistance of the interconnections is 2 Ω/□ or below. The interconnection 30A is electrically connected at one end thereof to the other of the source region and the drain region ($n^+$-type semiconductor region 13) of the n channel-type MISFET Qn through a connection hole 24. The other end of the interconnection 30A is electrically connected to one of the source region and the drain region ($p^+$-type semiconductor region 15) of the p channel-type MISFET Qp via a connection hole 25. The interconnection 30B is electrically connected at one end thereof to the other of the source region and the drain region ($p^+$-type semiconductor region 15) of the p channel-type MISFET Qp via a connection hole 26. A low resistance Ti silicide layer 16 is formed on the surface of the $n^+$-type semiconductor region 13 of the n channel-type MISFET Q and the surface of the $p^+$-type semiconductor region of the p channel-type MISFET Qp. By this, the contact resistances of the interconnections 30A, 30B are reduced.

A silicon nitride film 27 is formed on the bit lines $BL_1$, $BL_2$ and the interconnections 30A, 30B, and side wall spacers 29 consisting of silicon nitride are formed at side walls of the bit lines $BL_1$, $BL_2$ and the interconnections 30A, 30B. An SOG (spin on glass) film (insulating film) 31 and a silicon oxide (insulating film) 32 are further formed over the bit lines $BL_1$, $BL_2$ and the interconnections 30A, 30B, respectively. Information storage capacitors C each including a storage electrode (lower electrode) 33, a capacitance insulating film 24 and a plate electrode (upper electrode) 35 are formed on the oxide silicon film 32 of the memory array MARY.

The storage electrode 33 of the information storage capacitor C is formed of a W film and is electrically connected to the other of the source region and the drain region (n-type semiconductor region 9) of the memory cell selection MISFET Qt via a connection hole 37 embedding a polysilicon plug 36 therein and a connection hole 22 embedding a polysilicon plug 20 therein. The capacitance insulating film 34 is made of a $Ta_2O_5$ (tantalum oxide) film, and the plate electrode is made of a TiN film.

A silicon oxide (insulating film) 38, a SOG film (insulating film) 39 and a silicon oxide film (insulating film) 40 are formed on the information storage capacitors C in this order. A Y select line YS and second interconnection layers 41A, 41B of the peripheral circuit are, respectively, formed on the silicon oxide film 40 as shown. The interconnection 41A is electrically connected to the plate electrode 35 via a connection hole 42 made at the insulating films (i.e. the silicon oxide film 40, the SOG film 39 and the silicon oxide film 28) which have been formed on the plate electrode 35 of the capacitor C, by which a plate potential ($Vdd/^2$: a potential corresponding to a half of an applied voltage Vdd from outside of the semiconductor chip) is supplied to the plate electrode 35. The interconnection 41B is electrically connected to the interconnection 30B via a connection hole 43 made at the insulating films (i.e. the silicon oxide film 40, the SOG film 39, the silicon oxide film 38, the silicon oxide film 32, the SOG film 31 and the silicon nitride film 27) which have been formed over the first interconnection layer 30B of the peripheral circuit. A tungsten (W) plug 44 is embedded in the inside of the connection hole 42 for connection between the interconnection 41A and the plate electrode 35 and also in the connection hole 43 for connection between the interconnection 41B and the interconnection 30B, respectively. The Y select line YS and the interconnections 41A, 41B are each made of a conductor film whose sheet resistance is smaller than those conductor films for the gate electrode 8A (word line WL) and the gate electrodes 8B, 8C and also for the bit lines $BL_1$, $BL_2$ and the interconnections 30A, 30B. For instance, such a conductor film is constituted of a three-layer conductor film wherein a TiN film an Al (aluminum) alloy film containing Si (silicon) and Cu (copper), and a TiN film are built up in this order.

The Y select line YS and the interconnections 41A, 41B are formed thereon, for example, with a third interconnection layer of the peripheral circuit through a layer insulating film composed of a three-layer insulating film wherein a silicon oxide film, an SOG film and a silicon oxide film are built up. A passivation film composed of a two-layer insulating film wherein a silicon oxide film and a silicon nitride film are built up is further formed on the third interconnection layer although the third interconnection layer and the passivation film are not particularly shown in the figures.

The method for manufacturing a DRAM according to this embodiment of the invention will be described in detail with reference to FIGS. 6 to 24.

Figure 6:
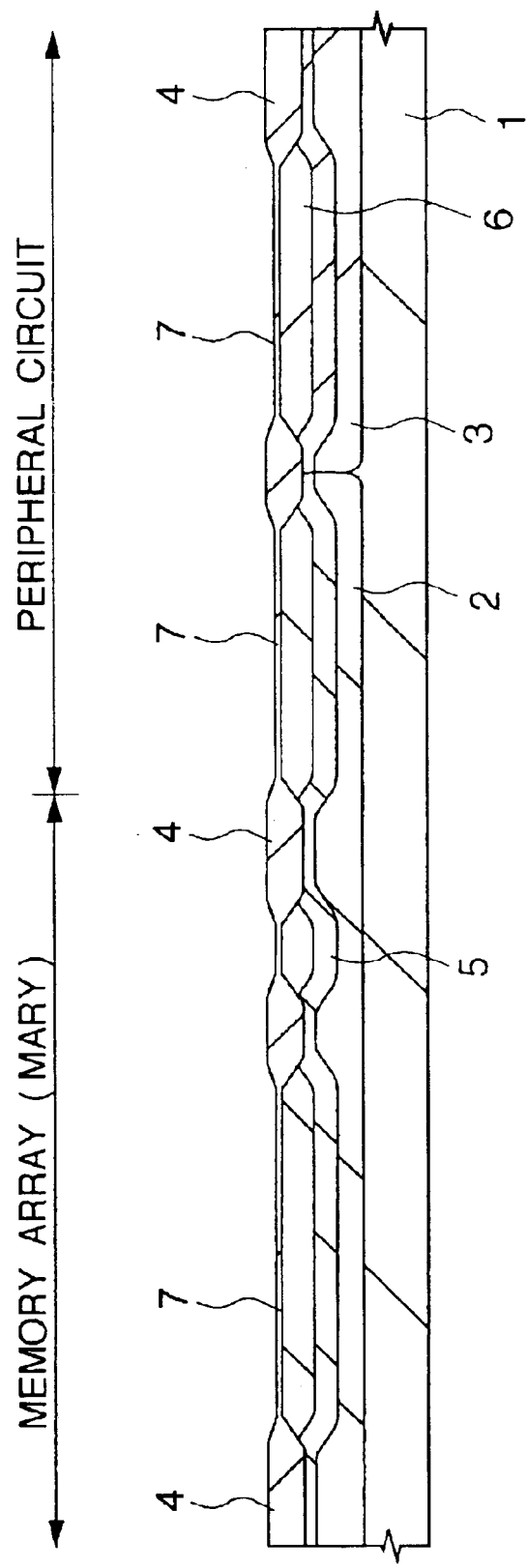
FIGS. 6 to 27 are, respectively, a sectional view of an essential part of a semiconductor substrate illustrating, step by step, a method for manufacturing a DRAM according to the Embodiment 1 of the invention.

As shown in FIG. 6, a field oxide film 4 is initially formed on the surface of a $p^-$-type semiconductor substrate 1 according to a LOCOS method. A p-type impurity (boron (B)) is subjected to ion implantation into the semiconductor substrate 1 at a region in which a memory cell is to be formed (memory array MARY) and also at a region wherein an n channel-type MISFET of a peripheral circuit thereby forming a p-type well 2. Then, an n-type impurity (phosphorus (P)) is ion implanted into the semiconductor substrate 1 at a region where a p channel-type MISFET of the peripheral circuit is to be formed thereby forming an n-type well 3. A p-type impurity (B) is ion implanted into the p-type well 2 to form a p-type channel stopper layer 5. Likewise, an n-type impurity (P) is ion implanted into the n-type well 3 to form an n-type channel stopper layer 6.

The p-type well 2 and the n-type well 3 surrounded by the field oxide film 4 are formed with a gate oxide film 7 on the surfaces of the respective active regions according to a thermal oxidation method. An impurity for controlling a threshold voltage (Vth) of the MISFET is ion implanted into the p-type well 2 and the n-type well 3 through the gate oxide film 7. Among the ion implantation for forming the wells (i.e. the p-type well 2 and the n-type well 3), the ion implantation for forming the channel stopper layers (i.e. the p-type channel stopper layer 5 and the n-type channel stopper layer 6) and the ion implantation for the control of the threshold voltage (Vth) of the MISFET, the ion implantations using the same conduction type of impurity may be effected by one step with use of the same photoresist mask. The ion implantation for the control of the threshold voltage (Vth) of the memory cell selection MISFET Qt and the ion implantation for controlling the threshold voltage (Vth) of the MISFET s (i.e. then channel-type MISFET Qn and the p channel-type MISFET Qp) of the peripheral circuit may be separately performed to independently control the values of the threshold voltages (Vth) for individual MISFETs.

Figure 7:
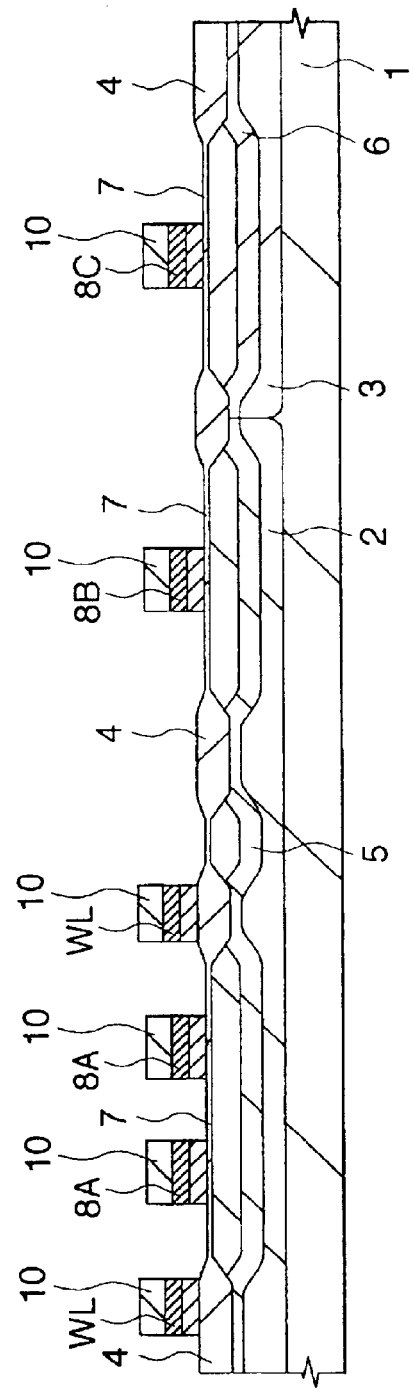

As shown in FIG. 7, gate electrodes 8A (word lines WL) of the memory cell selection MISFET Qt, a gate electrode 8B of an n channel-type MISFET Qn and a gate electrode 8C of a p channel-type MISFET Qp are formed, respectively. For example, the gate electrodes 8A (word lines WL) and the gate electrodes 8B, 8C are, respectively, formed in the following manner. An n-type polysilicon film, a $WSi_2$ film and a silicon nitride film 10 are successively deposited on the semiconductor substrate 1 according to a CVD technique, followed by etching through a photoresist mask to make a desired pattern of these films thereby forming them at the same time. Alternatively, an n-type polysilicon film may be first deposited according to a CVD technique, followed by further deposition of a TiN film and a W film by sputtering and then of a silicon nitride film 10 according to a CVD technique. These films are patterned as desired through a photoresist mask to form the electrodes simultaneously. It should be noted that the TiN film is formed in order to prevent a reaction between the polysilicon film and the W film. When the gate electrode 8A (the word line WL), and the gate electrodes 8B, 8C are, respectively, constituted of a low resistance material, e.g. when they are made of a three-layer conductor film wherein a TiN film (or a WN (tungsten nitride) film) and a Ti silicide film are superposed on an n-type polysilicon film, the sheet resistance can be reduced to 2 Ω/□ or below, preferably 1 Ω/□ or below.

Figure 8:
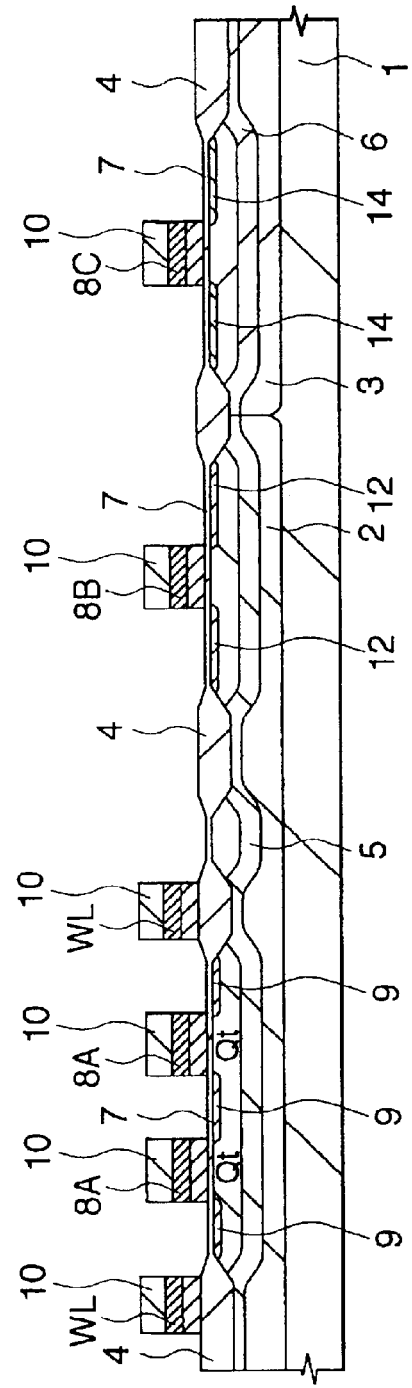

As shown in FIG. 8, an n-type impurity (P) is ion implanted into the p-type well 2 to form an n-type semiconductor region 9 of the memory cell selection MISFET Qt and $n^-$-type semiconductor regions 12 of the n channel-type MISFET Qn as self-aligned relative to the gate electrodes 8A, 8B. A p-type impurity (B) is ion implanted into the n-type well to form p-type semiconductor regions 14 of the p channel-type MISFET Qp as self-aligned relative to the gate electrode 8C. It should be noted that the ion implantation for forming the n-type semiconductor regions 9, 9 of the memory cell MISFETs Qt and the ion implantation for forming the n⁻ semiconductor regions 12 of the n channel-type MISFET Qn may be separately carried out so that the source region and the drain region have different impurity concentrations for the respective MISFETs.

Figure 9:
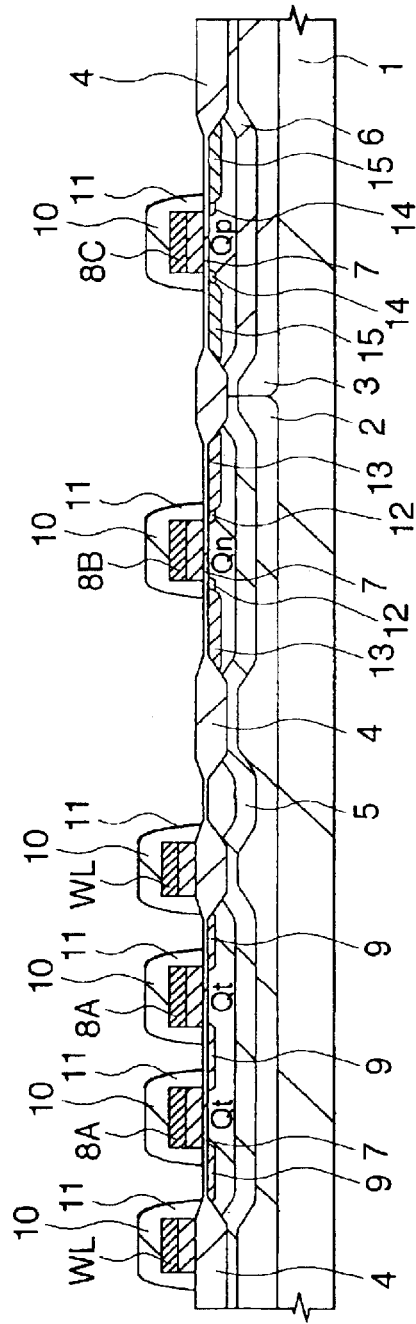

As shown in FIG. 9, a side wall spacer 11 is formed on the respective side walls of the gate electrodes 8A (the word lines WL) of the memory cell selection MISFETs Qt, the gate electrode 8B of the n channel-type MISFET and the gate electrode 8C of the p channel-type MISFET. The side wall spacer 11 is formed through anisotropic etching of a silicon nitride film deposited by a CVD technique. Thereafter, an n-type impurity (P) is ion implanted into the p-type well 2 of the peripheral circuit to form n+-type semiconductor regions of the n channel-type MISFET Qn in self-aligned with the side wall spacer 11. Likewise, a p-type impurity (B) is ion implanted into the n-type well 3 to form p⁺-type semiconductor regions 15 of the p channel-type MISFET Qn in self-aligned with the side wall spacer 11. Both or either of the source region and the drain region of the n channel-type MISFET Qn and the source region and the drain region of the p channel-type MISFET Qp which constitute the peripheral circuit may be constituted, if necessary, of a single drain structure or a double diffused drain structure.

Figure 10:
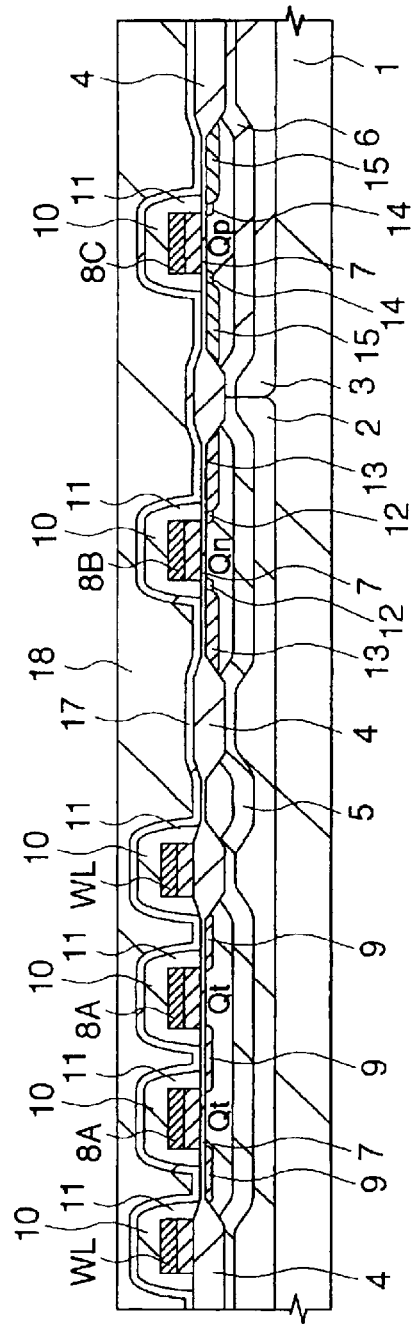

As shown in FIG. 10, a silicon oxide film 17 and a BPSG film 18 are, respectively, deposited over the gate electrodes 8A (the word lines WL) of the memory cell selection MISFETs Qt, the gate electrode 8B of the n channel-type MISFET Qn and the gate electrode 8C of the p channel-type MISFET Qp according to a CVD method, followed by polishing the BPSG film by a chemical mechanical polishing (CMP) method to flatten the surface thereof.

Figure 11:
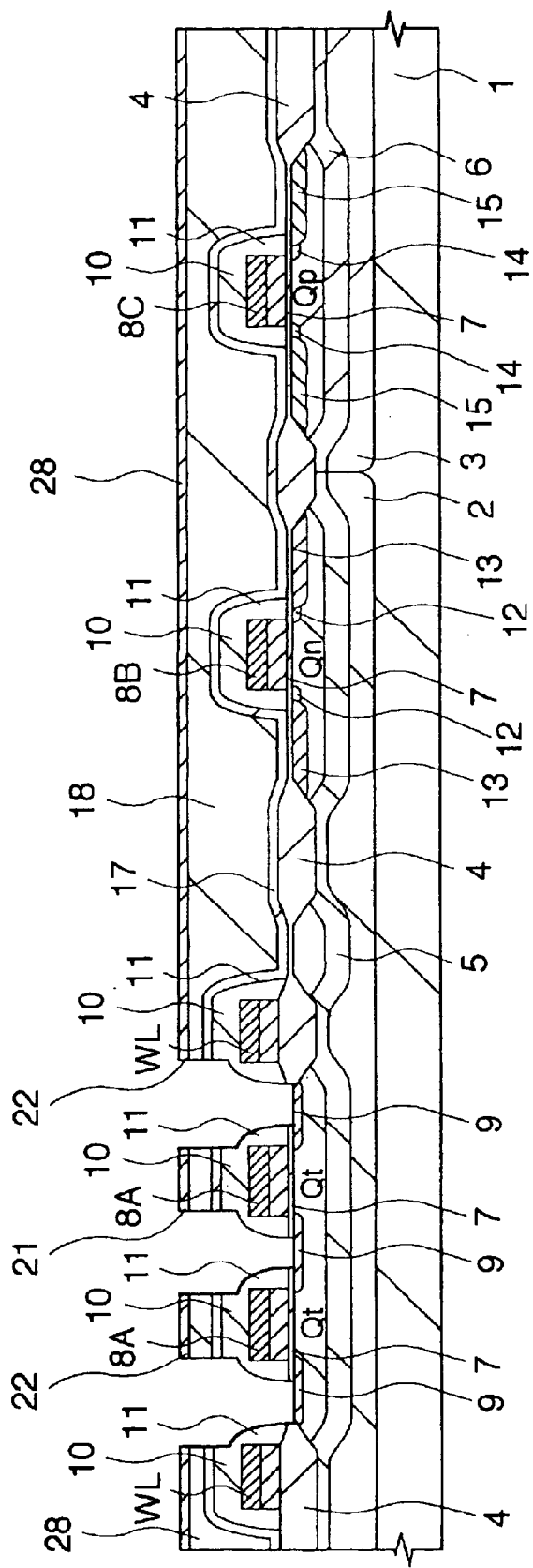

As shown in FIG. 11, a polysilicon film 28 is deposited on the BPSG film 18 according to a CVD method, and the polysilicon film 28 is etched through a photoresist mask, followed by further etching of the BPSG film 18, the silicon oxide film 17 and the gate oxide film 7 using the polysilicon film 28 as a mask. Consequently, a connection hole 21 is formed above one of the source region, and the drain region (the n-type semiconductor region 9), and a connection hole 22 is formed above the other region (n-type semiconductor region 9).

Because the etching rates of the silicon nitride film 10 formed on the gate electrodes 8A (the word lines WL) of the memory cell selection MISFET Qt and the silicon nitride side wall spacers 11 formed on the side walls differ from that of the silicon oxide-based insulating films (i.e. the BPSG film 18, the silicon oxide film 17 and the gate oxide film 7), they are left as being not etched. More particularly, a gas used for the dry etching in order to form the connection holes 21, 22 permits the silicon oxide to be etched at a greater rate and the silicon nitride film to be etched at a smaller rate. By this means, fine connection holes 21, 22 (i.e. regions contacting with the n-type semiconductor region 9) which have a diameter smaller than a resolution of exposing light used for making a photoresist mask can be formed self-alignedly to the sidewall spacers 11, enabling one to reduce the size of the memory cell.

Figure 12:
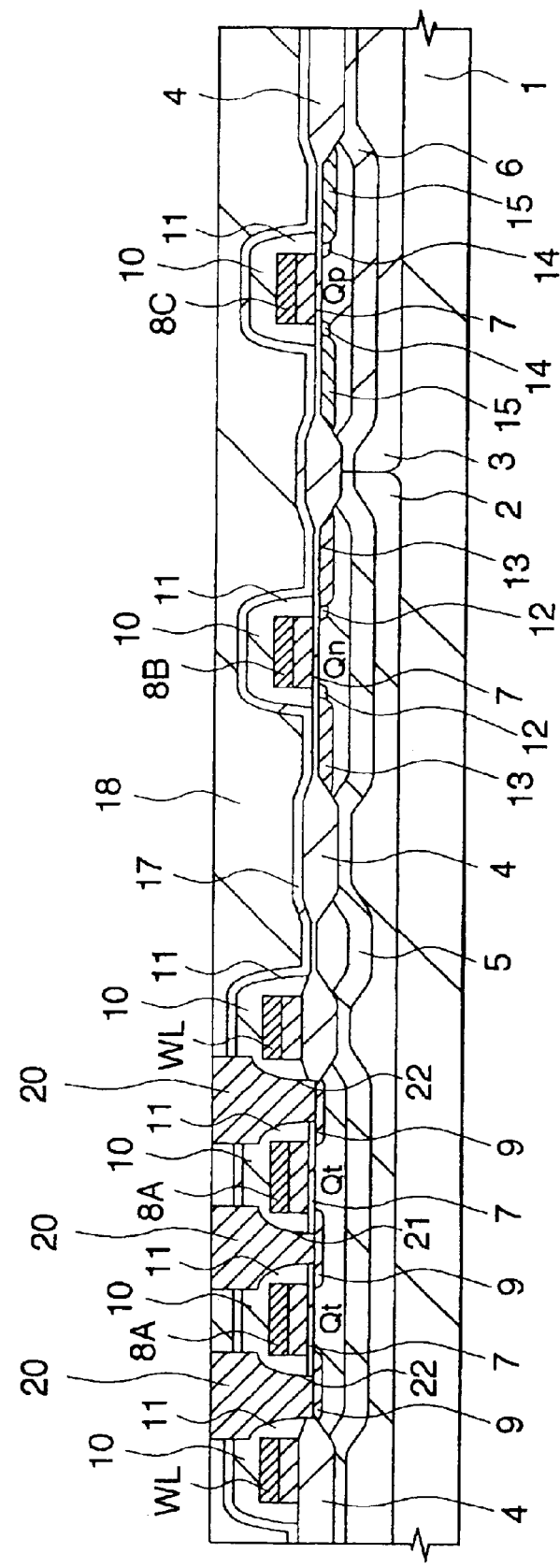

As shown in FIG. 12, a polysilicon plug 20 is placed in the inside of each of the connection holes 21, 22. The plug 20 is formed by depositing a polysilicon film on the polysilicon film 28 according to a CVD method, followed by etching back the thus deposited polysilicon film formed above the BPSG film 18. At the same time, the polysilicon film 28 used as an etching mask is simultaneously removed. The polysilicon film used as the plug 20 is doped with an n-type impurity (P). This impurity is diffused into the n-type semiconductor regions 9, 9 (i.e. the source region and the drain region) of the memory cell selection MISFET Qt through the connection holes 21, 22, thereby forming semiconductor regions having an impurity concentration higher than the n-type semiconductor regions 9, 9 although not shown in the figure.

Figure 13:
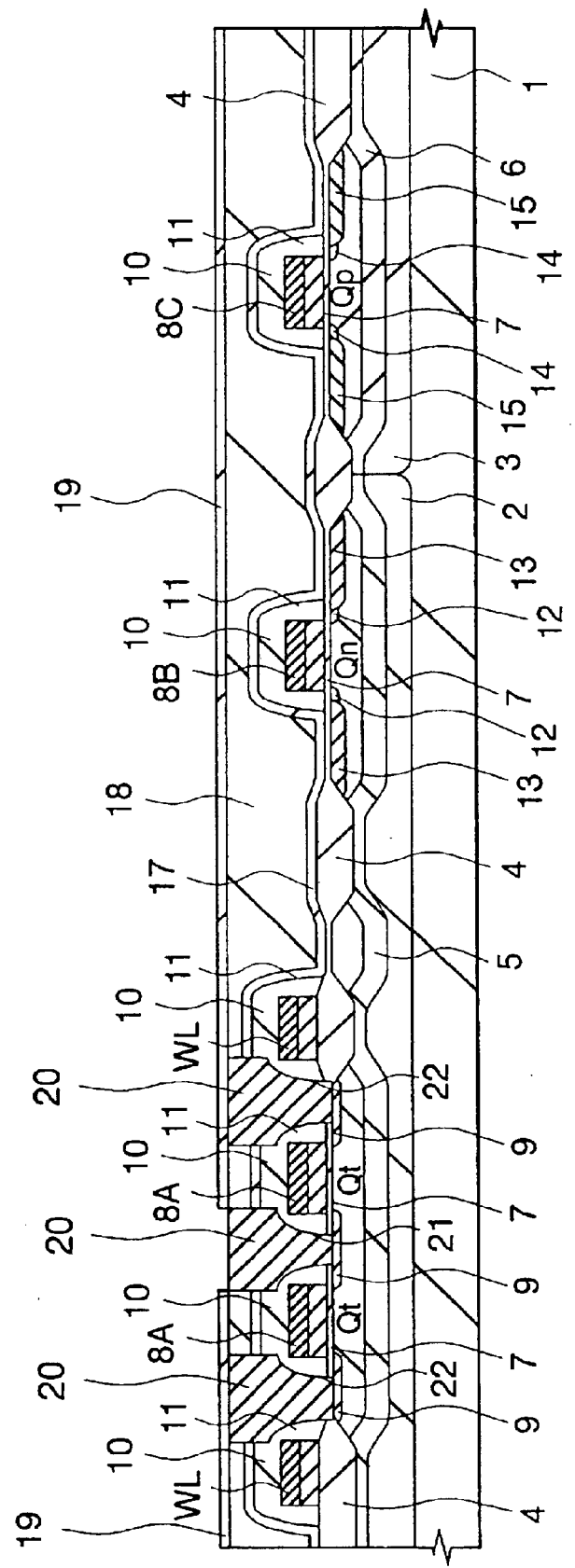
Figure 14:
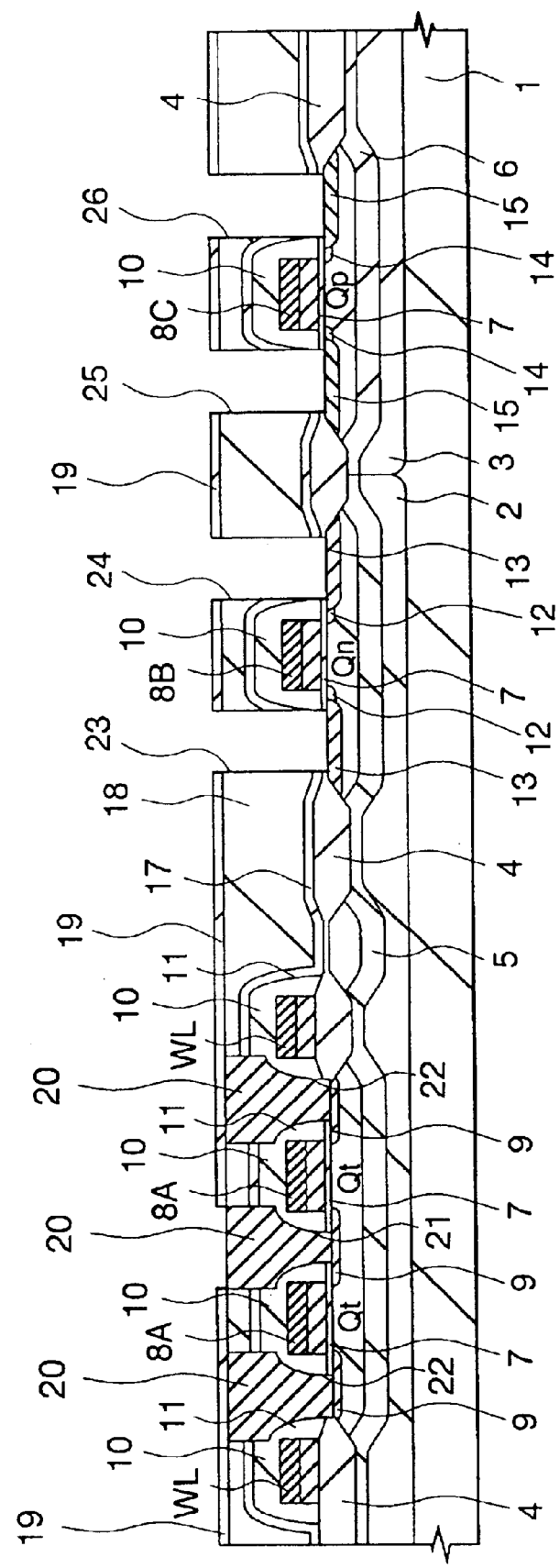

As shown in FIG. 13, a silicon oxide film 19 is deposited over the BPSG film 18 according to a CVD method. A photoresist which covers the region of the peripheral circuit and has a through-hole at a connection portion of a bit line $BL_1$ is formed as a mask, followed by etching to remove the silicon oxide 19 from above the connection hole 21, thereby exposing a portion of the plug 20 where the bit line $BL_1$ is to be formed. As shown in FIG. 14, a photoresist which covers a memory cell-forming region and through-holes in the peripheral circuit region is formed as a mask, followed by etching the silicon oxide film 19, the BPSG film 18, the silicon oxide 17 and the gate oxide film 7 of the peripheral circuit. In this manner, a connection hole 23 is formed until one of the source region and the drain region (i.e. the n⁺-type semiconductor region 13) of the n channel-type MISFET Qn is exposed, and a connection hole 24 is formed so that the other region (i.e. the n⁺-type semiconductor region 13) is exposed. At the same time, a connection hole 25 is formed so that one of the source region and the drain region (i.e. the p⁺-type region 15) of the p channel-type MISFET Qp is exposed, and a connection hole 26 is formed above the other region (i.e. the p⁺-type semiconductor region 15).

Figure 15:
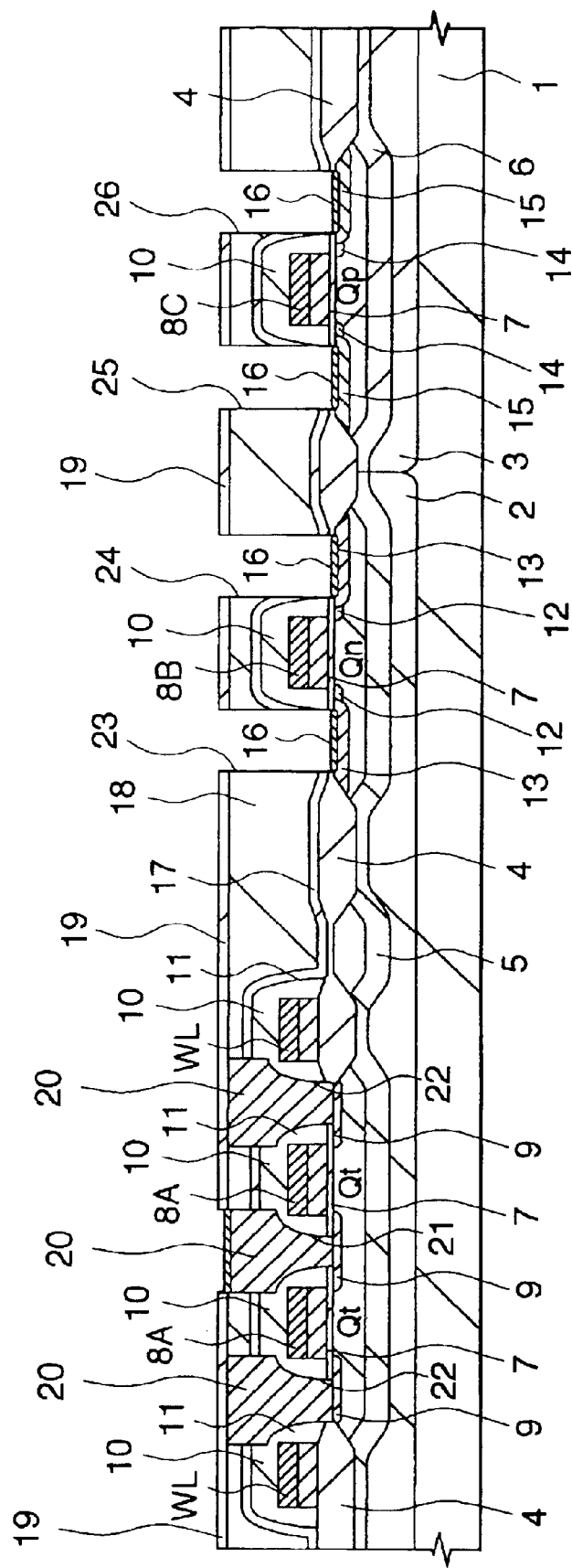

As shown in FIG. 15, a titanium silicide layer 16 is formed on the surfaces of the n⁺-type semiconductor regions 13, 13 of the n channel-type MISFET Qn exposed at the bottoms of the connection holes 23, 24, on the surfaces of the p⁺-type semiconductor regions 15, 15 of the p channel-type MISFET Qp exposed at the bottom of the connection holes 25, 26, and also on the surface of the plug 20 to which the bit line $BL_1$ is connected. The titanium silicide layer 16 is formed by depositing a Ti film by sputtering and annealing the Ti film, followed by reaction with the Si substrate (i.e. the n⁺-type semiconductor region 13 and the p⁺-type semiconductor region 15) and the polysilicon and removal of an unreacted Ti film (i.e. a Ti film on the silicon oxide film 19) by wet etching. The formation of the titanium silicide layer 16 results in a reduction of the contact resistance of the n⁺-type semiconductor regions 13, 13 of the n channel-type MISFET Qn, the p⁺-type semiconductor regions 15, 15 of the p channel-type MISFET Qp, and the plug 20 with interconnections in contact therewith.

Figure 16:
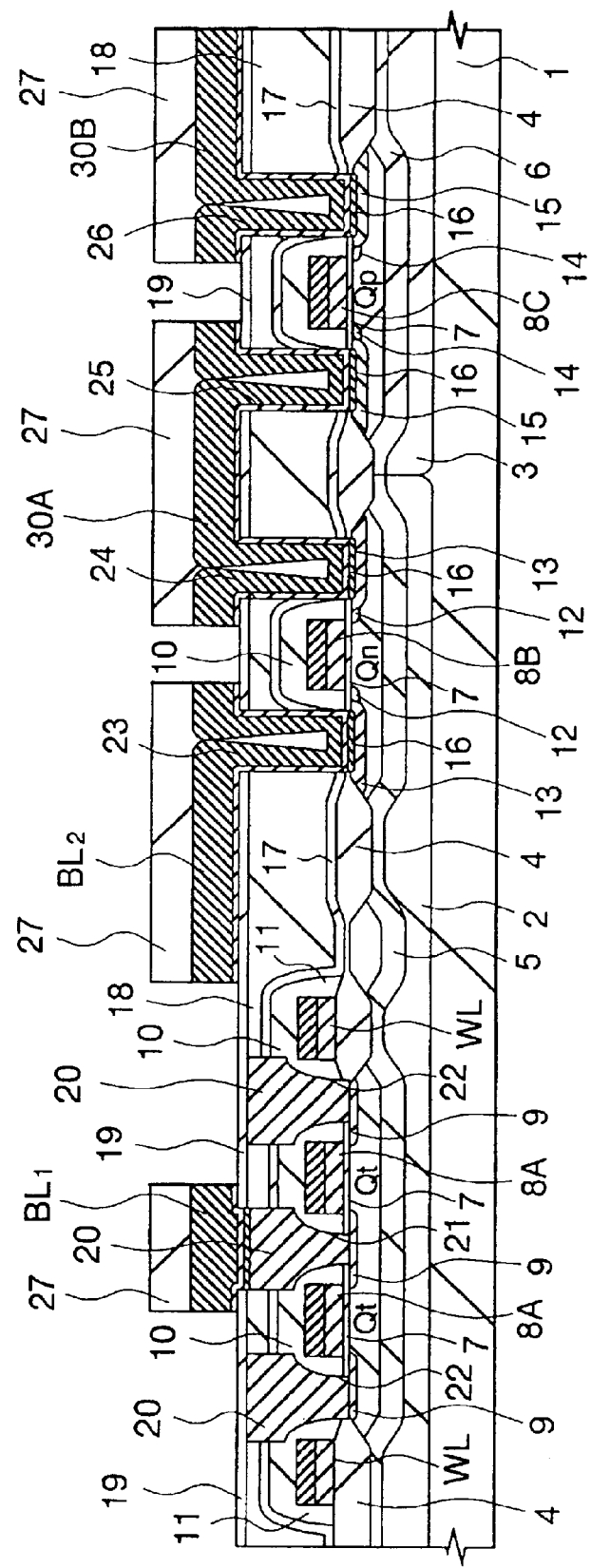

As shown in FIG. 16, bit lines $BL_1$, $BL_2$ are formed on the silicon oxide film 19 of the memory array MARY, and first layer interconnections 30A, 30B are formed on the silicon oxide film 19 of the peripheral circuit. The bit lines $BL_1$, $BL_2$ and the interconnections 30A, 30B are simultaneously formed by depositing a TiN film and a W film on the silicon oxide film 19 by sputtering, further depositing a silicon nitride film 27 by a CVD method, and etching these films by use of a photoresist mask to make a desired pattern of these films. The bit lines $BL_1$, $BL_2$ and the interconnections 30A, 30B are, respectively, formed of a low resistance material such as a two-layer conductor film wherein a TiN film (or a WN film) and a titanium silicide film are, for example, built up. By this, the sheet resistance can be reduced to a level of 2 Ω/□ or below, preferably 1 Ω/□ or below.

Figure 17:
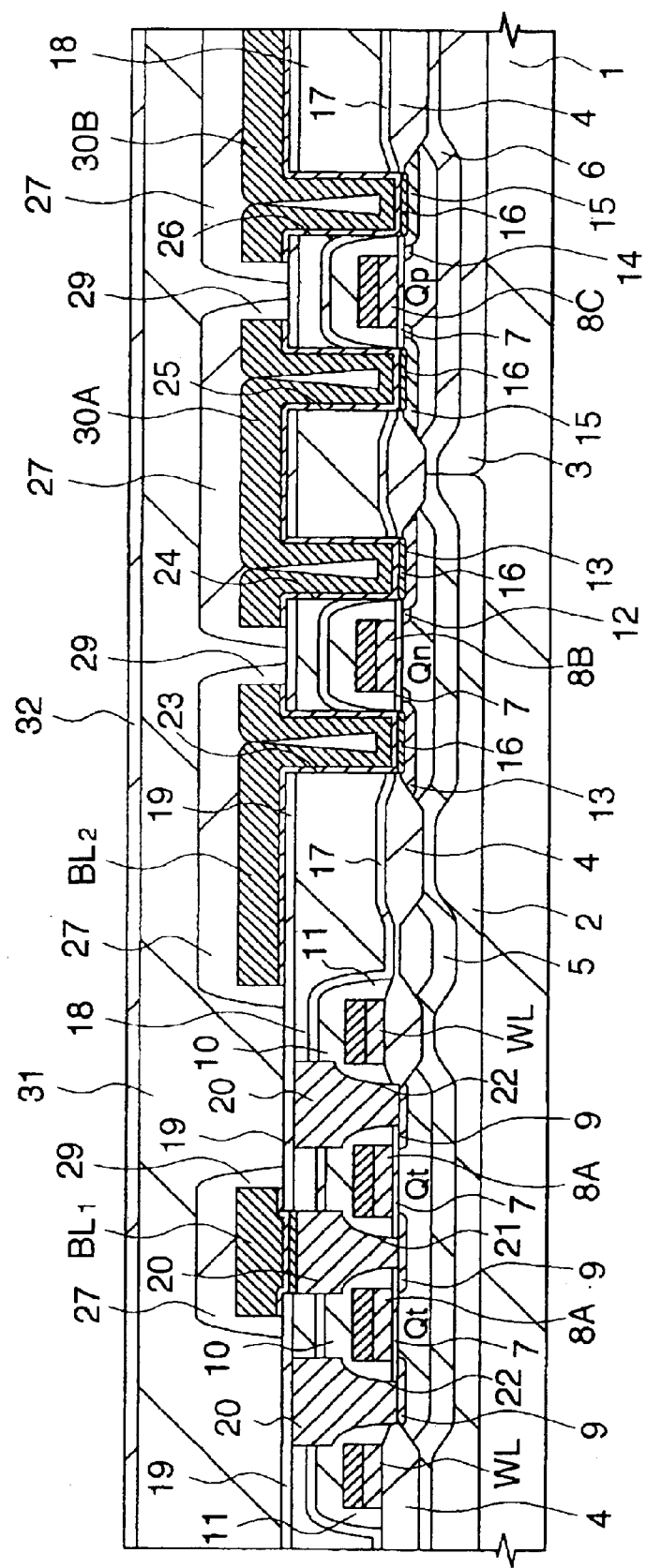

As shown in FIG. 17, a silicon nitride film deposited by a CVD method is anisotropically etched to form side wall spacers 29 on the side walls of the bit lines $BL_1$, $BL_2$ and the interconnections 30A, 30B. Subsequently, a SOG film 31 is spin coated over the bit lines $BL_1$, $BL_2$ and the interconnections 30A, 30B, followed by further deposition of a silicon oxide film according to a CVD method. It will be noted that when a silicon oxide film is used in place of the silicon nitride film 27 and the side wall spacer 29 made of the silicon nitride film, the parasitic capacitance of the bit lines $BL_1$, $BL_2$ and the interconnections 30A, 30B can be reduced.

Figure 18:
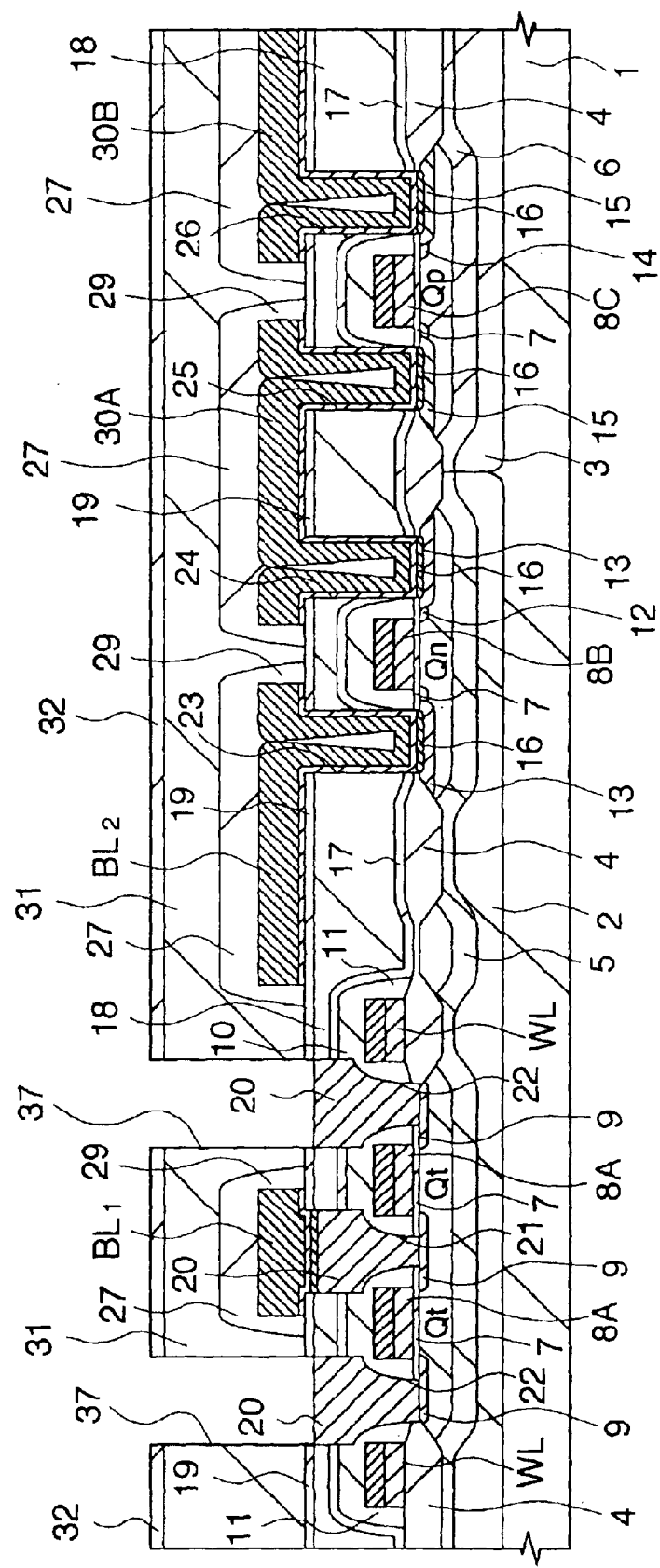

As shown in FIG. 18, the silicon oxide film 32 and the SOG film 31 are etched using a photoresist mask to form a connection hole 37 above the connection hole 22 formed above the other of the source region and the drain region (i.e. the n-type semiconductor region 9) of the memory cell selection MISFET Qt, respectively.

Figure 19:
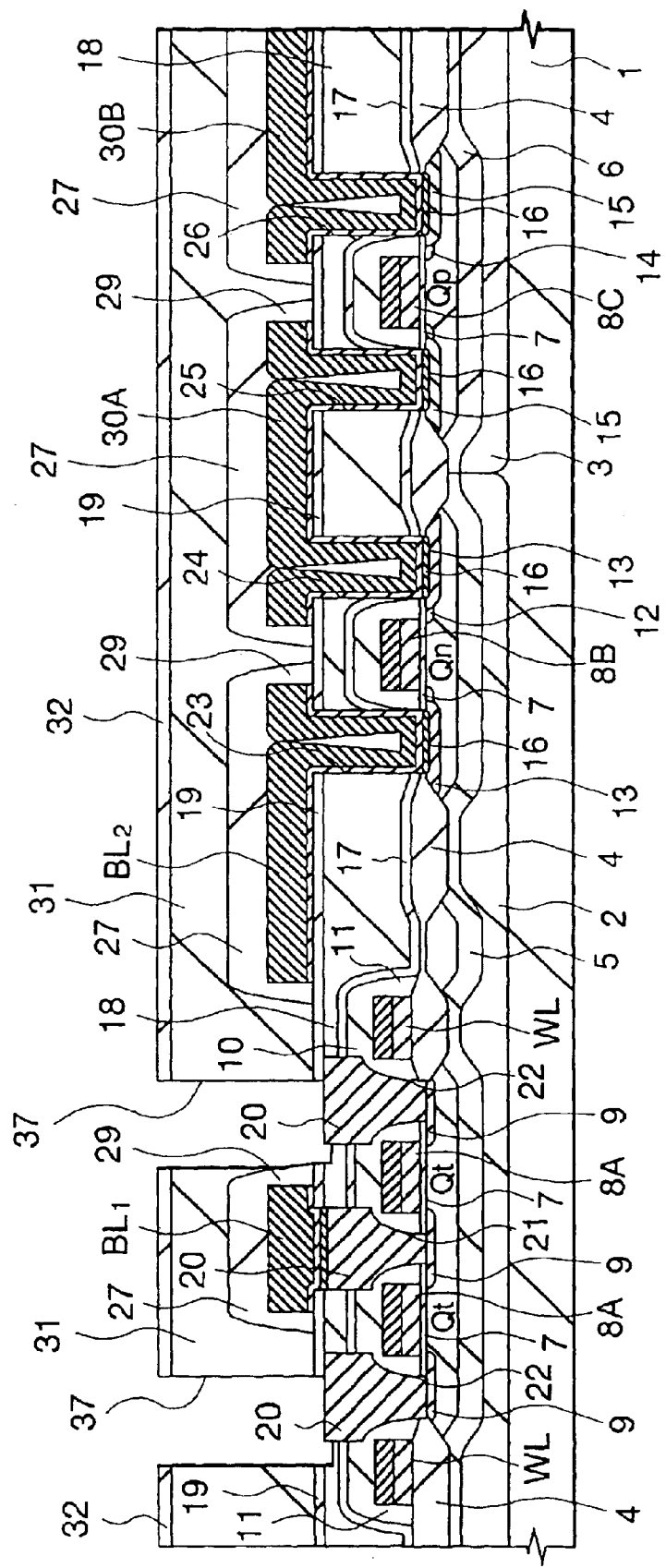

Even when the position of the connection hole 37 is shifted from just above the connection hole 22 as a result of misregistration of the photoresist mask, as shown in FIG. 19, the silicon nitride film 27 which has been formed on the bit lines $BL_1$, $BL_2$ and the interconnections 30A, 30B and the silicon nitride side wall spacers 29 formed on the side walls are left almost non-etched because the etching speed differs from that of the silicon oxide-based insulating films (i.e. the silicon oxide film 32 and the SOG film 31). Accordingly, even if an allowance for the mask registration for the connection hole 37 and the connection hole 22 is made small, the bit lines $BL_1$, $BL_2$ are not exposed at the time of the formation of the connection hole thereby preventing the short circuiting between the bit line $BL_1$ and the information storage capacitor C. This enables one to reduce the size of the memory cell. If a silicon oxide film is employed instead of the silicon nitride film 27 and the side wall spacer 29 made of a silicon nitride film, it is necessary to provide a space sufficient for mask registration between the connection hole 37 and the side wall spacer 29.

Figure 20:
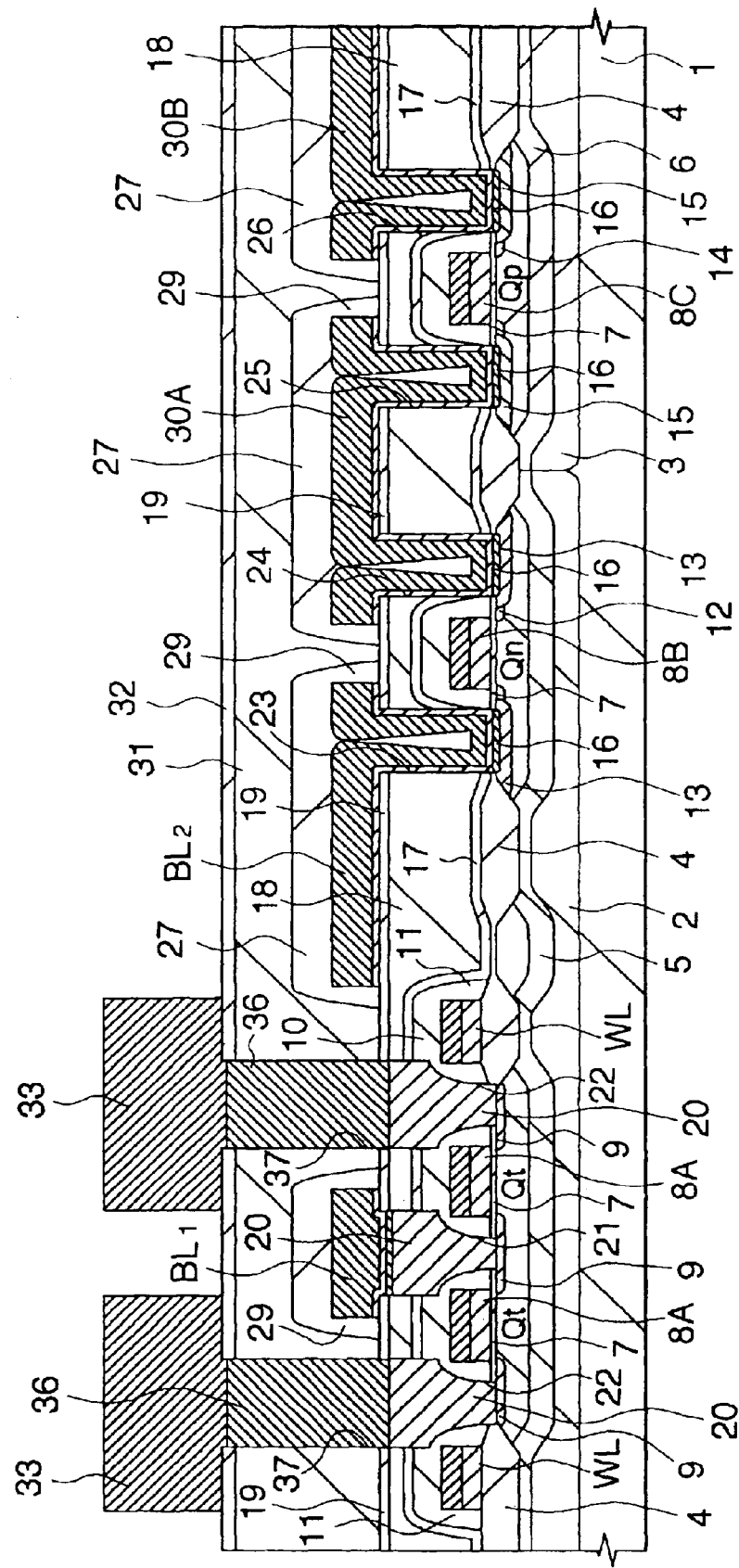

As shown in FIG. 20, after embedding a plug 36 made of W in the connection hole 37, a storage electrode 33 of an information storage capacitor C is formed over the connection hole 37. The plug 36 is formed by etching back a W film (or a polysilicon film) deposited on the silicon oxide 32 by a CVD method. The storage electrode 33 is formed by etching a W film, which is deposited on the silicon oxide film 32 by sputtering, through a photoresist mask in a desired pattern. The plug 36 may be constituted of a polysilicon film or a builtup film of a TiN film and a W film. The storage electrode 33 may be made of a film of a metal or a conductive metal oxide such as Pt, Ir, $1rO_2$, Rh, $RhO_2$, Os, $OSO_2$, Ru, $RuO_2$, Re, $ReO_3$, Pd, Au and the like.

Figure 21:
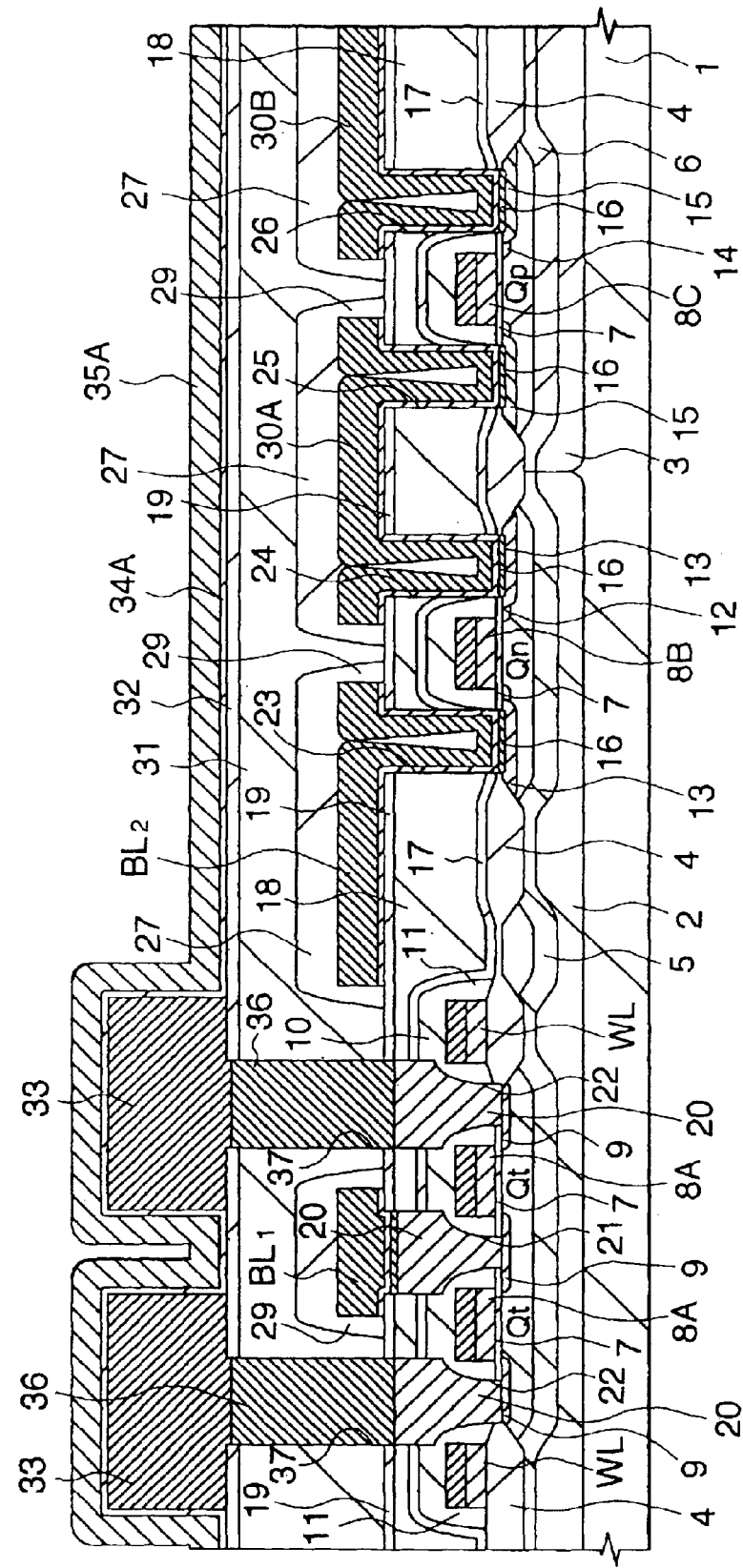
Figure 22:
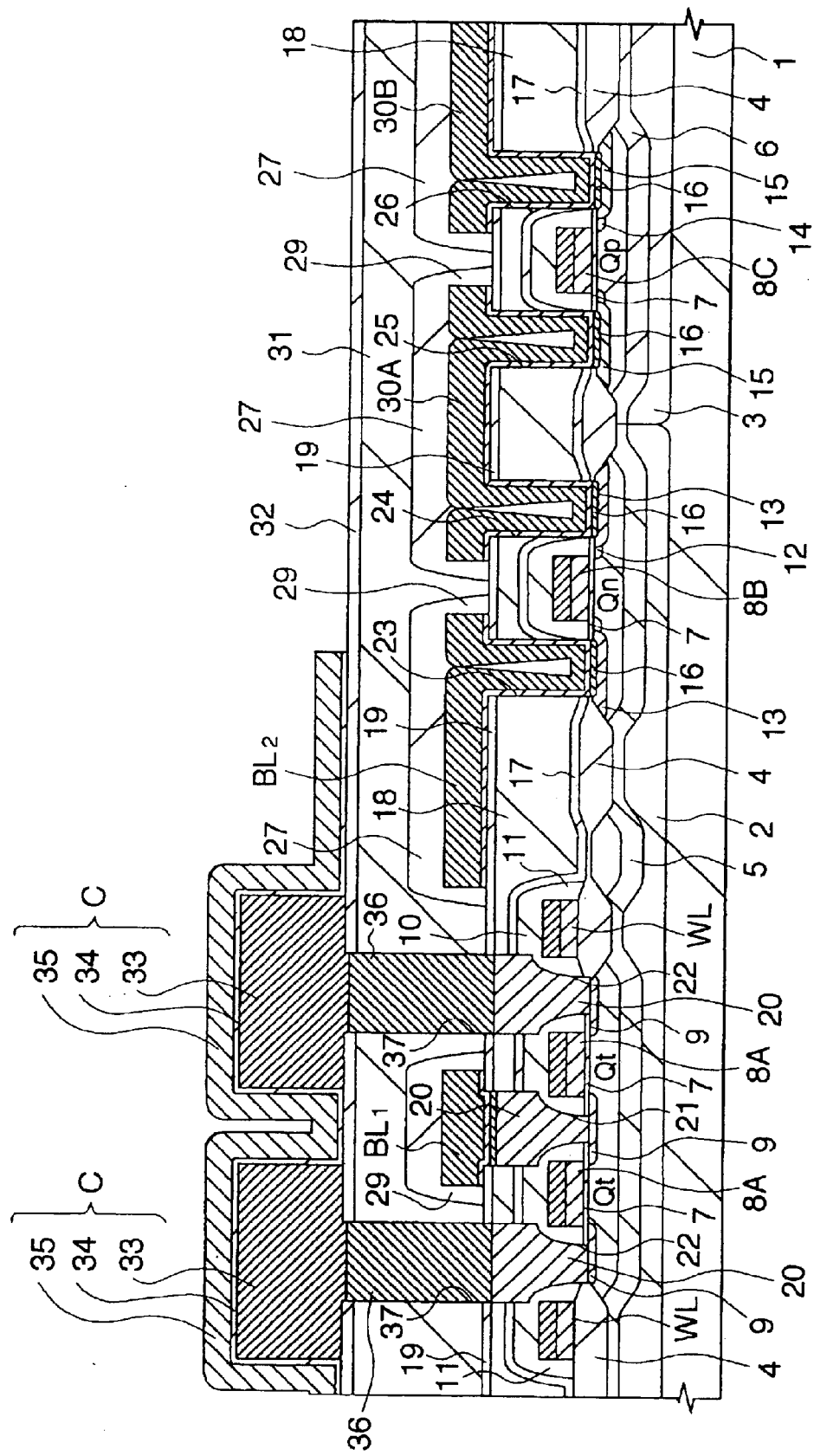

As shown in FIG. 21, a tantalum oxide film 34A is deposited on the storage electrodes 33 according to a plasma CVD method, on which a TiN film 35A is further deposited by a CVD method. Thereafter, as shown in FIG. 22, these films are patterned by etching through a photoresist mask to form an information storage capacitor C including the storage electrode 33 made of the W film, a capacitance insulating film 34 made of the tantalum oxide film 34 and a plate electrode 35 made of the TiN film 35A. The storage electrode 33 is favorably formed to be so thick that the capacitance of the information storage capacitor C becomes great. The plate electrode 35 is formed of the TiN film 35A. If this film is formed to be too thick, the following problems arise: (1) the TiN film 35A is apt to suffer cracking therein; and (2) a stress is exerted on the capacitance insulating film 34 formed below, thereby degrading the characteristics of the film 34. Accordingly, the TiN film preferably has a thickness of approximately 0.2 μm. The capacitance insulating film 34 may be constituted of highly dielectric materials such as BST ((Ba, Sr)$TiO_3$), and ferroelectric materials such as PZT (PbZr$_x$T$_1$–XO$_3$), PLT (PbLa$_x$T$_1$—XO$_3$), PLZT, $PbTiO_3$, $SrTiO_3$, $BaTiO_3$, $PbZrO_3$, $LiNbO_3$, $Bi_4Ti_3O_{12}$, BaMgF4, Y1-based (SrBi$_2$(Nb,Ta)2O$_9$) and the like. The plate electrode 35 may be constituted of films of metals or conductive metal oxides such as tungsten silicide/TiN, Ta, Cu, Ag, Pt, Ir, $IrO_2$, Rh, $RhO_2$, Os, $OsO_2$, Ru, $RuO_2$ Re, $ReO_3$, Pd, Au and the like.

Figure 23:
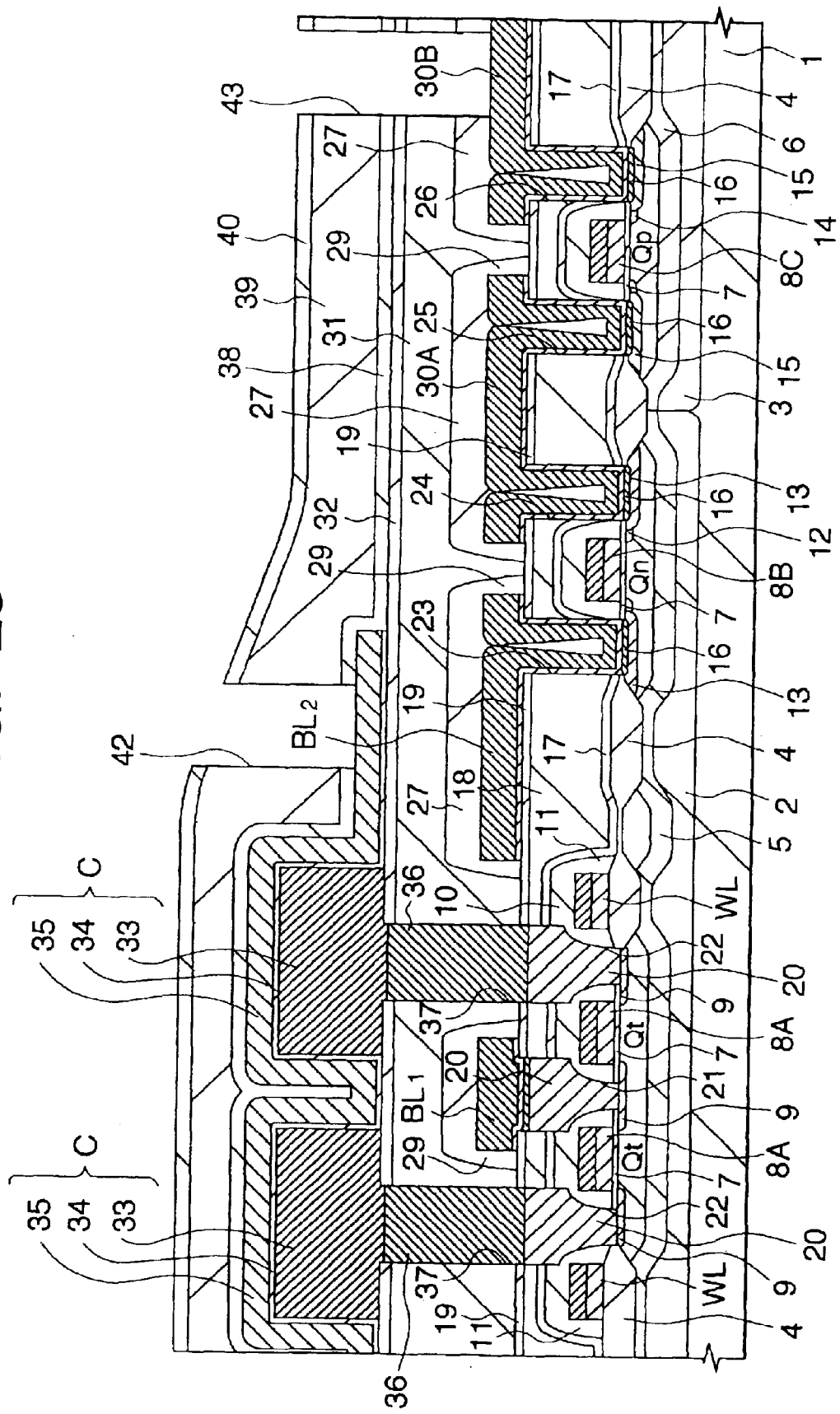

As shown in FIG. 23, a silicon oxide film 38 is deposited over the information storage capacitor C according to a CVD method and an SOG film 39 is spin coated on the film 38, followed by further deposition of a silicon oxide film 40 by a CVD method. Subsequently, the insulating films (i.e. the silicon oxide film 40, the SOG film 39 and the silicon oxide film 38) provided over the plate electrode 35 of the information storage capacitor C are selectively removed by etching to form a connection hole 42. At the same time, the insulating films (i.e. the silicon oxide film 40, the SOG film 39, the silicon oxide film 38, the silicon oxide film 32, the SOG film 31 and the silicon nitride film 27) over the first interconnection layer 30B of the peripheral circuit are selectively etched to form a connection hole 43.

Figure 24:
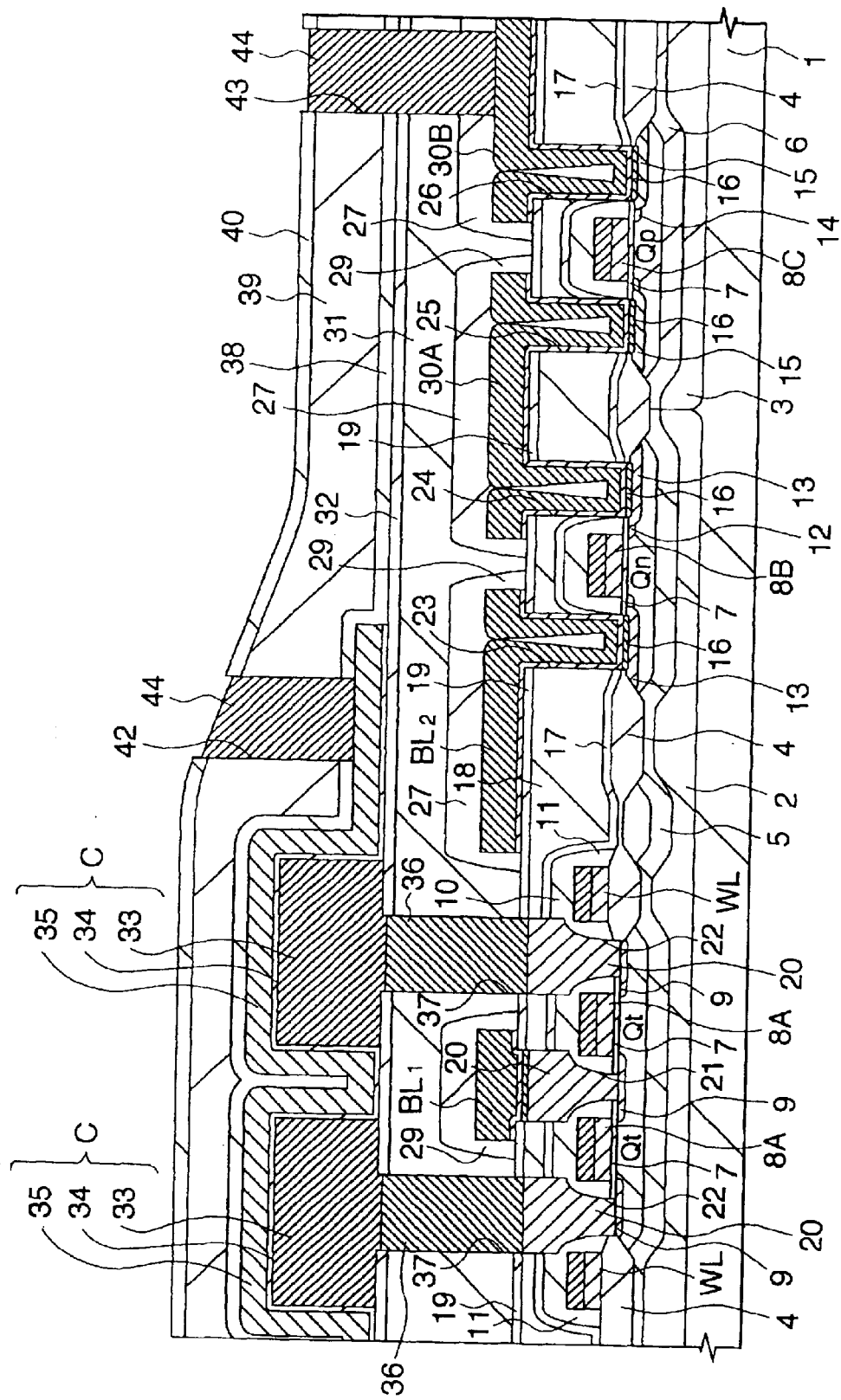
Figure 25:
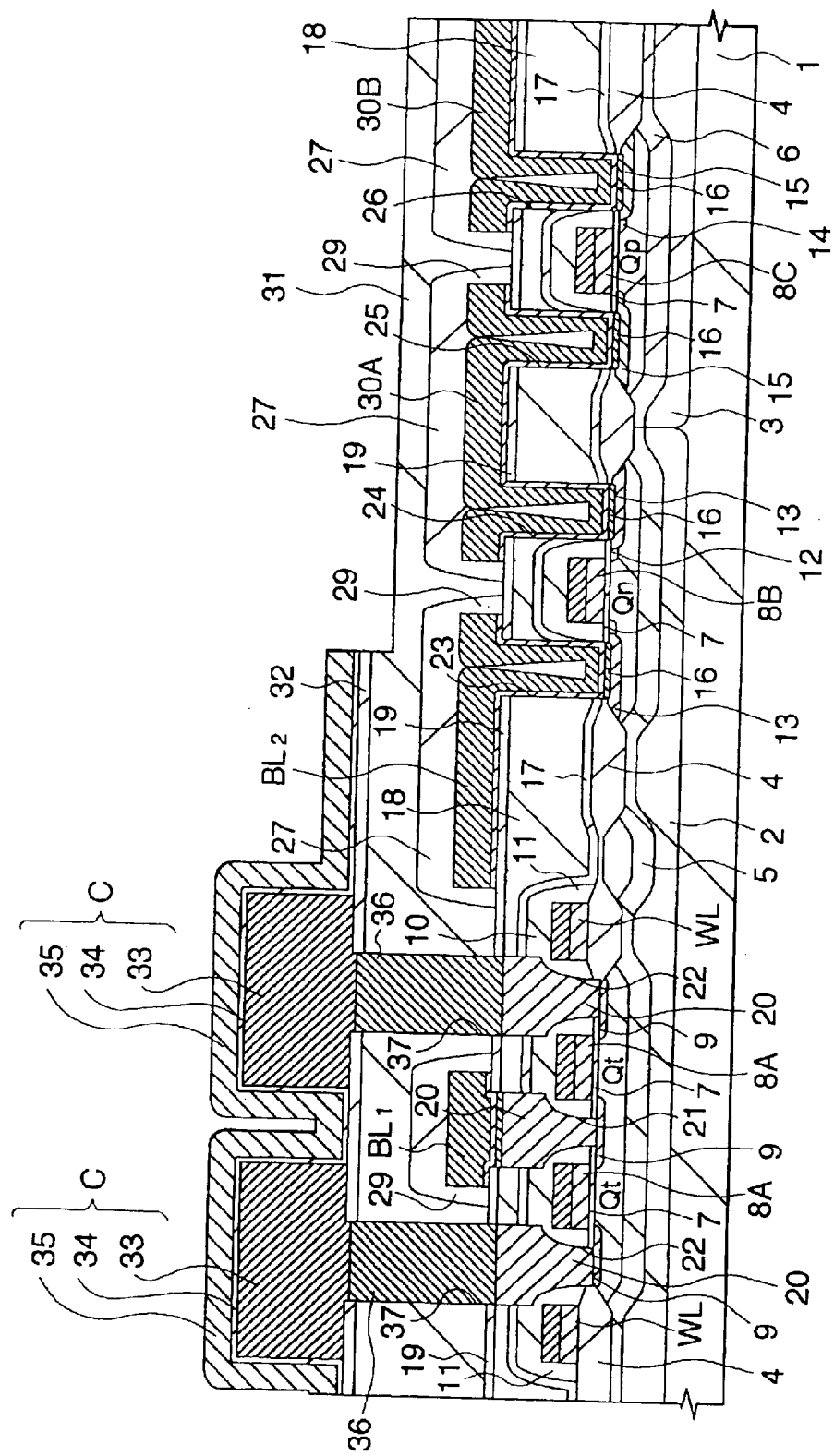
Figure 26:
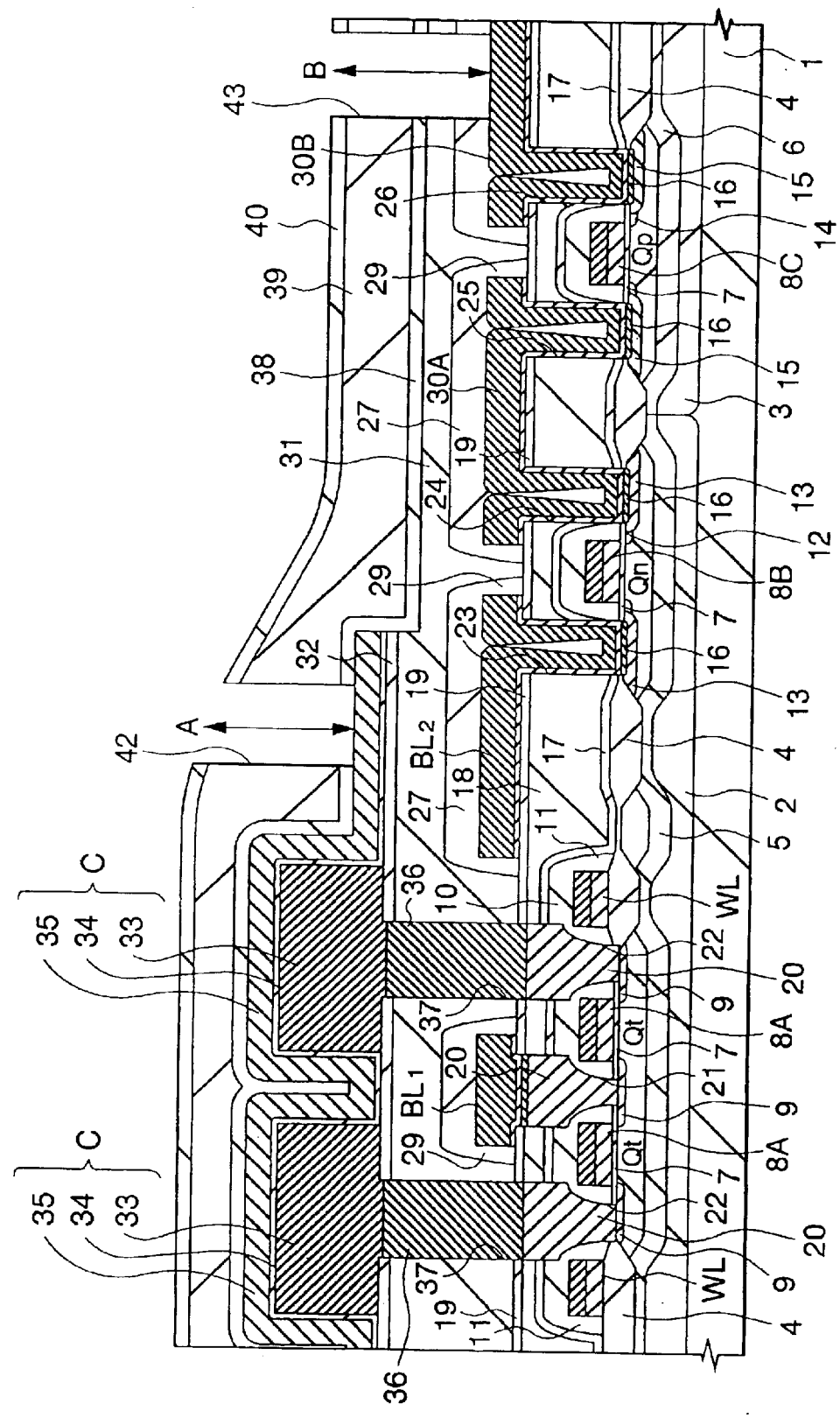

As shown in FIG. 24, tungsten (W) plugs 44 are respectively, embedded in the connection holes 42, 43. The plug 44 is formed by depositing a W film on the silicon oxide film 40 by a CVD method and etching it back. The plug 44 may be constituted of a builtup film of a TiN film and a W film.

Thereafter, a Y select line YS and second interconnection layers 41A, 41B are formed on the silicon oxide film 40, thereby approximately completing the DRAM shown in FIG. 3. The Y select line YS and the interconnections 41A, 41B are, respectively, formed simultaneously by depositing a TiN film, an Al alloy film and a TiN film on the silicon oxide film 40 by sputtering, and patterning these films by etching through a photoresist mask. The Y select line YS and the interconnections 41A, 41B may be formed of a builtup film of a TiN film and a Cu film, respectively.

It will be noted that in the step of forming the connection hole 42 over the information storage capacitor C and the connection hole 43 over the interconnection 30B of the peripheral circuit (as shown in FIG. 23), the thickness of the insulating films on the interconnection 30B is much greater than that of the insulating films formed over the information storage capacitor C, with the great possibility that the plate electrode 35 exposed at the bottom of the connection hole 42 is etched off. To avoid this, when the tantalum film 34A and the TiN film 35A deposited on the storage electrode 33 are patterned to form the information storage capacitor C, the silicon oxide film 32 and the SOG film 31 provided below the storage electrode 33 are etched self-alignedly to the plate electrode 35, so that the insulating films provided above the interconnection 30B are made thin. This makes only a small difference between the thickness (A) of the insulating films provided over the capacitor C and the thickness (B) of the insulating films provided over the interconnection 30B. Thus, the inconvenience of etching off the plate electrode 35 at the bottom of the connection hole can be prevented.

According to the above-stated embodiment of the invention, the following advantages and features can be attained.

(1) The gate electrode 8A (the word line WL) of the memory cell selection MISFET Qt, the gate electrode 8B of the n channel-type MISFET Qn of the peripheral circuit and the gate electrode 8C of the p channel-type MISFET Qp are each made of a low resistance conductor film with its sheet resistance being 2 Ω/□ or below, permitting the gate delay to be reduced. Thus, the working speed of the DRAM increases. A low resistance metallic interconnection (i.e. a word line for shunt) for gate electrode backing, which is conventionally formed on the information storage capacitor, is not necessary, so that the interconnection layers of the memory array MARY can be reduced by one layer.

(2) In view of the above (1), the number of memory cells connecting to one word line can be increased. More particularly, the numbers of word drivers WD and word decoders connected to a given number of memory cells can be reduced, and this leads to a correspondingly reduced chip size (or an enlarged area for memory arrays MARY) thereby improving the degree of integration of the DRAM.

Figure 27:
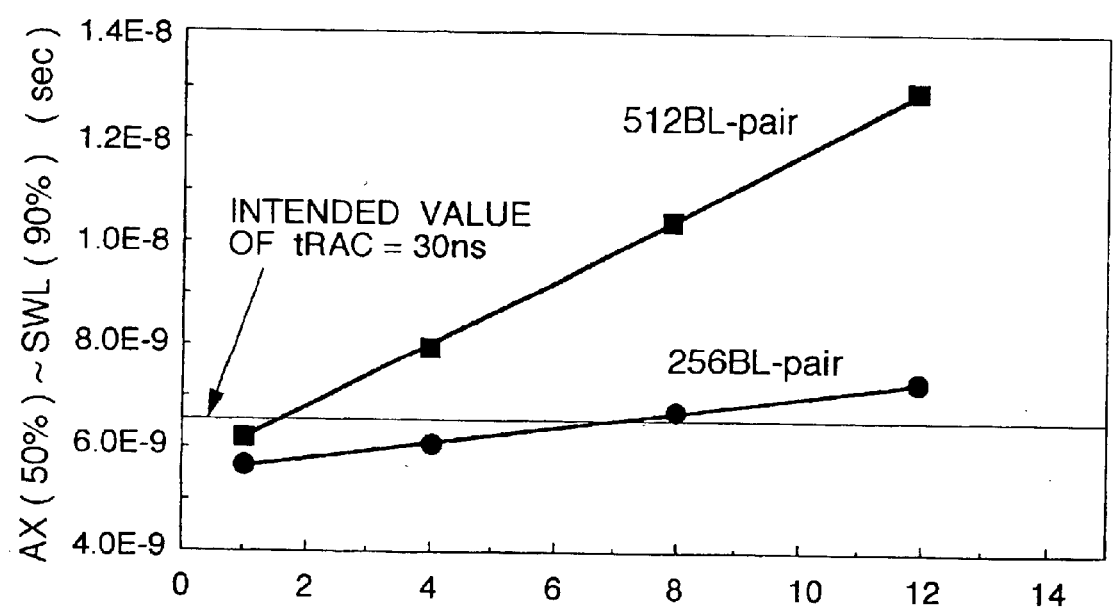

FIG. 27 is a graph showing the relation between the sheet resistance (Ω/□) of a word line and the time before the word line rises up from an input of an address decode signal (50%) to 90%. For instance, in order to realize RAS (raw address strobe) access time (tRAS)=30 nm (corresponding to a word line rise-up time=6.5 nm), it is sufficient that the sheet resistance of a word line is about 8 Ω/□ in a case where 256 memory cells are connected to a pair of word lines. In contrast, when the chip size is reduced by 5% while connecting 512 memory cells per one word line, it is necessary for the sheet resistance of the word line to be about 2 Ω/□ or below. This value does not change even when the minimal processing dimension of the memory cell is reduced. This is because the word line pitches and the bit line pitches are likewise reduced. According to the embodiment of the invention where the sheet resistance of the gate electrode 8A (the word line WL) is 2 Ω/□ or below, the chip size can be reduced by increasing the number of memory cells connected to one word line.

(3) Since the bit lines $BL_1$, $BL_2$ are constituted of a low resistance conductor film and have a sheet resistance of 2 Ω/□ or below, the interconnections 30A, 30B of the peripheral circuit can be formed simultaneously with the formation of the bit lines $BL_1$, $BL_2$. Accordingly, one step can be reduced for the formation of the interconnections of the peripheral circuit.

(4) The first interconnection layers 30A, 30B connected to the n channel-type MISFET Qn and the p channel-type MISFET Qp of the peripheral circuit are provided at a position lower than the information storage capacitor C for the memory cells. The aspect ratios of the connection holes 23, 24 formed over the source region and the drain region of the n channel-type MISFET Qn and the connection holes 25, 26 formed over the source region and the drain region of the p channel-type MISFET Qp can be made small. Thus, the connection reliability of the interconnections in the connection holes can be improved.

(5) In view of (1) and (3) above, the interconnection layers of the memory array MARY can be reduced by one layer and the interconnection layers of the peripheral circuit can also be reduced by one layer. The steps of manufacturing DRAM can be reduced in number with an improved yield and with a reduction of manufacturing costs.

(Embodiment 2)

In the method for manufacturing DRAM according to this embodiment, the interconnections of the peripheral circuit are formed simultaneously with the step of forming the gate electrode 8A (the word line WL) of memory cell selection MISFET Qt, the gate electrode 8B of the n channel-type MISFET Qn of the peripheral circuit, and the gate electrode 8C of the p channel-type MISFET Qp. The interconnection of the peripheral circuit is also formed simultaneously with the step of forming the bit lines $BL_1$, $BL_2$.

Figure 28:
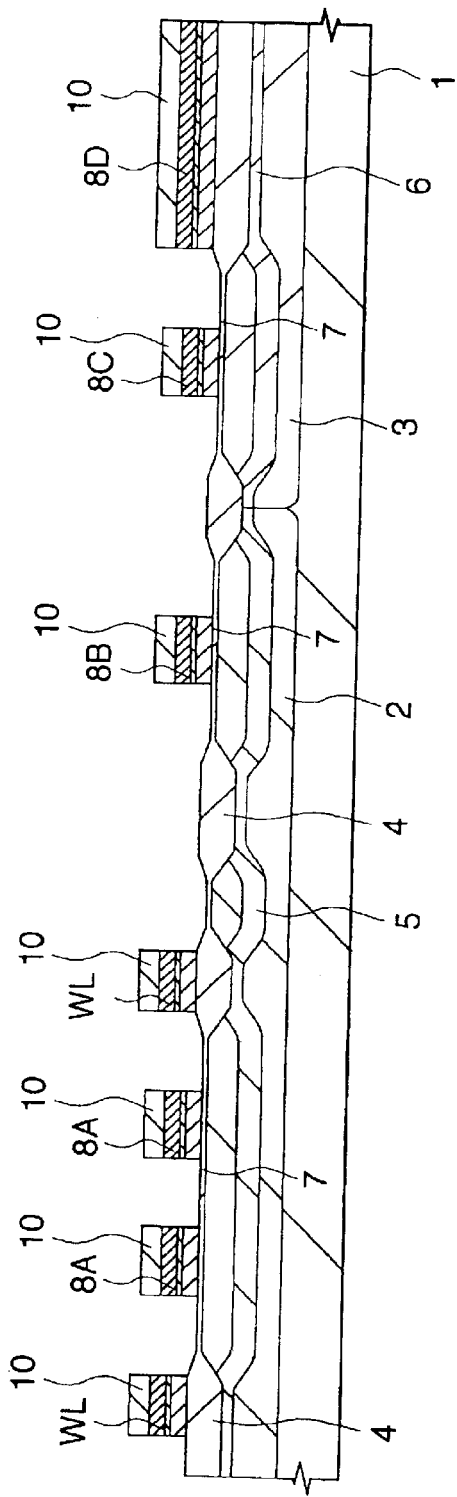
FIGS. 28 to 33 are, respectively, a sectional view illustrating a method for manufacturing a DRAM according to Embodiment 2 of the invention.

For the manufacture of a DRAM, as shown in FIG. 28, a field oxide film 4, a p-type well 2, an n-type well 3, a p-type channel stopper layer 5 and an n-type channel stopper 6 are formed on the main surface of a semiconductor substrate 1 in the same manner as in Embodiment 1. A gate oxide film is formed on the respective active regions of the p-type well 2 and the n-type well 3 surrounded by the field oxide film 4, followed by formation of a gate electrode 8A (a word line WL) of the memory cell selection MISFET Qt, a gate electrode 8B of an n channel-type MISFET Qn, a gate electrode 8C of a p channel-type MISFET Qp, and a first interconnection layer 8D. The gate electrode 8A (the word line WL), the gate electrodes 8B, 8C and the interconnection 8D are formed of the same low resistance conductor film as the gate electrode 8A (the word line WL) and the gate electrodes 8B, 8C of Embodiment 1, with their sheet resistance being 2 Ω/□ or below.

Figure 29:
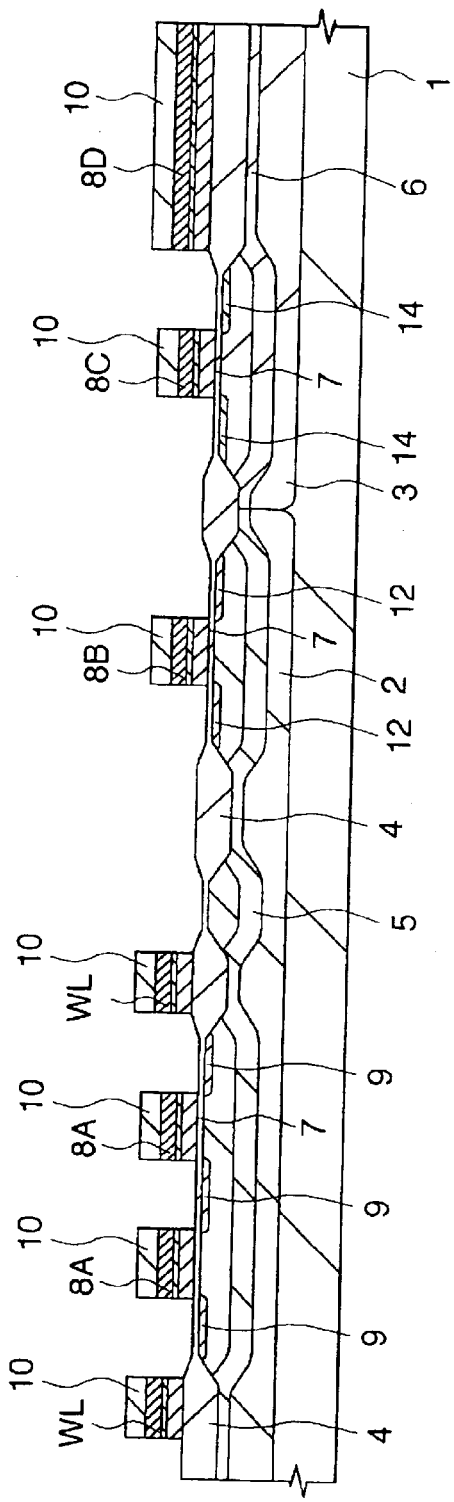

As shown in FIG. 29, an n-type impurity (P) is ion implanted into the p-type wells 2 to form an n-type semiconductor region 9 of the memory cell selection MISFET Qt and an n$^-$-type semiconductor region 12 of the n-channel-type MISFET Qn, both self-alignedly to the gate electrodes 8A and 8B, respectively. A p-type impurity (B) is ion implanted into the n-type well 3 to form a p$^-$-type semiconductor region 14 of the p channel-type MISFET Qp self-alignedly to the gate electrode 8C.

Figure 30:
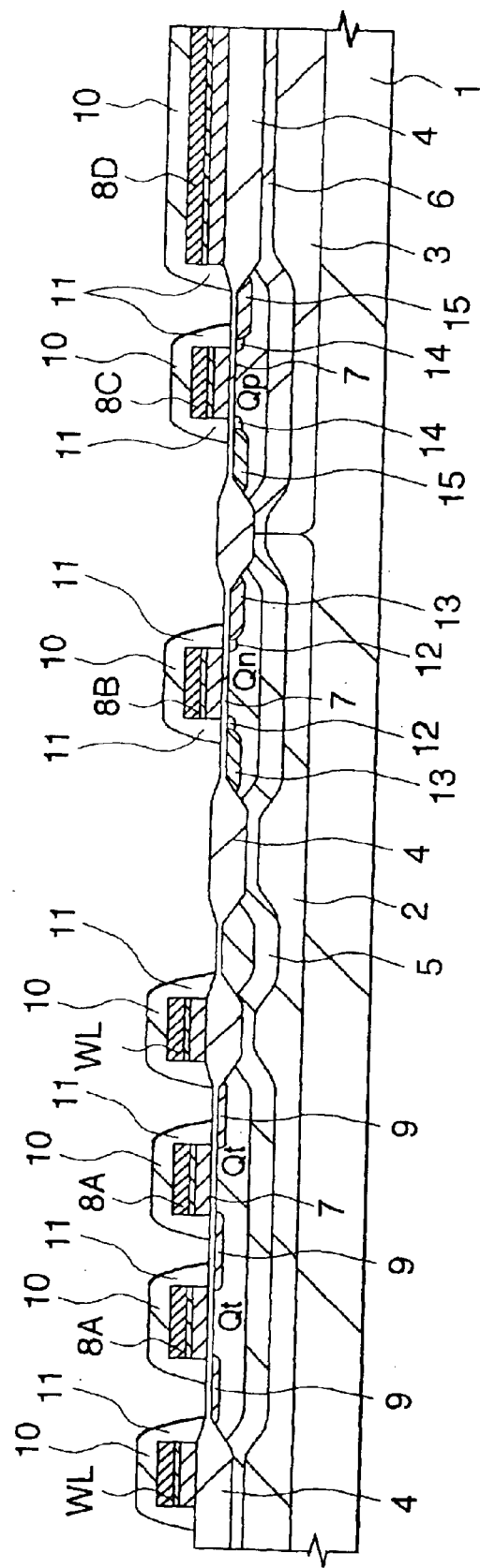

As shown in FIG. 30, after formation of silicon nitride, side wall spacers 11 on the respective side walls of the gate electrode 8A (the word line WL) of the memory cell selection MISFET Qt, the gate electrode 8B of the n channel-type MISFET Qn, the gate electrode 8C of the p channel-type MISFET Qp, and the interconnection 8D, an n-type impurity (P) is ion implanted into the p-type well of the peripheral circuit to form an n$^+$-type semiconductor region 13 of the n channel-type MISFET Qn as being self-aligned relative to the side wall spacer 11. A p-type impurity (B) is ion implanted into the n-type well 3 to form a p$^+$-type semiconductor region 15 of the p channel-type MISFET Qn as being self-aligned relative to the side wall spacer 11.

Figure 31:
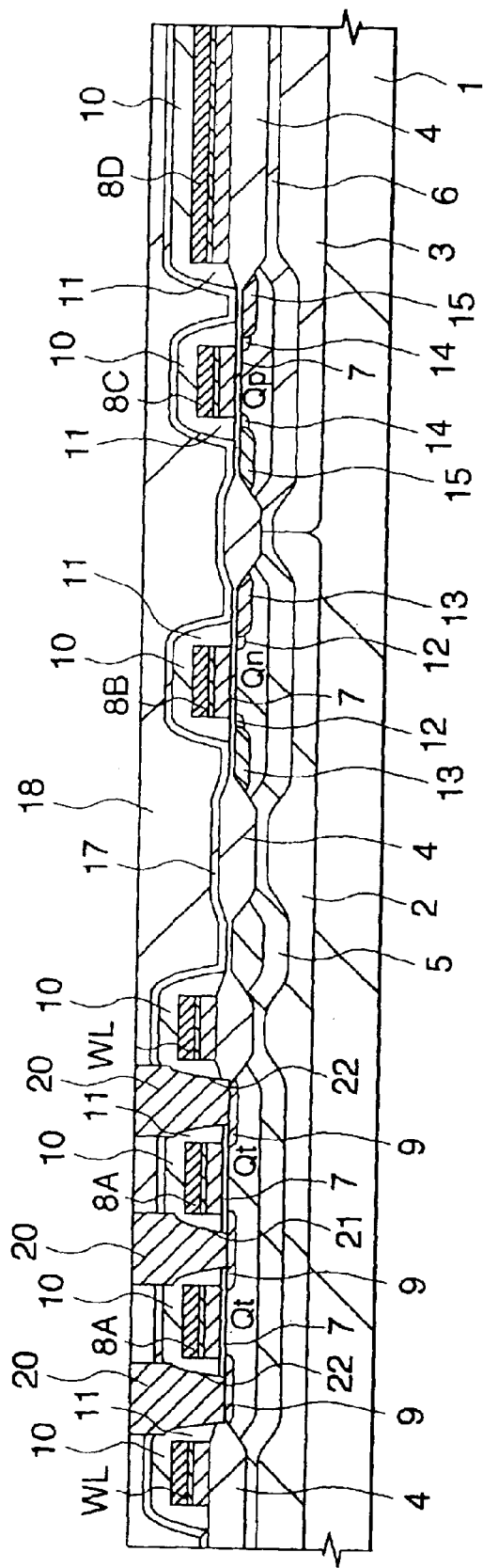

As shown in FIG. 31, a silicon oxide film 17 and a BPSG film 18 are deposited over the gate electrode 8A (the word line WL) of the memory cell selection MISFET Qt, the gate electrode 8B of the n channel-type MISFET Qn, the gate electrode 8C of the p channel-type MISFET Qp, and the interconnection 8D. Thereafter, connection holes 21, 22 are formed over the source region and the drain region (n-type semiconductor regions 9, 9) of the memory cell selection MISFET Qt, respectively. A polysilicon plug is embedded in the connection holes 21, 22, respectively. The plug 20 may be formed in the same manner as illustrated with reference to FIGS. 11 and 12.

Figure 32:
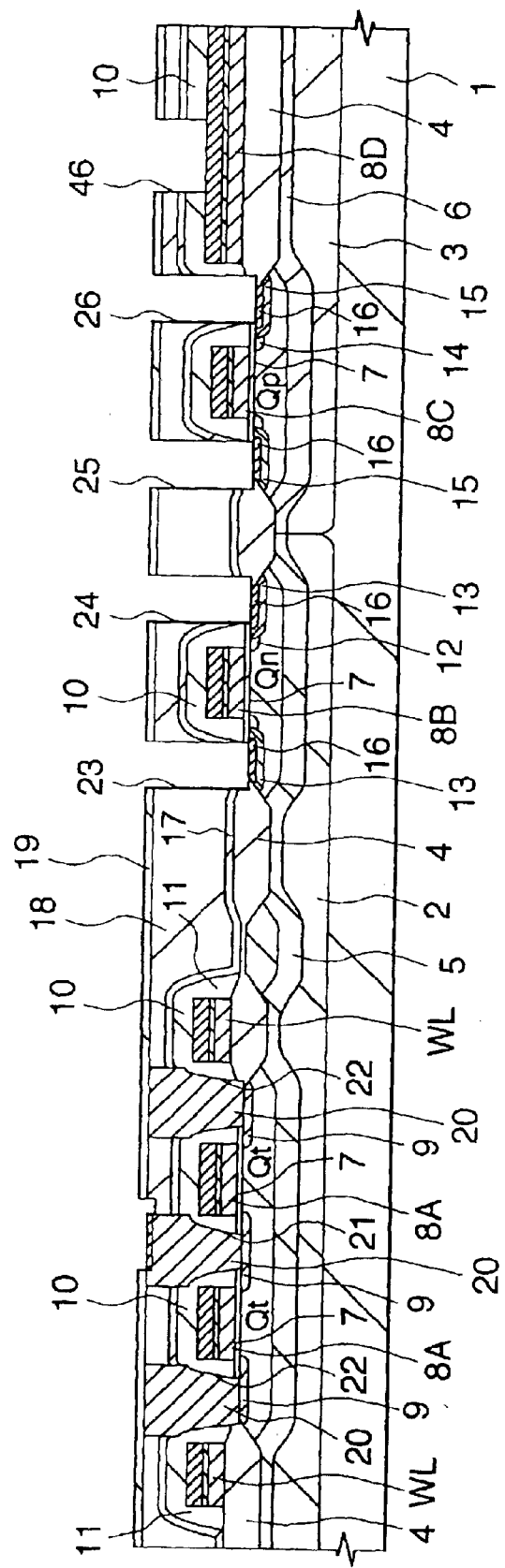

As shown in FIG. 32, a silicon oxide film 19 is deposited on the BPSG film 18, followed by removal of the silicon oxide film 19 above the connection hole 21 by etching through a photoresist mask. Then, the silicon oxide film 19, the BPSG film 18, the silicon oxide film 17 and the gate oxide film 7 of the peripheral circuit are selectively etched through a photoresist mask, thereby forming a connection hole 23 above one of the source region and the drain region of the n channel-type MISFET Qn and a connection hole 24 above the other region. At the same time, a connection hole 25 is formed above one of the source region and the drain region of the p channel-type MISFET Qp and a connection hole 26 is formed above the other region along with a connection hole 46 above the interconnection 8D. This step is similar to that illustrated hereinbefore with reference to FIGS. 13 to 15.

Figure 33:
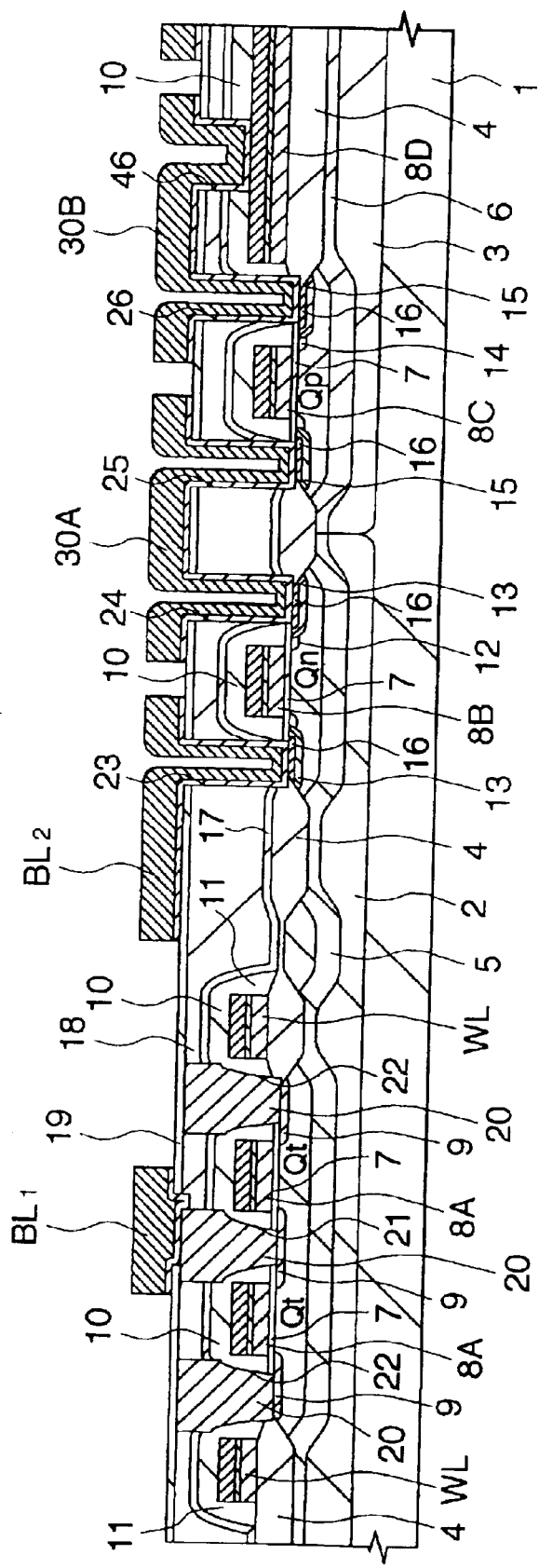

As shown in FIG. 33, a titanium silicide layer is, respectively, formed on the surfaces of the n⁺-type semiconductor regions 13 of the n channel-type MISFET Qn exposed at the bottoms of the connection holes 23, 24 and the surfaces of the p⁺-type MISFET Qp exposed at the bottoms of the connection holes 25, 26. Bit lines $BL_1$, $BL_2$ are formed on the silicon oxide layer 19 of the memory array MAR and second interconnection layers 30A, 30B are also formed on the silicon oxide layer 19 of the peripheral circuit. The interconnection 30B is electrically connected to the first interconnection layer 8D via the connection hole 46. The bit lines $BL_1$, $BL_2$ and the interconnections 30A, 30B are each formed of such a low resistance conductor film as the bit lines $BL_1$, $BL_2$ and the interconnections 30A, 30B of Embodiment 1, with their sheet resistance being 2 Ω/□ or below. This formation step is similar to that illustrated with reference to FIG. 16.

Although not particularly shown in FIG. 33, an information storage capacitor C formed over the bit lines $BL_1$, $BL_2$ is formed in the same manner as in Embodiment 1, followed by formation of a Y select line and also of a third interconnection line of the peripheral circuit.

According to the method of manufacture of this embodiment, the first interconnection layer 8D of the peripheral circuit is formed simultaneously with the formation of the gate electrode 8A (the word line WL) of the memory cell selection MISFET Qt, and the gate electrode 8B of the n channel-type MISFET Qn and the gate electrode 8C of the p channel-type MISFET Qp of the peripheral circuit. The second interconnection layers 30A, 30B of the peripheral circuit are simultaneously formed in the step of forming the bit lines $BL_1$, $BL_2$. The third interconnection layer of the peripheral circuit is formed simultaneously with the formation of the Y select line. Thus, the interconnections of the peripheral circuit can be formed by reducing two steps, leading to a reduction in the number of the manufacturing steps of the DRAM, an improved yield and the reduction of the manufacturing costs.

(Embodiment 3)

In the method for manufacturing a DRAM according to this embodiment, a semiconductor substrate 1 composed of p⁻-type single crystal is thermally oxidized to form a thin silicon oxide film 50 on the surface thereof. A silicon nitride film 51 is deposited on the silicon oxide film 50 according to a CVD method, followed by selectively etching the silicon nitride 51 through a photoresist mask to remove the silicon nitride film 51 in element separation regions as shown in FIG. 34.

As shown in FIG. 35, the semiconductor substrate 1 at the element separation regions is etched using the silicon nitride film 51 as a mask to form shallow grooves 52, followed by thermal oxidation of the semiconductor substrate 1 to form a silicon oxide film 53 on the inner walls of the grooves 52.

Figure 36:
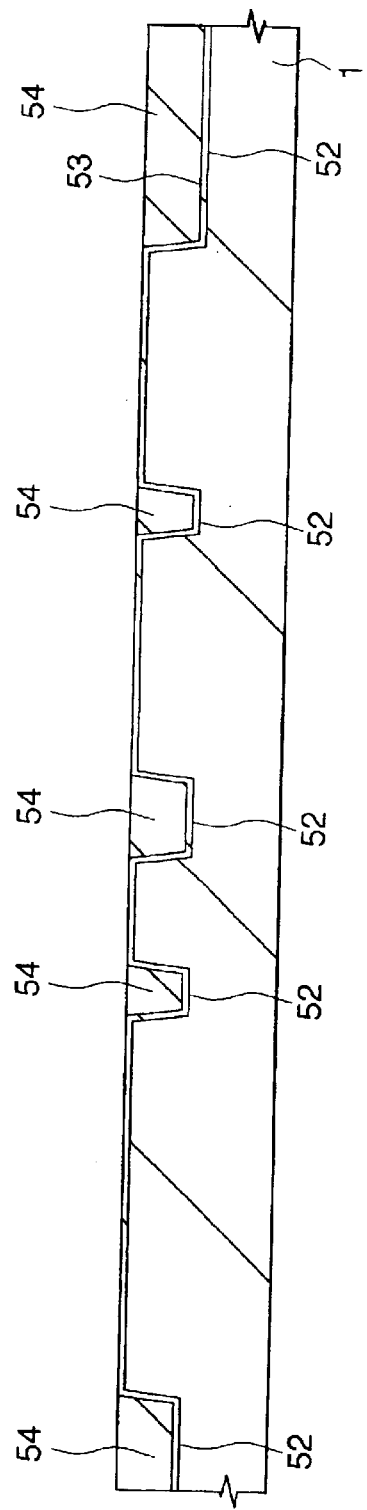

As shown in FIG. 36, a silicon oxide film 54 is filled in the respective shallow grooves 52. In order to fill the silicon oxide film 54 in each groove 52, the silicon oxide film 54 is deposited over the semiconductor substrate 1 by use of a CVD method, followed by polishing the silicon oxide film 54 according to a chemical mechanical polishing (CMP) Method. Subsequently, the silicon nitride film 51 left on the semiconductor substrate 1 is removed by etching.

Figure 37:
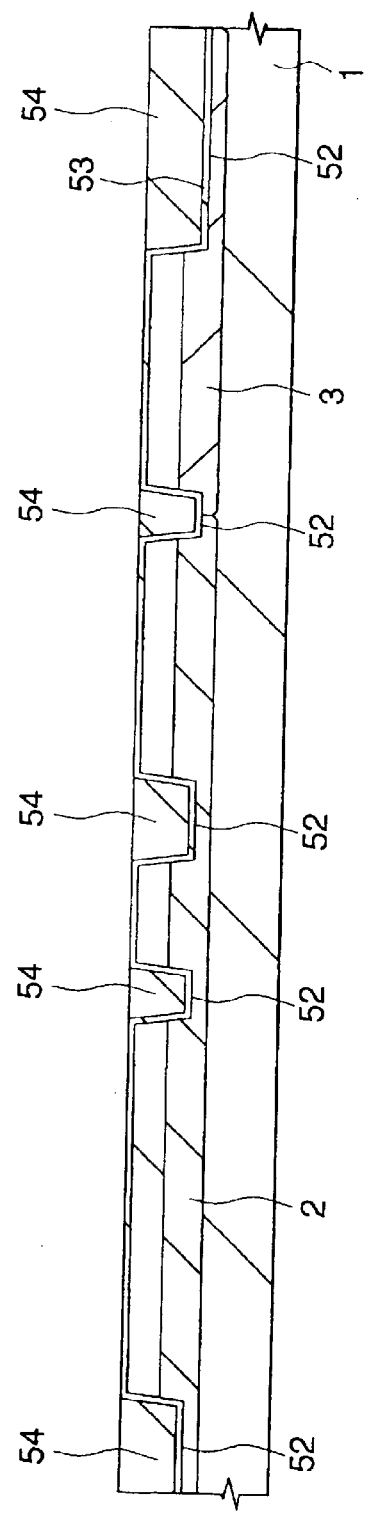

As shown in FIG. 37, a p-type impurity (B) is ion implanted into regions of the semiconductor substrate 1 where a memory cell is to be formed and where an n channel-type MISFET of a peripheral circuit is to be formed, thereby forming a p-type well 2. An n-type impurity (P) is ion implanted into a region of the semiconductor substrate 1, where a p channel-type MISFET of the peripheral circuit is to be formed, thereby forming an n-type well 3. When ion implantation is carried out such that distribution peaks of the n-type impurity and the p-type impurity are substantially in coincidence with the depth of the shallow grooves 52, it becomes possible for the p-type well 2 to serve as a p-type channel stopper layer and the n-type well 3 to serve as an n-type channel stopper layer.

Figure 38:
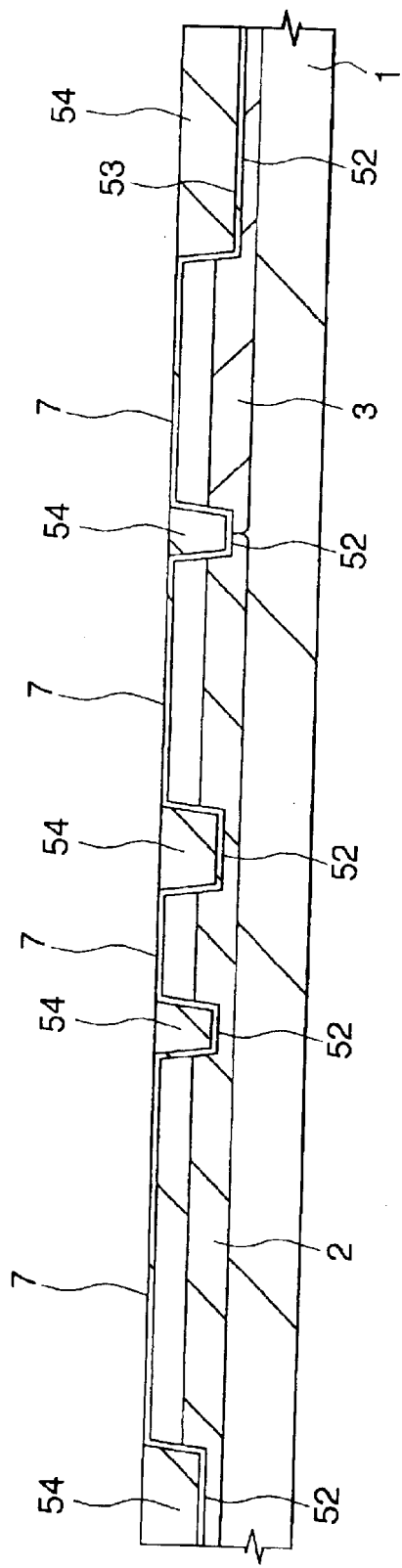

As shown in FIG. 38, the active regions of the p-type well 2 and the n-type well 3 surrounded by the shallow grooves 52 are thermally oxidized to form a gate oxide film 7. Subsequent steps are the same as those of Embodiment 1.

According to this embodiment of the invention, the p-type well 2 serves also as a p-type channel stopper and the n-type well 3 serves as an n-type channel stopper, so that the ion implantation step of forming a p-type channel stopper layer and the ion implantation step of forming an n-type channel stopper layer do not become necessary. Thus, the number of steps of manufacturing the DRAM can be reduced.

According to the method of this embodiment, the elements are separated from each other by means of the shallow grooves formed in the semiconductor substrate 1, permitting the DRAM to be made finer in size. Since there is no step between the element isolation region and the active region, it becomes possible to avoid the problem that a conductor film, such as a gate electrode, deposited on the semiconductor substrate 1, is made thinner at a stepped portion. It will be noted that the element isolation method set out in Embodiment 3 is applicable to all the embodiments of the invention.

(Embodiment 4)

The method for manufacturing DRAM according to this embodiment of the invention includes the simultaneous formation of interconnections of a peripheral circuit in the step of forming a storage electrode (lower electrode) of an information storage capacitor C of a memory cell.

Figure 39:
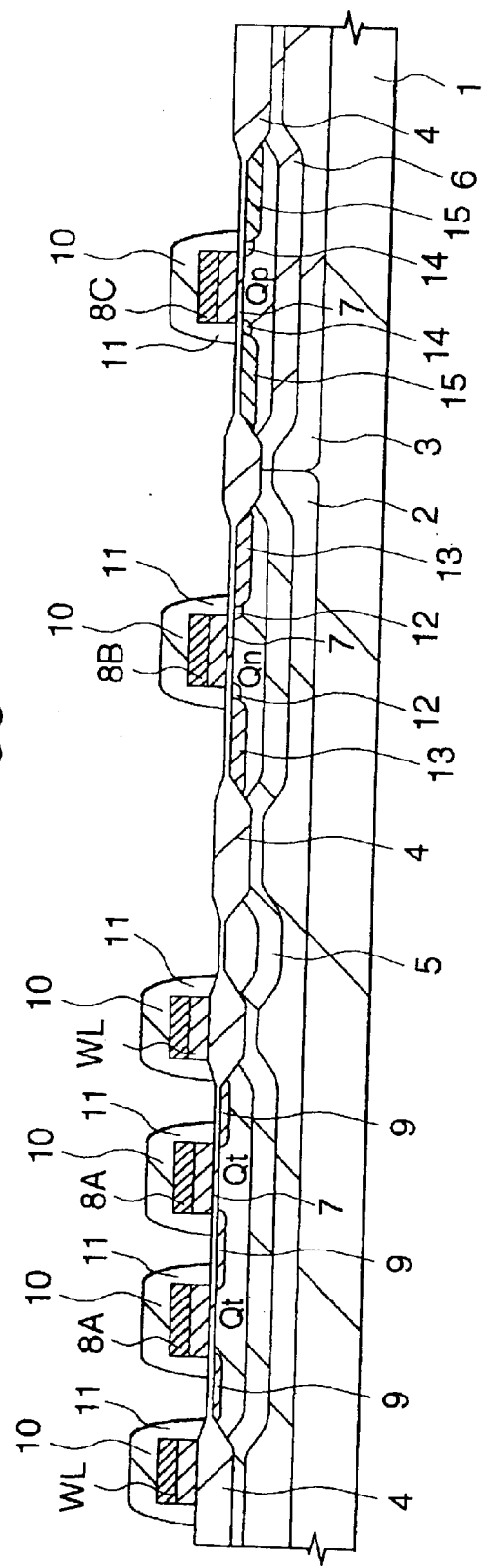
FIGS. 39 to 49 are, respectively, a sectional view illustrating a method for manufacturing a DRAM according to Embodiment 4 of the invention.

For the manufacture of the DRAM, as shown in FIG. 39, a gate electrode 8A (the word line WL) of memory cell selection MISFET Qt, and a gate electrode 8B of an n channel-type MISFET Qn and a gate electrode 8C of a p channel-type MISFET Qp of a peripheral circuit are formed on the main surface of a semiconductor substrate 1 in the same manner as in Embodiment 1. The gate electrode 8A (the word lines WL) and the gate electrodes 8B, 8C are formed of a low resistance conductor film similar to those of the gate electrode 8A (the word line WL) and the gate electrodes 8B, 8C of Embodiment 1, with their sheet resistance being 2 Ω/□ or below.

Figure 40:
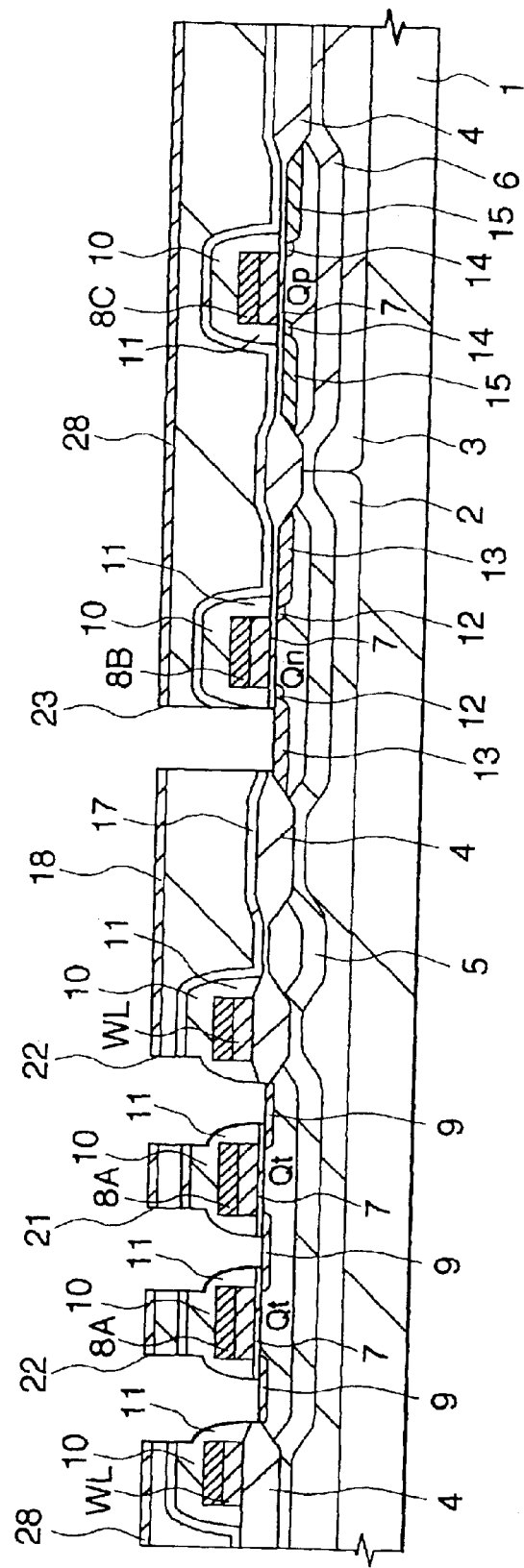

As shown in FIG. 40, a silicon oxide film 17 and a BPSG film 18 are deposited over the gate electrode 8A (the word line WL) of memory cell selection MISFET Qt, and the gate electrode 8B of the n channel-type MISFET Qn and the gate electrode 8C of the p channel-type MISFET Qp. Subsequently, the BPSG film 18, the silicon oxide film 17 and the gate oxide film 7 are etched through a mask of a polysilicon film 28 to form connection holes 21, 22 above the source region and the drain region (i.e. the n-type semiconductor regions 9, 9) of the memory cell selection MISFET Qt. At the same time, a connection hole 23 is formed above one of the source region (i.e. an n⁺-type semiconductor region 13) of the n channel-type MISFET Qn of the peripheral circuit to which a bit line ($BL_2$) is connected in a subsequent step.

Figure 41:
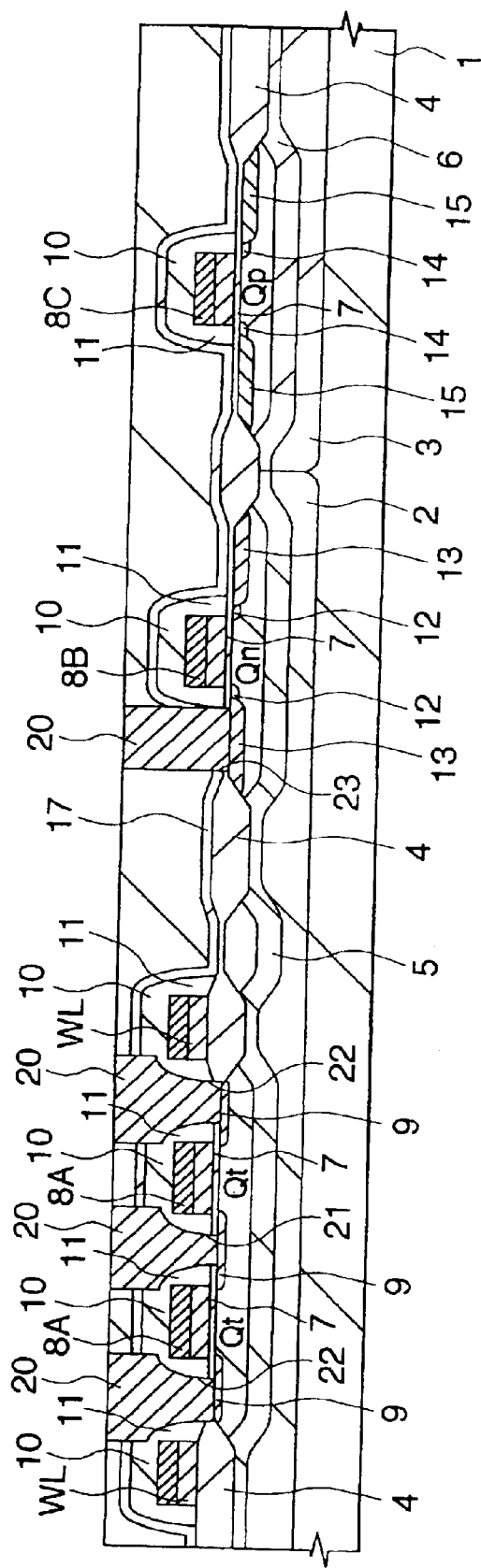
Figure 42:
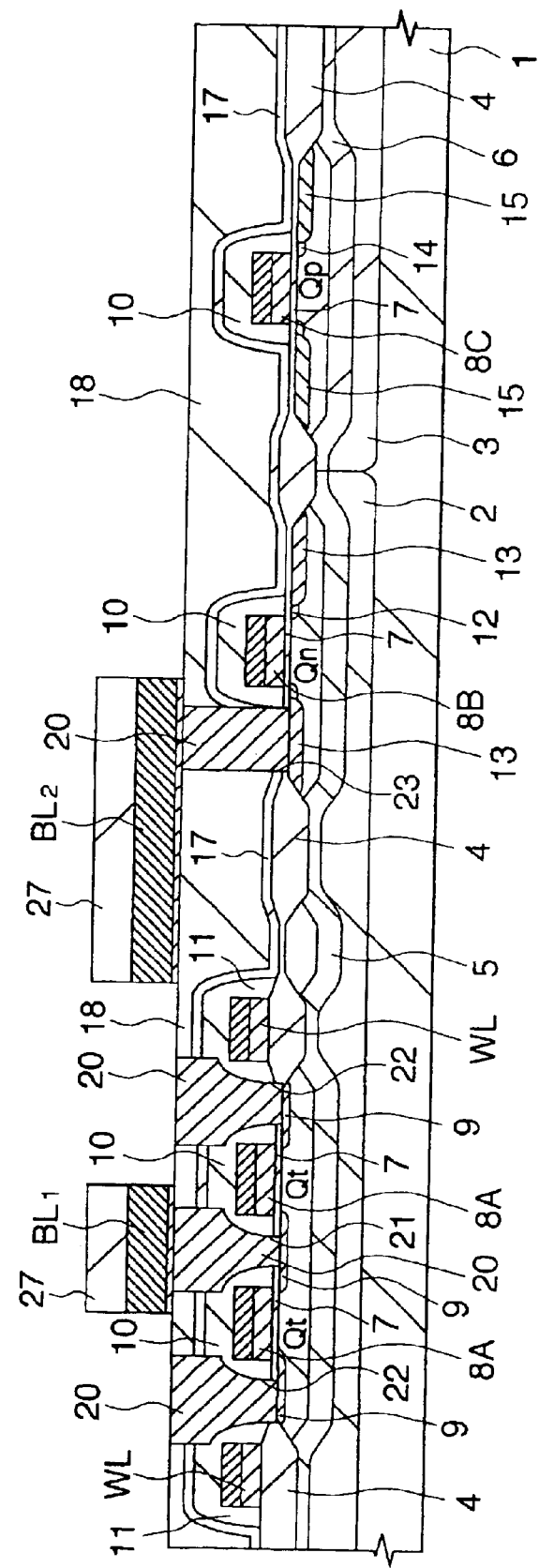

As shown in FIG. 41, a polysilicon plug 20 is, respectively, embedded in the connection holes 21, 22, 23. Thereafter, as shown in FIG. 42, bit lines $BL_1$, $BL_2$ are formed on the silicon oxide film 19 of the memory array MARY. The bit lines $BL_1$, $BL_2$ are formed of a low resistance conductor film similar to that of the bit lines $BL_1$, $BL_2$ of Embodiment 1, with their sheet resistance being 2 Ω/□ or below.

Figure 43:
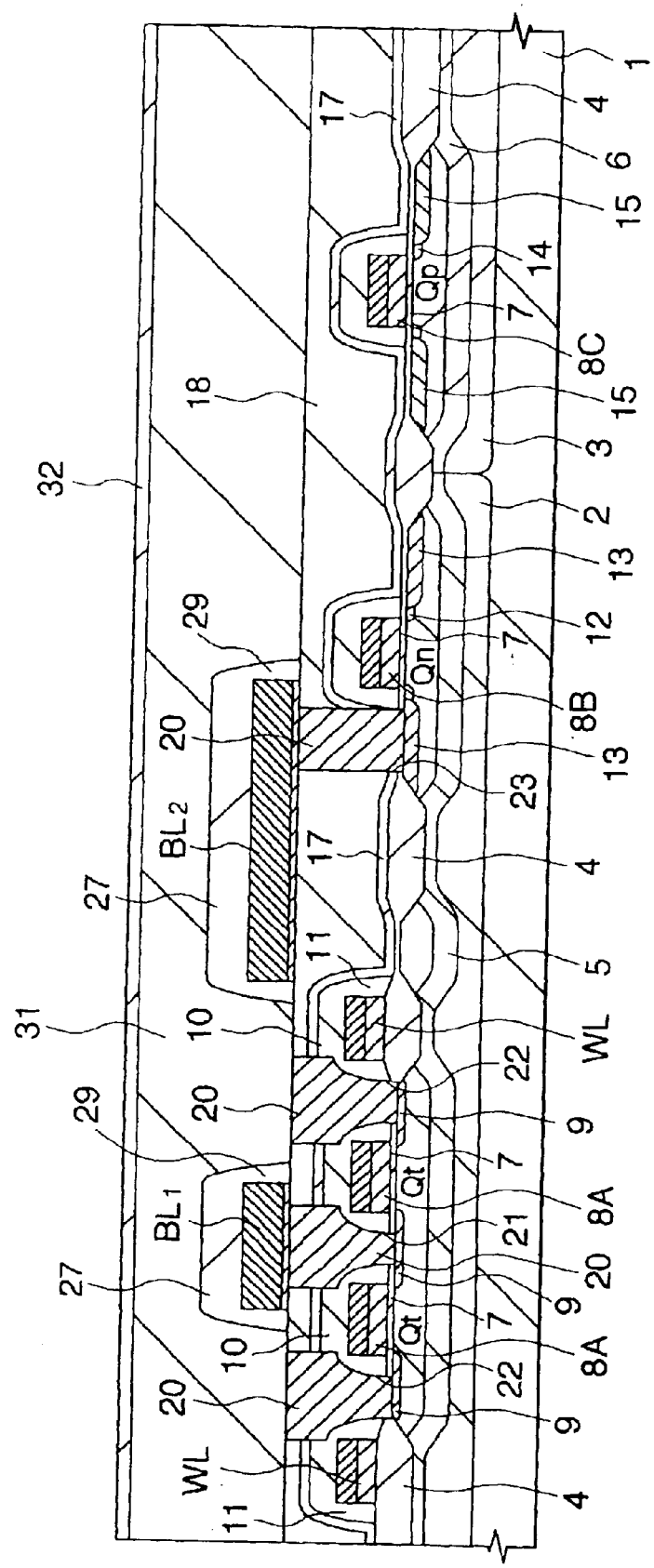

As shown in FIG. 43, a silicon nitride film deposited by a CVD method is anisotropically etched to form side wall spacers 29 on side walls of the bit lines $BL_1$, $BL_2$, followed by spin coating of an SOG film 31 over the bit lines $BL_1$, $BL_2$ and then deposition of a silicon oxide film 32 by a CVD method.

Figure 44:
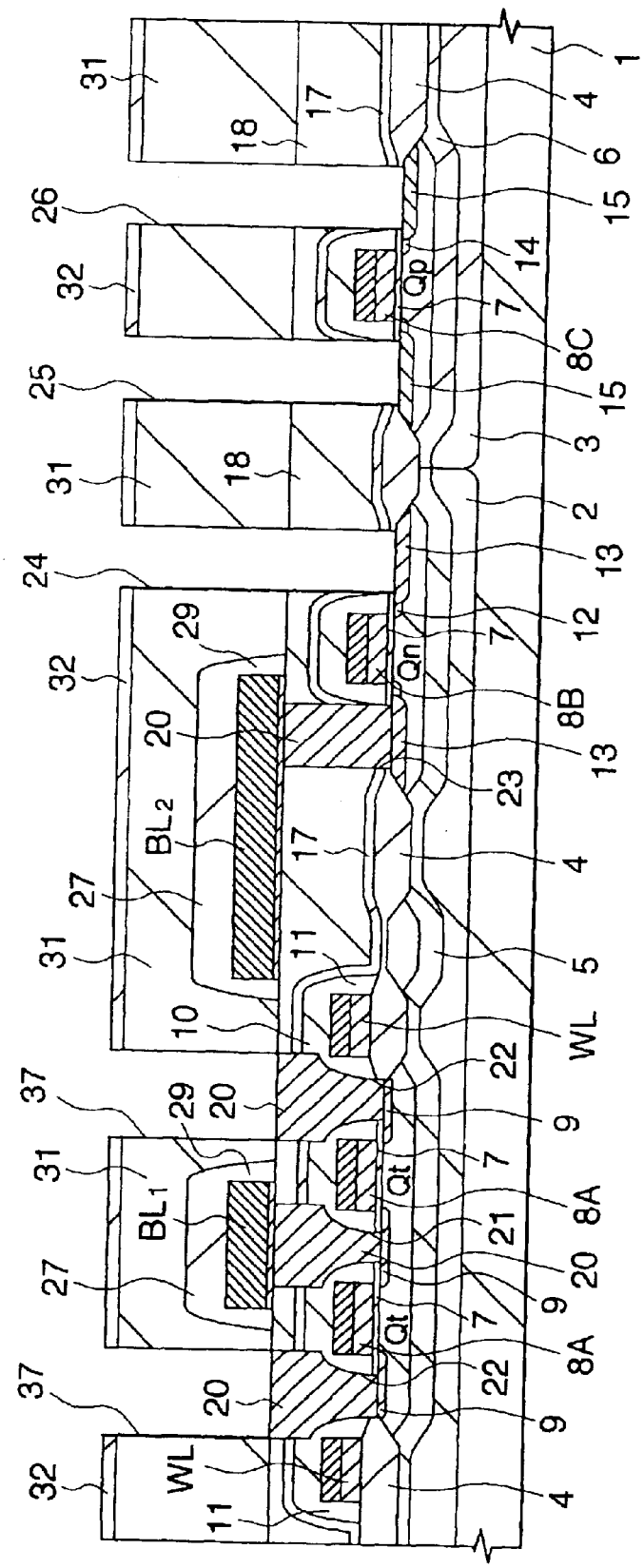

As shown in FIG. 44, the silicon oxide film 32 and the SOG film 31 are etched using a photoresist mask to form connection holes 37 above the connection hole 22 which has been formed on the other of the source region and the drain region (i.e. the n-type semiconductor region 9) of the memory cell selection MISFET Qt. At the same time, the silicon oxide film 32, the SOG film 31, the BPSG film 18, the silicon oxide film 17 and the gate oxide film 7 of the peripheral circuit are etched so that a connection hole 24 is formed, along with a connection hole 25 formed above one of the source region and the drain region (i.e. the $p^+$ semiconductor region 15) of the p channel-type MISFET Qp and a connection hole 26 formed above the other region (i.e. the $p^+$ semiconductor region 15).

Figure 45:
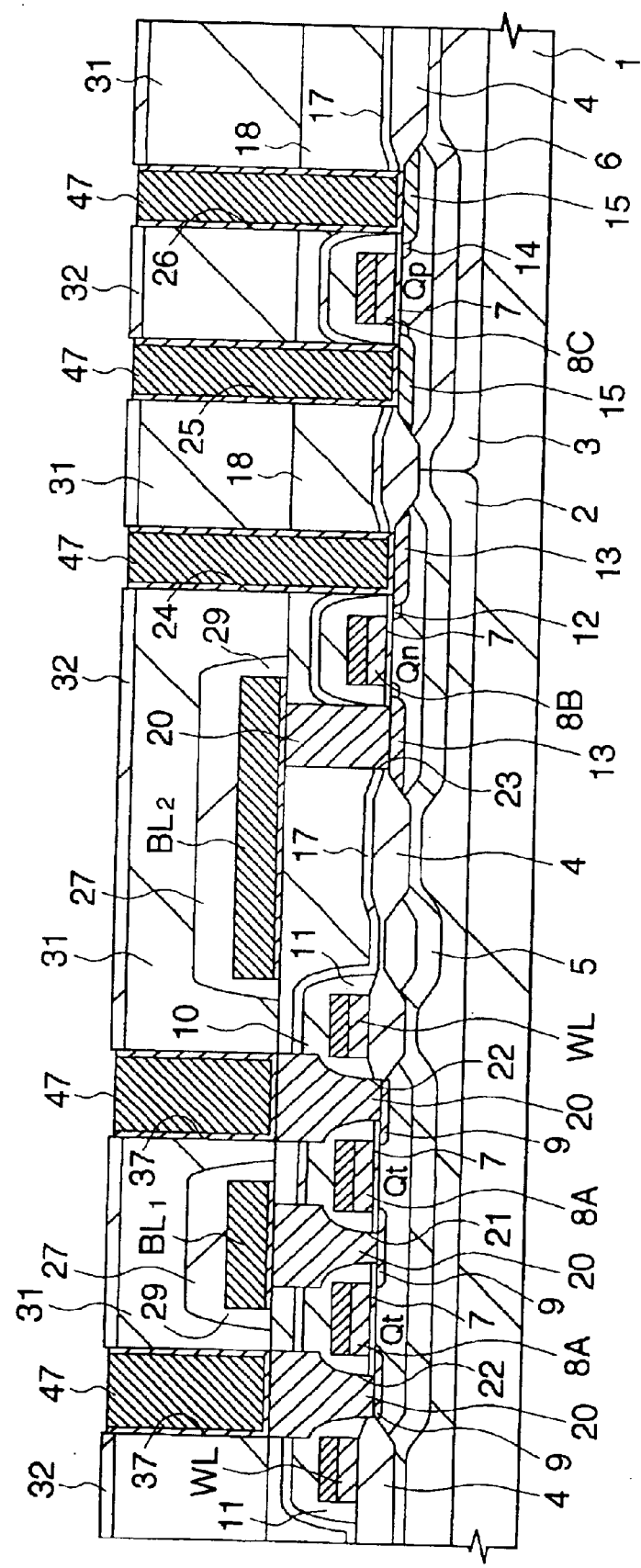
Figure 46:
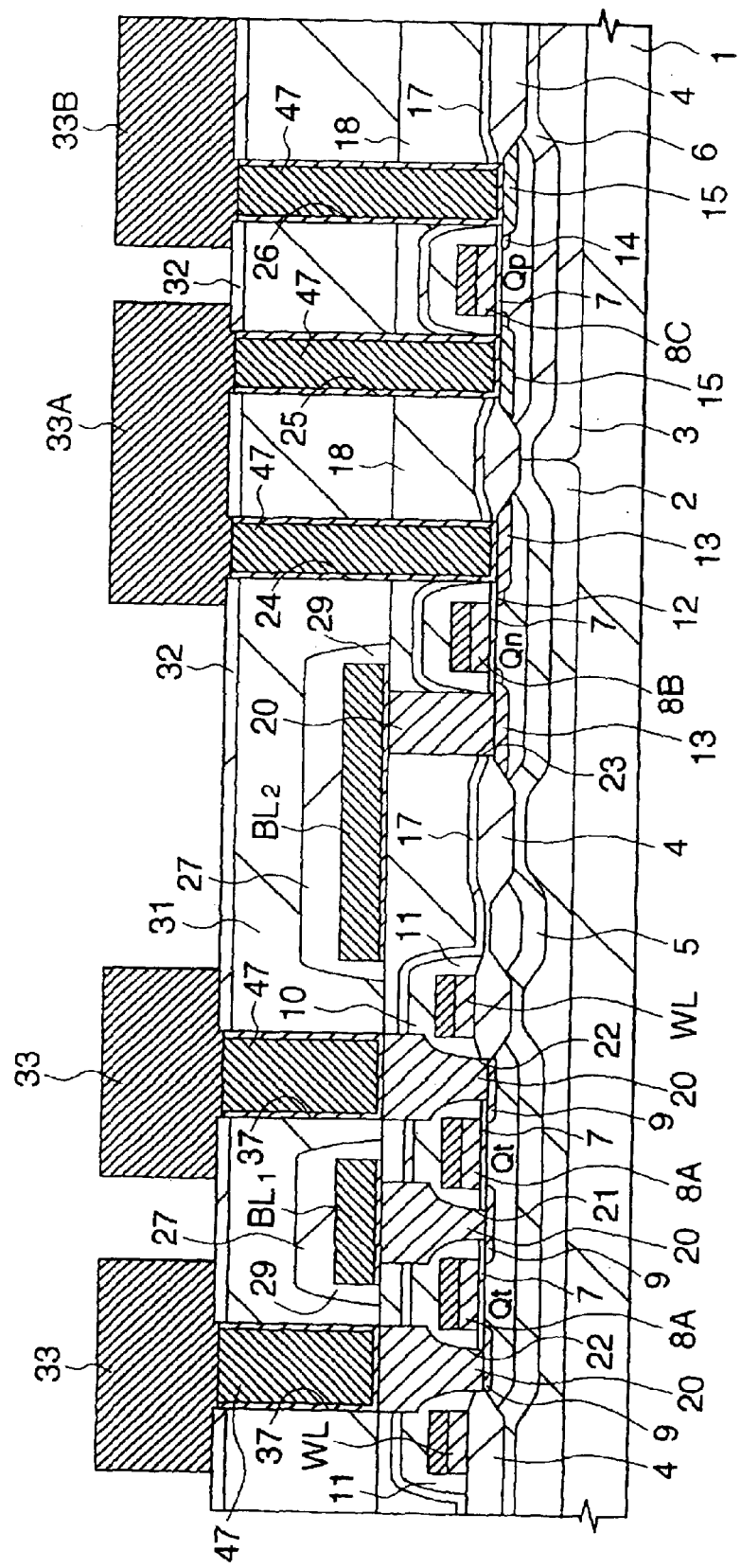

As shown in FIG. 45, a plug 47 made of a builtup film of a TiN film and a W film is filled in the connection holes 37, 24, 25 and 26. A storage electrode 33 of an information storage capacitor C is formed on the connection hole 37 as shown in FIG. 46. At the same time, first interconnection layers 33A, 33B of the peripheral circuit are formed. The storage electrode 33 and the interconnections 33A, 33B are, respectively, formed of a low resistance conductor film similar to the storage electrode 33 of Embodiment 1.

Figure 47:
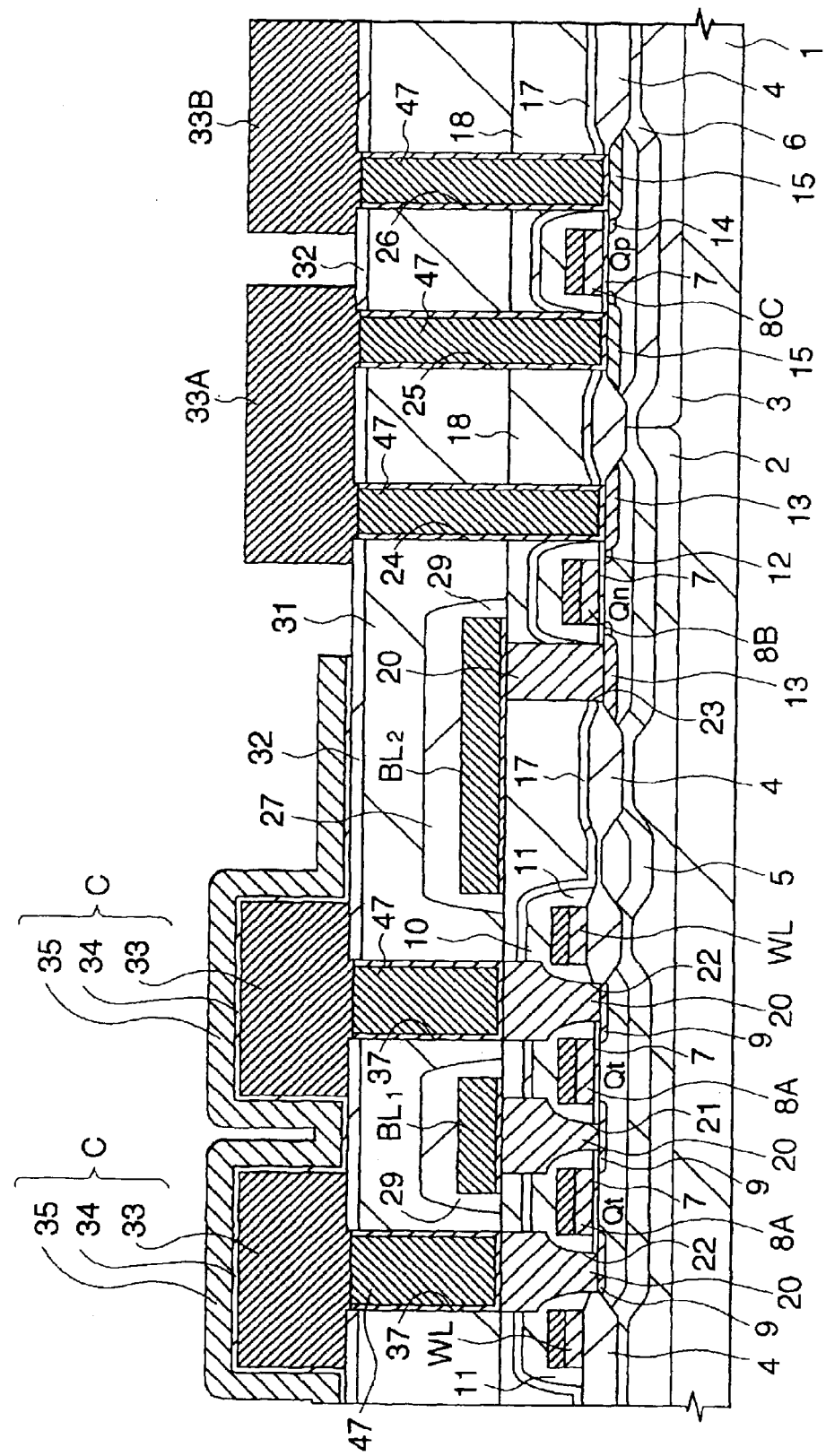
Figure 48:
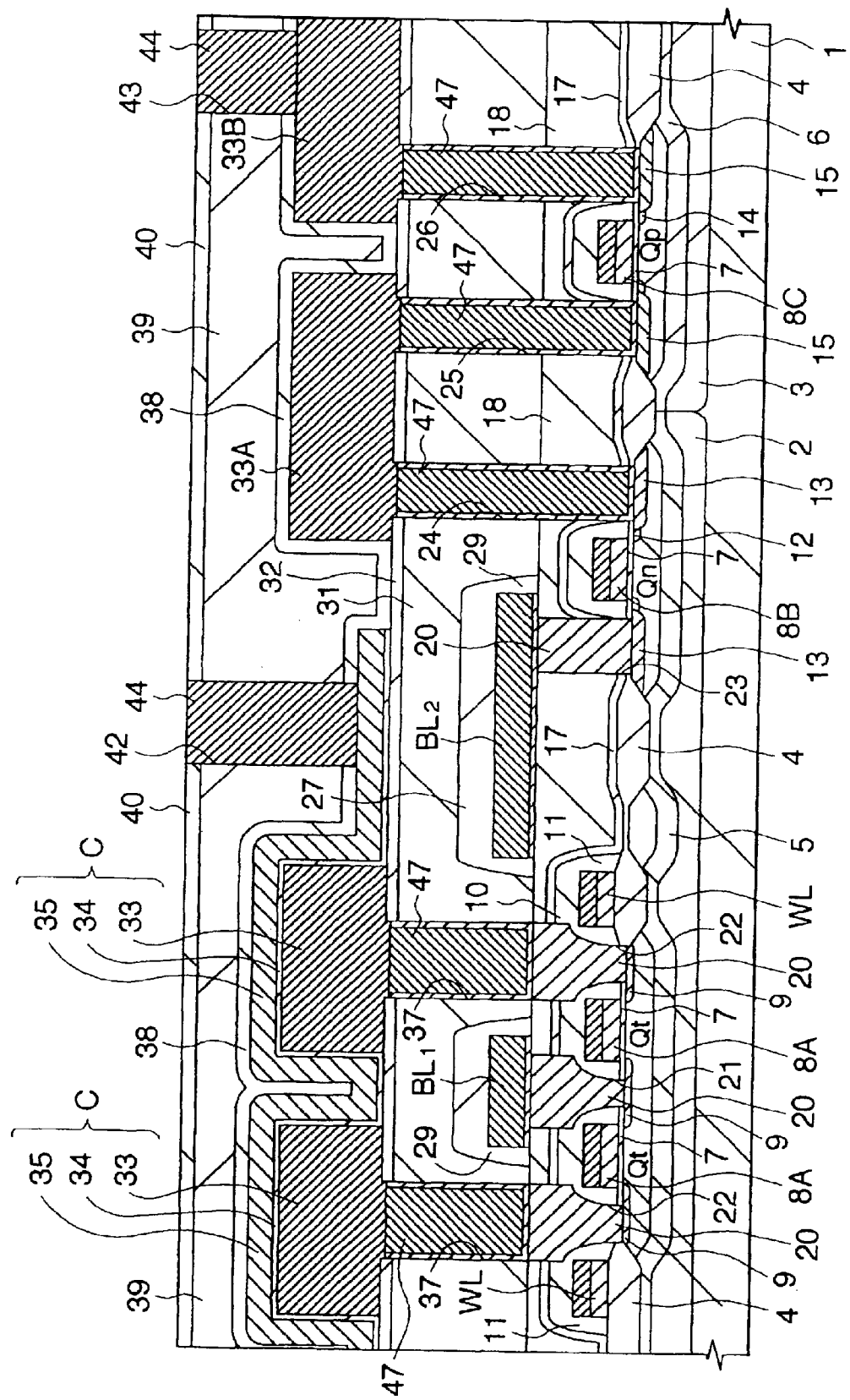

As shown in FIG. 47, a capacitance insulating film 33 and a plate electrode 35 are formed on the storage electrode 33 to form an information storage capacitor C. A silicon oxide film 38 is deposited over the information storage capacitor C according to a CVD method as shown in FIG. 48, followed by spin coating of an SOG film 39 on the film 38 and further deposition of a silicon oxide film 40 by a CVD method. Subsequently, using a photoresist mask, the insulating films (i.e. the silicon oxide film 40, the SOG film 39 and the silicon oxide 38) over the plate electrode 35 of the information storage capacitor C are etched to form a connection hole 42. Simultaneously, the insulating films (i.e. the silicon oxide film 40, the SOG film 39 and the silicon oxide 38) over the first interconnection layer 33B of the peripheral circuit are etched to form a connection hole 43. A tungsten plug 44 is, respectively, filled in the connection holes 42, 43 as shown.

Figure 49:
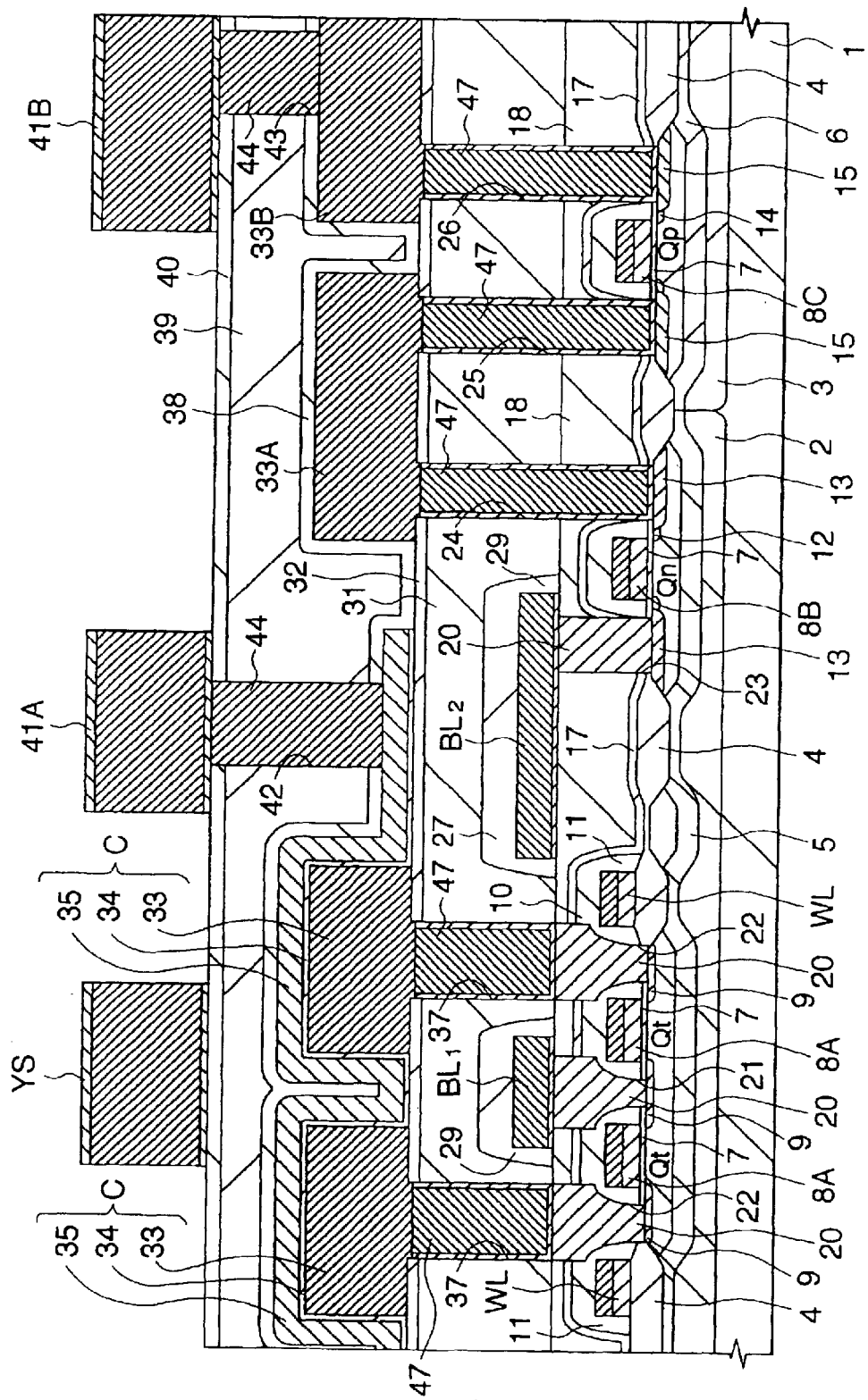

As shown in FIG. 49, a Y select line YS and second interconnection layers 41A, 41B of the peripheral circuit are formed on the silicon oxide 40. The Y select line YS and the interconnections 41A, 41B are made of a low resistance conductor film as used for the Y select line YS and the interconnections 41A, 41B in Embodiment 1, and are made, for example, of a builtup film of a TiN film, an Al alloy film and a TiN film, or a builtup film of a TiN film and a Cu film.

According to the above method, the storage electrode 33 of the capacitor C is made of a low resistance conductor film with its sheet resistance being 2 Ω/□ or below. This makes it possible to form the interconnections 33A, 33B of the peripheral circuit simultaneously with the formation of the storage electrode 33. Thus, an additional step of forming the interconnections of the peripheral circuit is not necessary.

In this embodiment of the invention, although the first interconnection layers 33A, 33B of the peripheral circuit are formed simultaneously with the formation of the storage electrode of the capacitor C, one step of forming the interconnections of the peripheral circuit can be further reduced if the following procedures are used. More particularly, the first interconnection layers of the peripheral circuit are formed simultaneously with the formation of the gate electrodes 8A (the word lines WL) and the gate electrodes 8B, 8C, the second interconnection layer of the peripheral circuit is formed simultaneously with the formation of the storage electrode of the capacitor C, and the third interconnection layer of the peripheral circuit is formed along with the formation of Y select line YS.

(Embodiment 5)

The method of manufacturing a DRAM according to this embodiment of the invention includes the formation of interconnections of a peripheral circuit simultaneously with the formation of a plate electrode (an upper electrode) of an information storage capacitor C.

Figure 50:
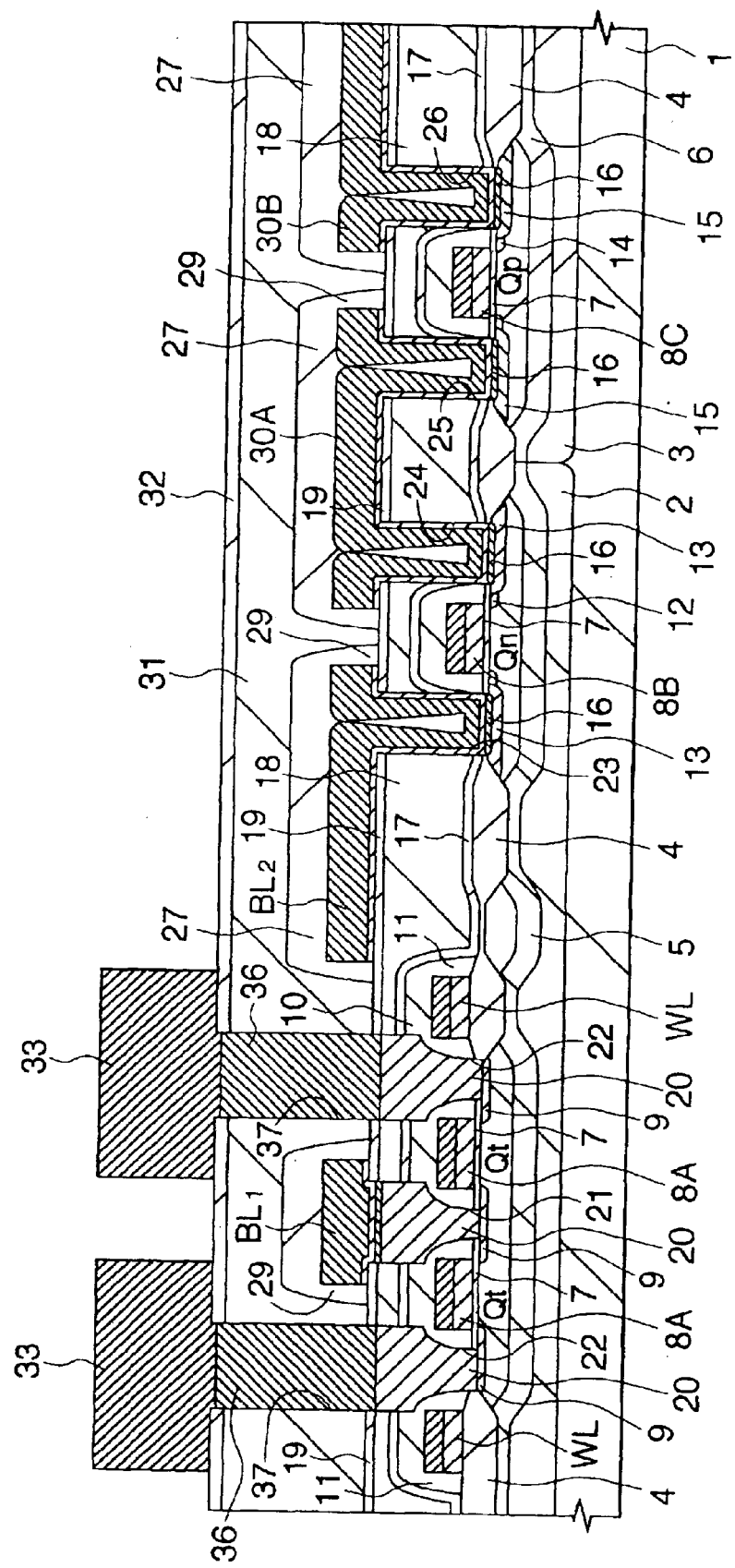
FIGS. 50 to 55 are, respectively, a sectional view illustrating a method for manufacturing a DRAM according to Embodiment 5 of the invention.

For the manufacture of this type of DRAM, as shown in FIG. 50, memory cell selection MISFET s Qt and an n channel-type MISFET Qn and a p channel-type MISFET Qp of a peripheral circuit are formed in the same manner as in Embodiment 1, followed by simultaneous formation of bit lines $BL_1$, $BL_2$ and first interconnection layers 30A, 30B thereover. A storage electrode 33 of an information storage capacitor C is further formed over the bit lines $BL_1$, $BL_2$. The gate electrode 8A (the word line WL) and the gate electrodes 8B, 8C are formed of such a low resistance conductor film as used for the gate electrode 8A (the word line WL) and the gate electrodes 8B, 8C in Embodiment 1, with their sheet resistance being 2 Ω/□ or below.

Figure 51:
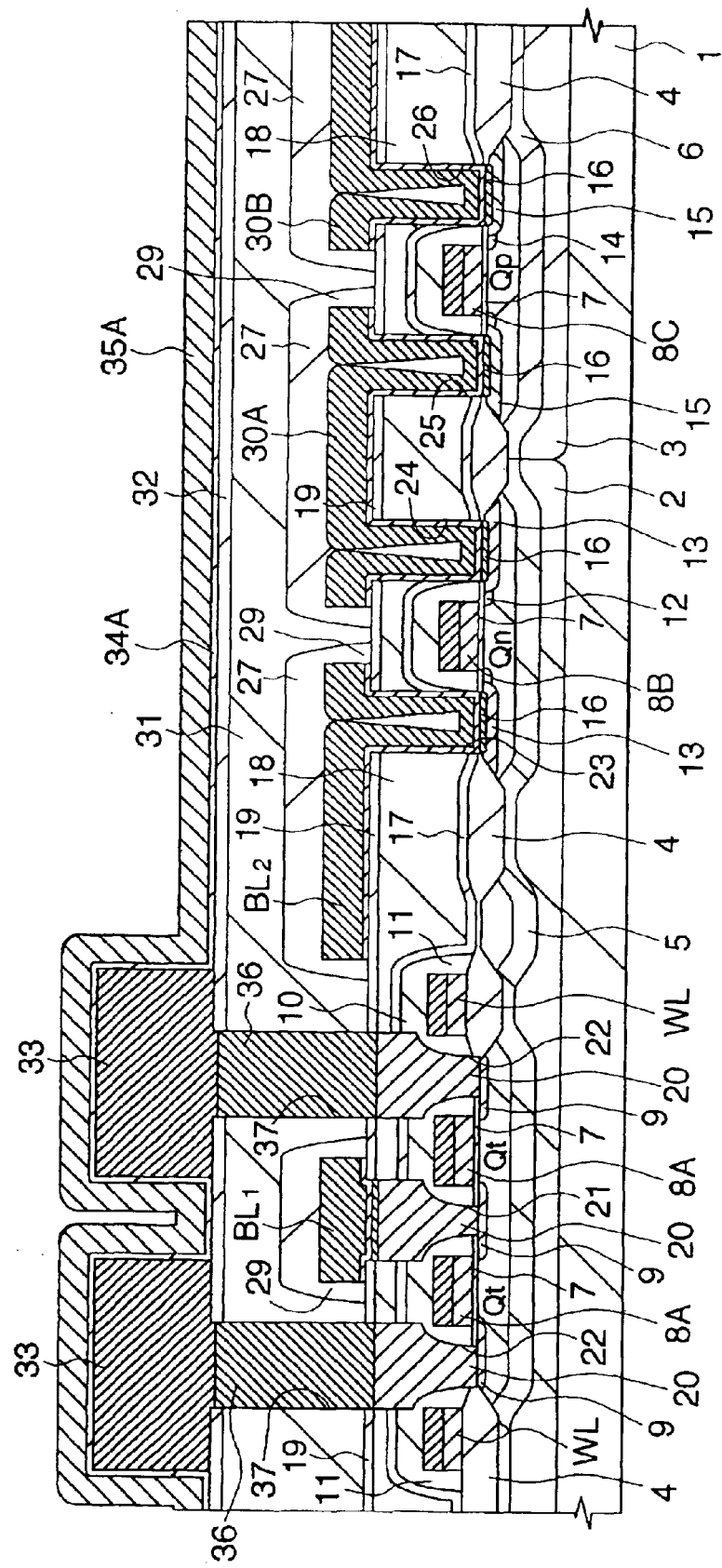
Figure 52:
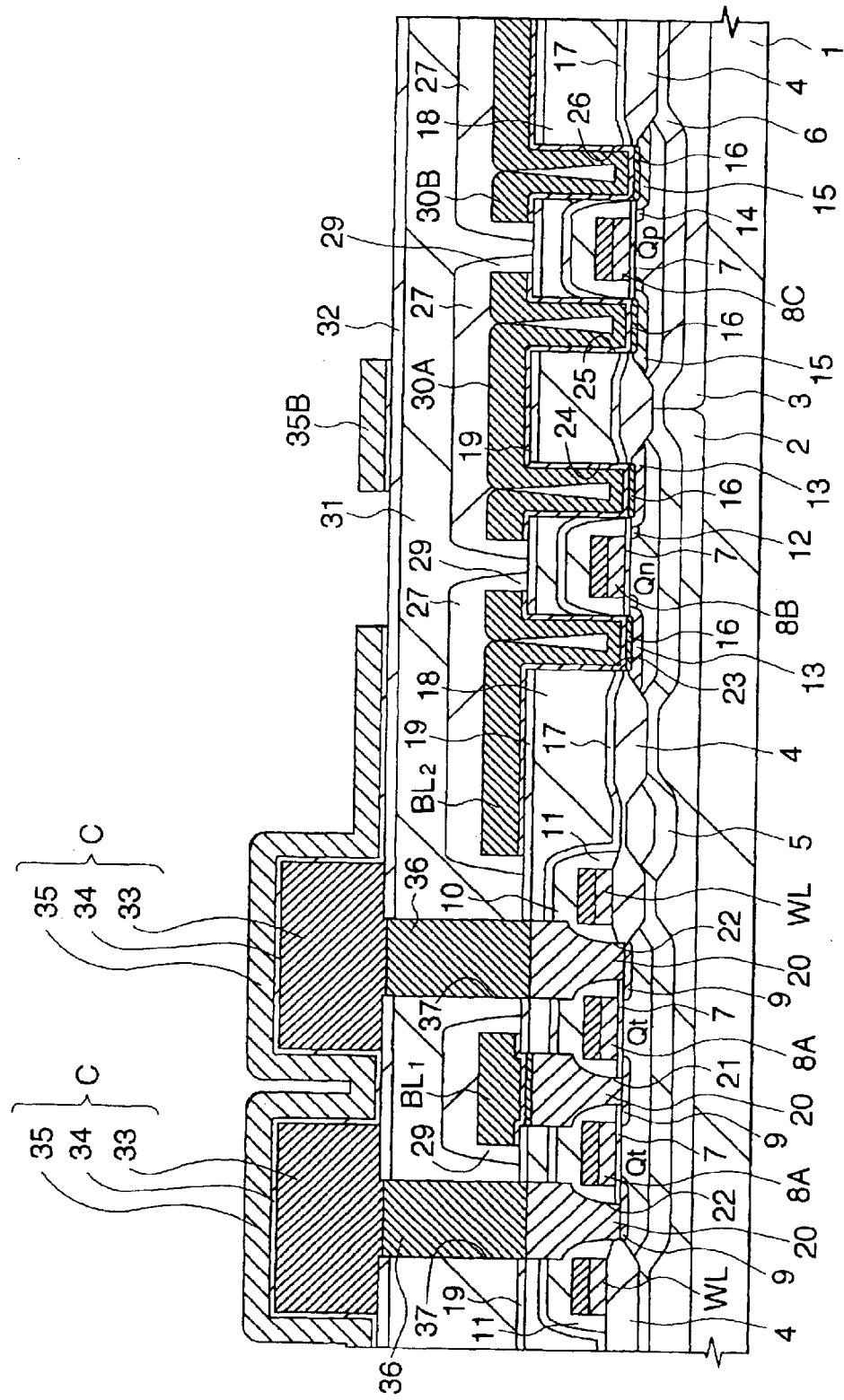

As shown in FIG. 51, a tantalum oxide film 34 is deposited over the storage electrode 33 according to a plasma CVD, followed by further deposition of a TiN film by a CVD. As shown in FIG. 52, these films are then patterned by etching via a photoresist mask to form a capacitance insulating film 34 and a plate electrode 35 on the respective storage electrode 33, thereby forming information storage capacitors C. At the same time, the tantalum film 34A and the TiN film 35A of the peripheral circuit are also patterned to form a second interconnection layer 35B of the peripheral circuit.

Since the second interconnection layer of the peripheral circuit is constituted of a double-layer film wherein the conductive TiN film 35A is formed on the insulating tantalum oxide film 34A, it cannot be connected directly to the first interconnection layer (30B) of the peripheral circuit.

Figure 53:
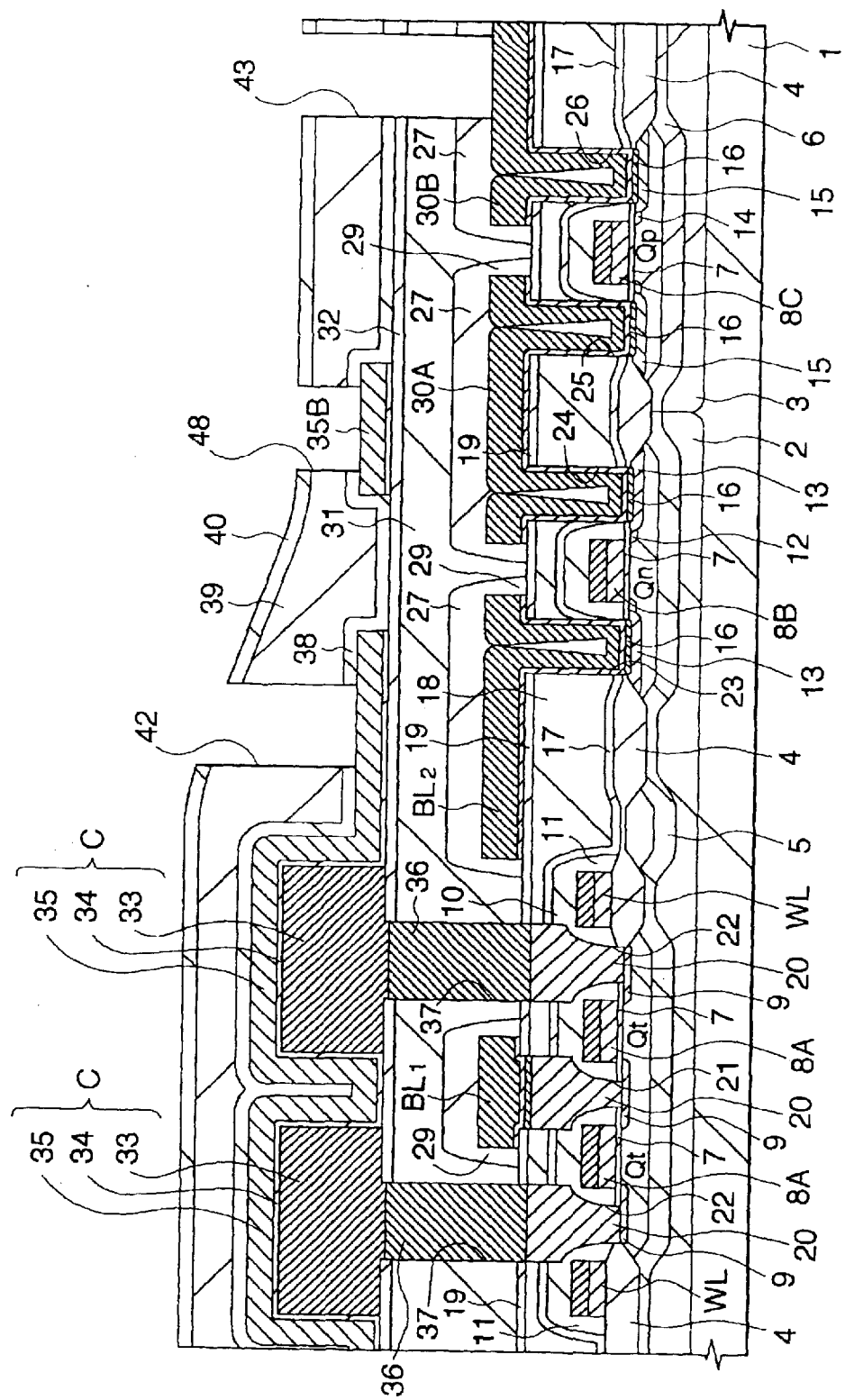

As shown in FIG. 53, a silicon oxide film 38 is deposited on the capacitor C and the interconnection 35B by a CVD method, followed by spin coating of an SOG film 39 and further deposition of a silicon oxide film 40 by a CVD method on the film 38 in this order. Using a photoresist mask, the insulating films (i.e. the silicon oxide film 40, the SOG film 39 and the silicon oxide film 38) formed on the plate electrode 35 of the capacitor C are etched to form a connection hole 42. At the same time, the insulating films (i.e. the silicon oxide film 40, the SOG film 39 and the silicon oxide film 38) formed on the interconnection 35A of the peripheral circuit are etched to form a connection hole 48. Moreover, the insulating films (i.e. the silicon oxide film 40, the SOG film 39, the silicon oxide film 38, the silicon oxide film 32, the SOG film 31 and the silicon nitride film 27) formed over the first interconnection layer 30B of the peripheral circuit are simultaneously etched to form a connection hole 43.

Figure 54:
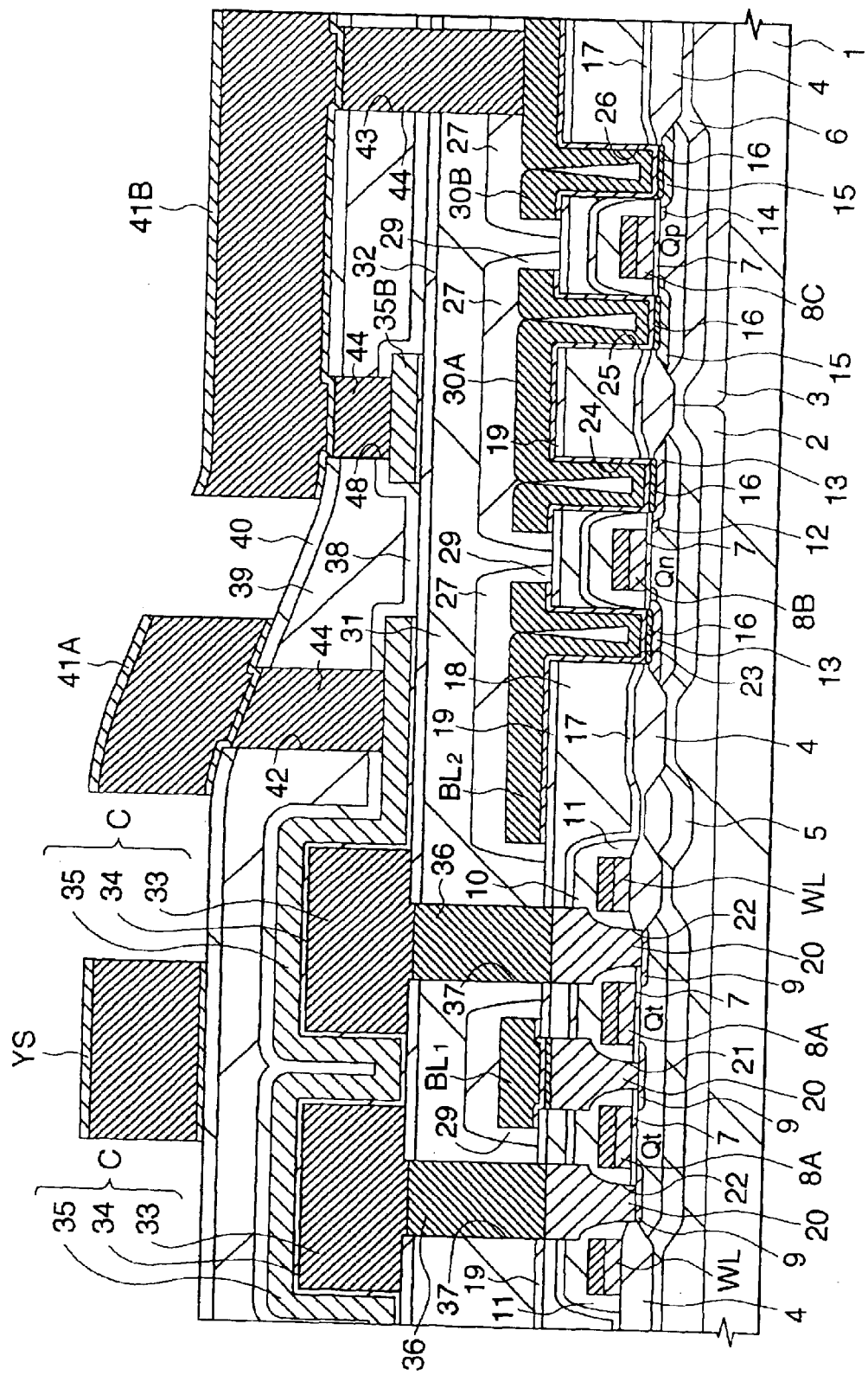

As shown in FIG. 54, a W plug 44 is, respectively, filled in the connection holes 42, 43 and 48, after which a Y select line YS and third interconnection layers 41A, 41B of the peripheral circuit are formed on the silicon oxide film 40. The second interconnection layer of the peripheral circuit is electrically connected via the third interconnection layer 41B to the first interconnection layer 30B.

According to this manufacturing method, the first interconnection layers 30A, 30B of the peripheral circuit are simultaneously formed during the step of forming the bit lines $BL_1$, $BL_2$. The second interconnection layer 35B of the peripheral circuit is formed during the step of forming the plate electrode 35 of the capacitor C, and the third interconnection layer is simultaneously formed during the step of forming the Y select line. Thus, the two steps of forming the interconnections of the peripheral circuit can be reduced.

Figure 55:
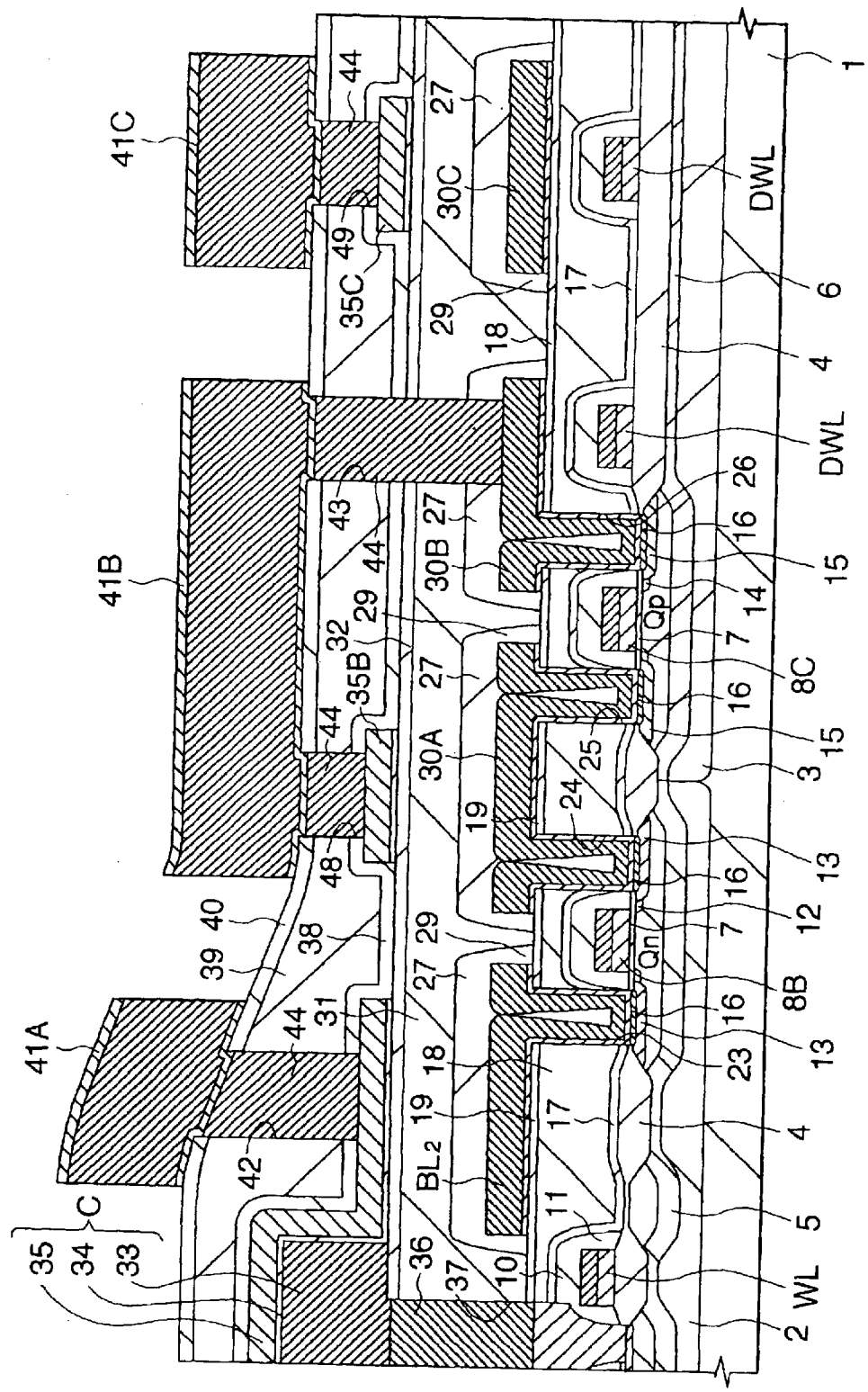

In the step of forming the connection holes 42, 43 and 48 (FIG. 53), the insulating films formed over the interconnection 30B is much thicker than the insulating films over the capacitor C and over the interconnection 35B. Hence, there is the great possibility that the plate electrode 35 exposed at the bottom of the connection hole 42 and the interconnection 35B exposed at the bottom of the connection hole 48 are etched off. To avoid this, a dummy gate DWL for reducing a step difference which is not employed as an actual gate electrode is provided below the interconnection 30B as shown in FIG. 55. By this, the aspect ratio of the connection hole comes close to those of the connection holes 42, 48, thereby preventing the inconvenience of etching off the plate electrode 35 at the bottom of the connection hole 42 and the interconnection 35B at the bottom of the connection hole 48. As shown in FIG. 55, a dummy interconnection 30C which is not actually used as an interconnection and is electrically floating may be formed below the second interconnection layer 35C electrically connected to the third interconnection layer 41C through the connection hole 49. The dummy interconnection 30C is formed simultaneously with the formation of the bit lines $BL_1$, $BL_2$ and the first interconnection layers 30A, 30B of the peripheral circuit. If the interconnection 35C is etched off at the bottom of the connection hole 49, the lower dummy interconnection 30C serves as a stopper for etching. Thus, the connection hole 49 cannot break through up to the substrate. Moreover, if a dummy gate DWL is formed below the dummy interconnection 30C, the inconvenient breaking-through of the connection hole 49 to the substrate is more reliably prevented. Thus, it is effective that since the interconnection 35 cannot be formed as thick, such a dummy interconnection 30C and/or a dummy gate DWL as set out above is formed below the connection hole 49 or as surrounding the connection hole 49 therewith as viewed on the plane.

(Embodiment 6)

The method for manufacturing a DRAM according to this embodiment includes simultaneous formation of the interconnections of the peripheral circuit in the step of forming the bit lines $BL_1$, $BL_2$ and in the step of forming the plate electrode of the information storage capacitor C, like Embodiment 5.

Figure 56:
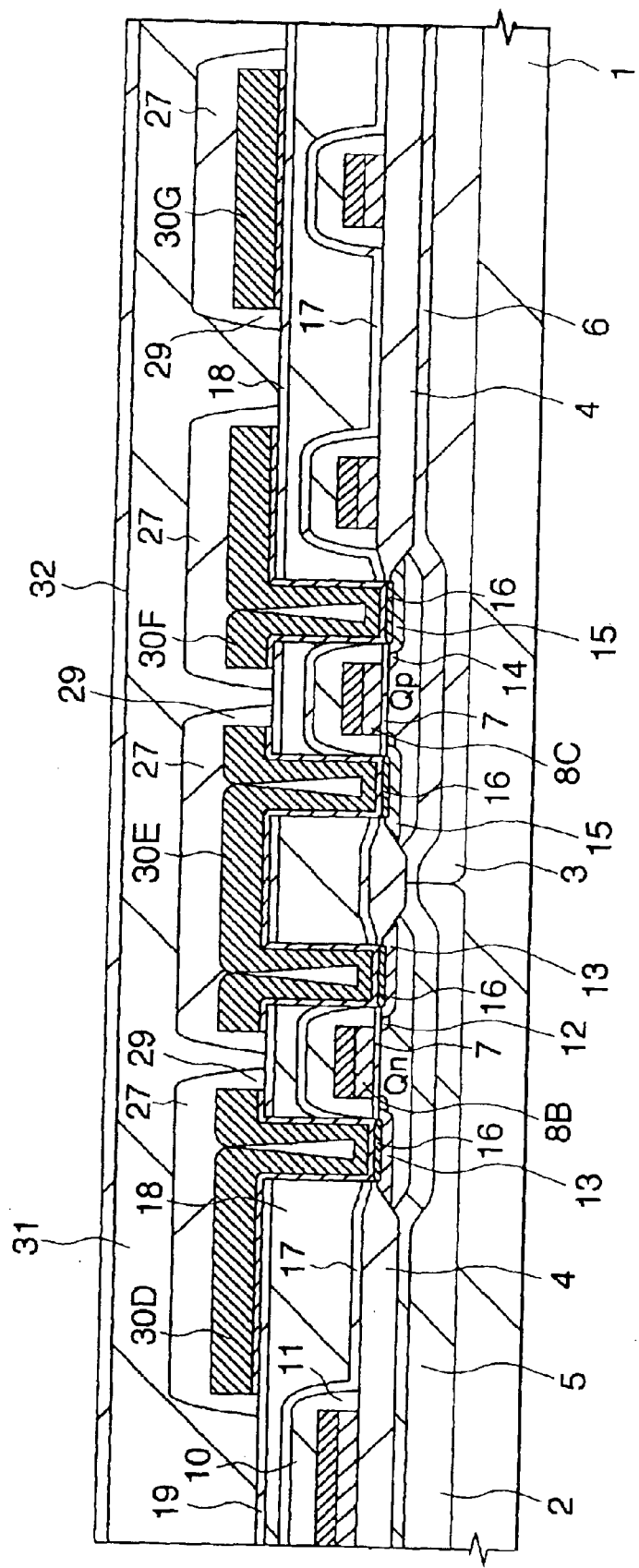
FIGS. 56 to 61 are, respectively, a sectional view illustrating a method for manufacturing a DRAM according to Embodiment 6 of the invention.

In order to manufacture the DRAM, the memory cell selection MISFET Qt and the n channel MISFET Qn and the p channel-type MISFET Qp are formed in the same manner as in Embodiment 5, followed by formation of bit lines $BL_1$, $BL_2$ thereover (FIG. 50). At the time of the formation of the bit lines, the first interconnection layers 30D to 30G of the peripheral circuit are simultaneously formed as shown in FIG. 56. The bit lines $BL_1$, $BL_2$ and the interconnections 30D to 30G are formed of a low resistance conductor film such as has been set out hereinbefore, with their sheet resistance being 2 $\Omega/\square$ or below.

Figure 57:
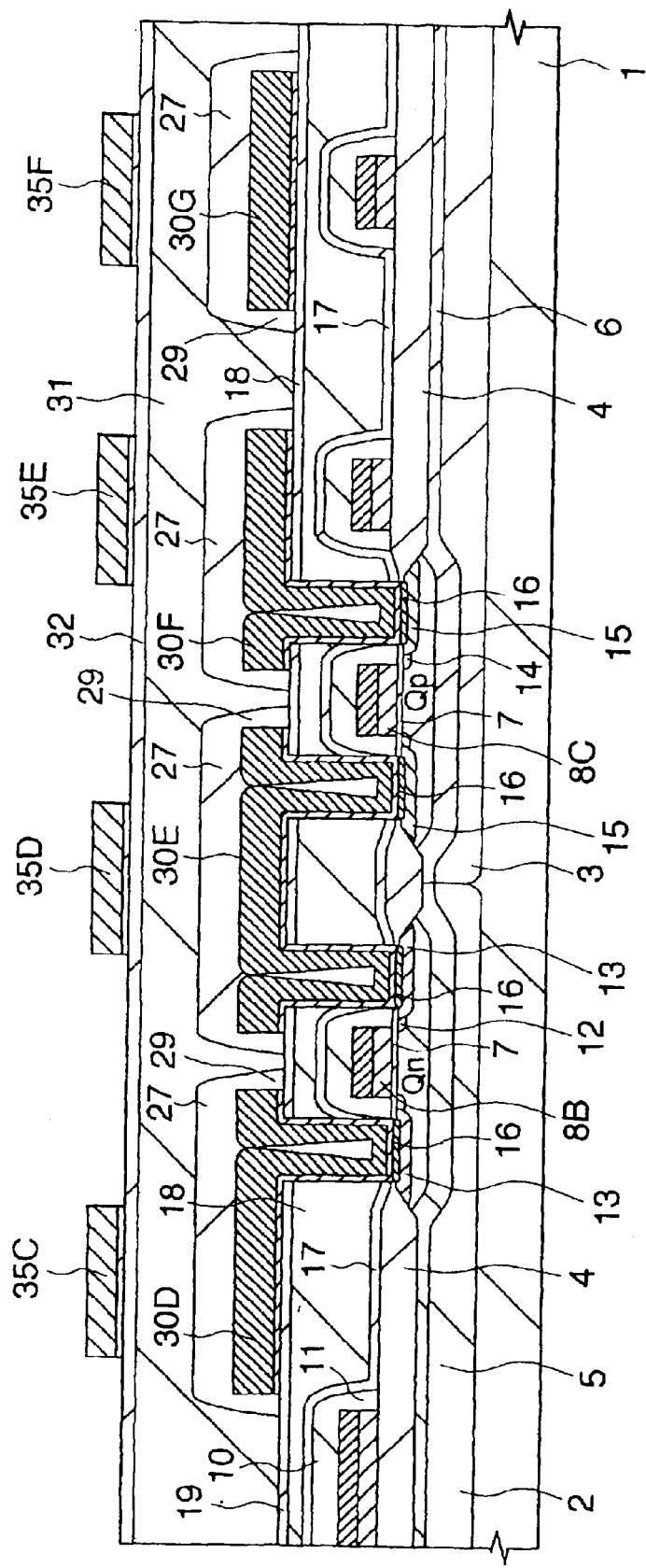

As shown in FIG. 57, second interconnection layers 35C to 35F of the peripheral circuit are, respectively, formed over the first interconnection layers 30D to 30G of the peripheral circuit as shown in FIG. 57. The interconnections 35C to 35F are formed simultaneously with the formation of the capacitance insulating film 34 and the plate electrode 35 of the information storage capacitor C, with their sheet resistance being 2 $\Omega/\square$ or below. The interconnection 35C is positioned just above the first interconnection layer 30D, and the interconnection 35D is positioned just above the first interconnection layer 30E. The interconnection 35E is formed just above the first interconnection layer 30F, and the interconnection 35F is formed just above the first interconnection layer 30G.

Figure 58:
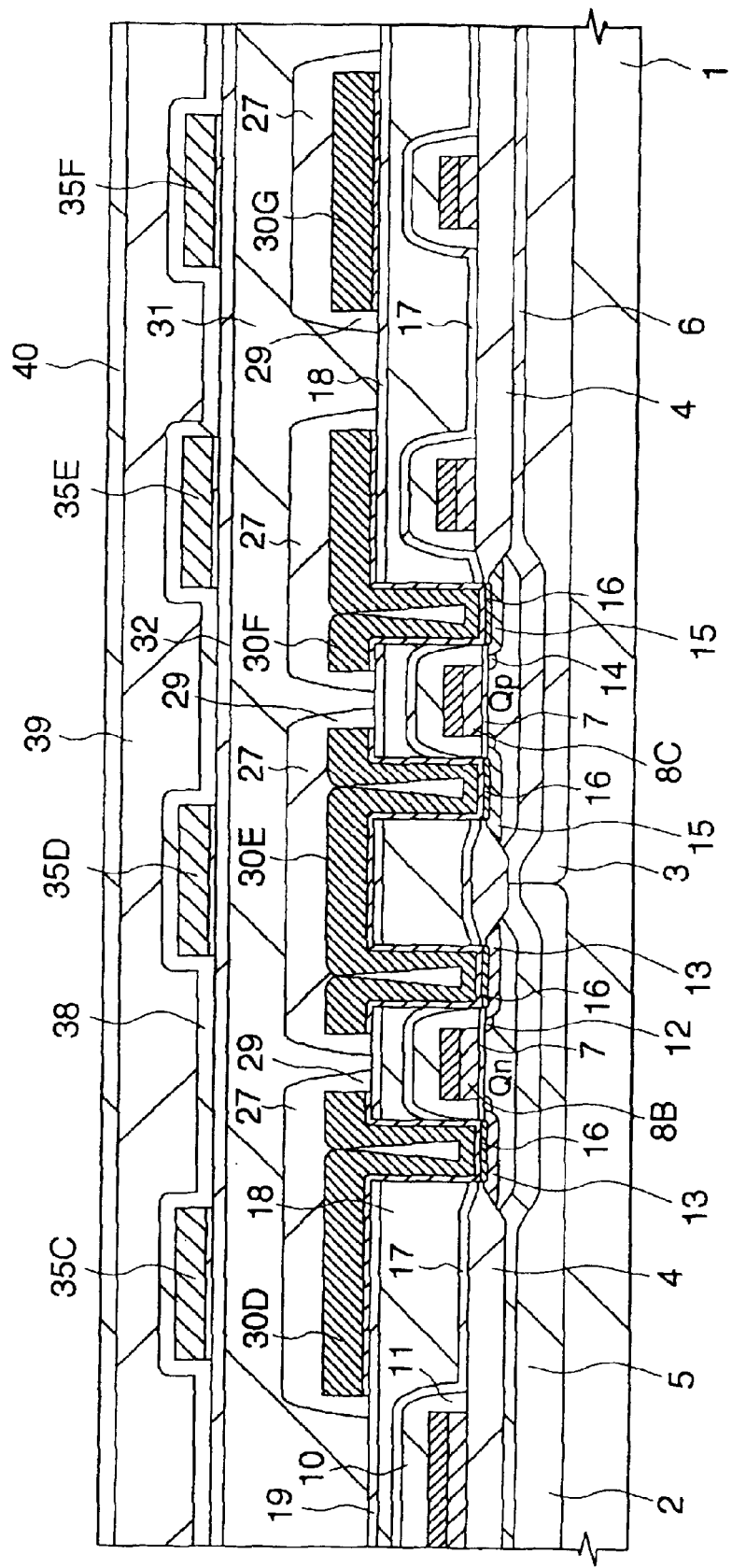
Figure 59:
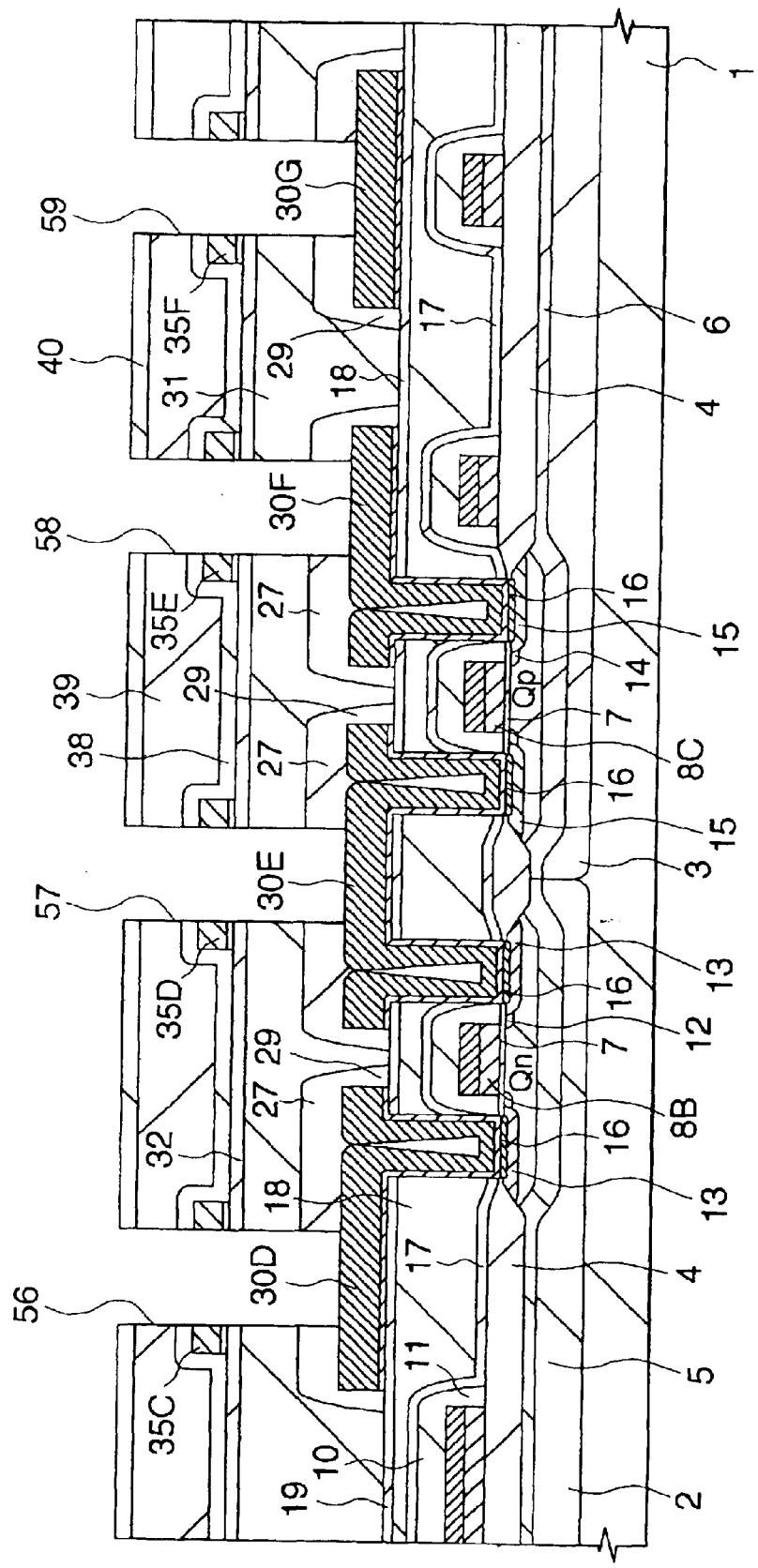

As shown in FIG. 58, a silicon oxide film 38 is deposited over the interconnections 35C to 35F according to a CVD method, followed by spin coating of an SOG film 39 thereon and further deposition of a silicon oxide film 40 by a CVD method. Thereafter, as shown in FIG. 59, the insulating films formed on the first interconnection layers 30D to 30G of the peripheral circuit and the second interconnection layers 35C to 35F are selectively etched by use of a photoresist mask. As a consequence, there are simultaneously formed a connection hole 56 arriving at the first interconnection layer 30D through the second interconnection layer 35C, a connection hole 57 arriving at the first interconnection layer 30E through the second interconnection layer 35D, a connection hole 58 arriving at the first interconnection layer 30F through the second interconnection layer 35E, and a connection hole 59 arriving at the first interconnection layer 30G through the second interconnection layer 35F. In this etching procedure, the types of materials to be etched and the thicknesses of the films are substantially the same for all the connection holes 56 to 59, neither permitting a non-etched residue to be left in the inside of any of the connection holes 56 to 59, nor causing any of the first interconnection layers 30D to 30G to be etched off excessively.

Figure 60:
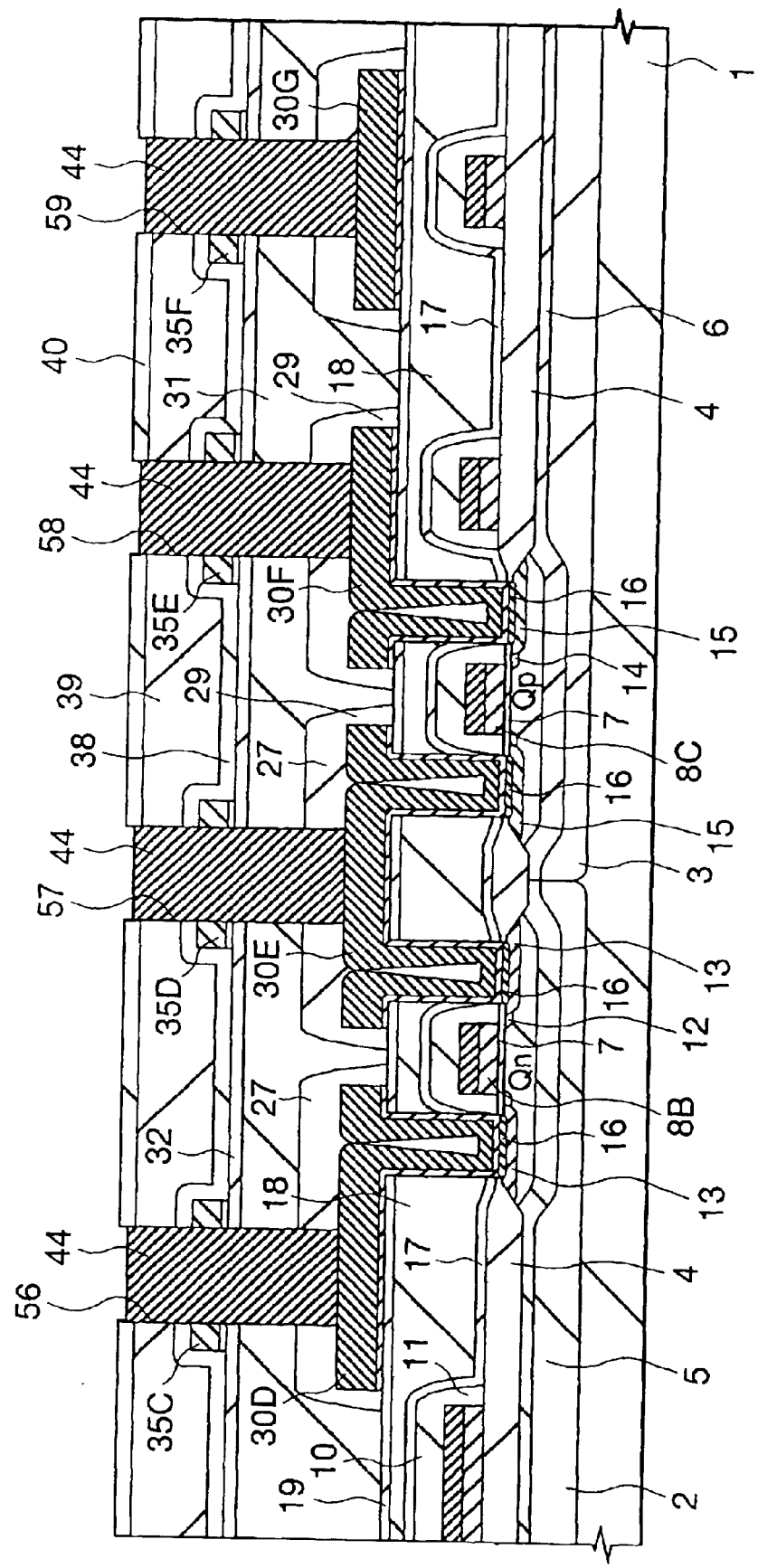
Figure 61:
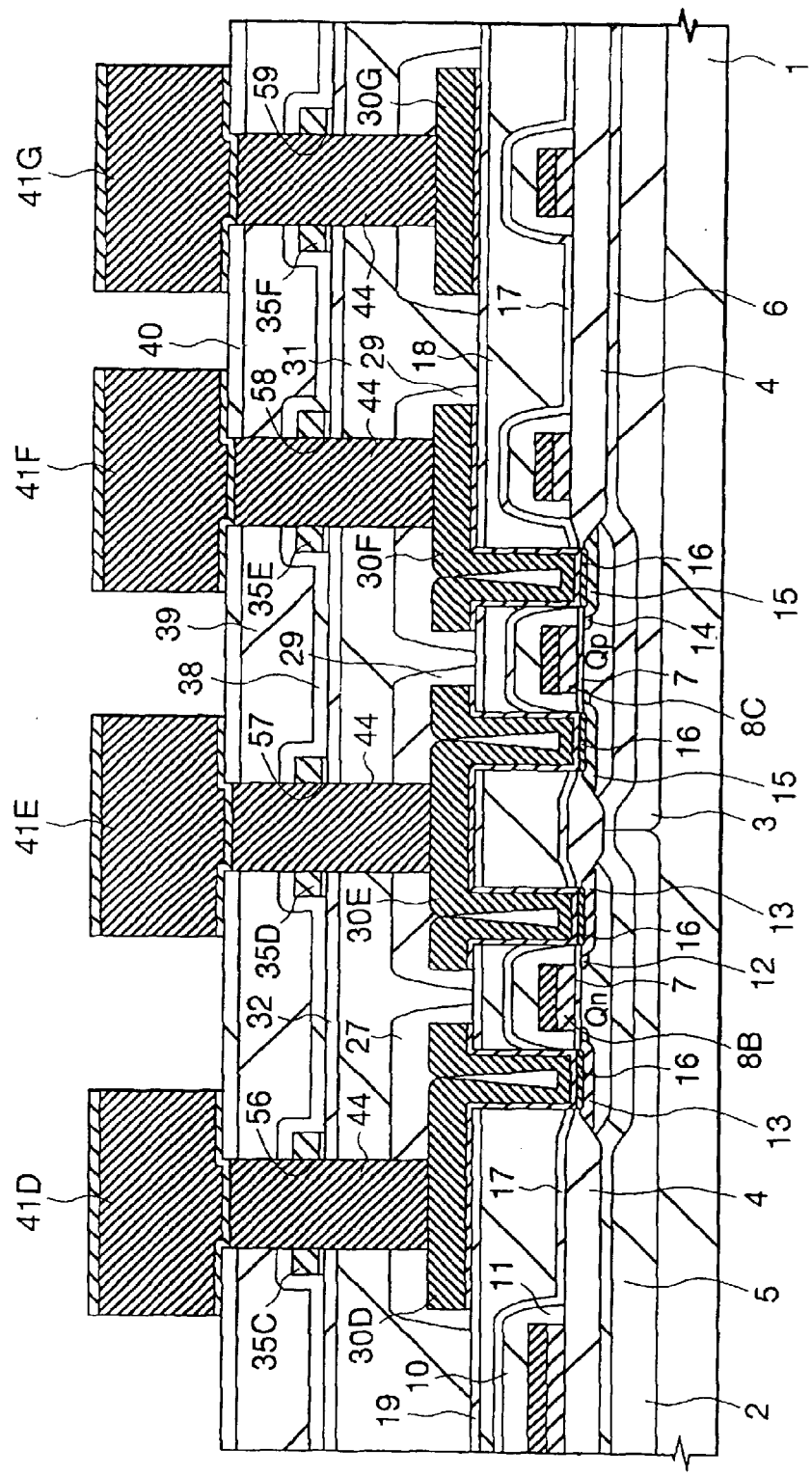

As shown in FIG. 60, a tungsten plug 44 is embedded in each of the connection holes 56 to 59. Third interconnection layers 41D to 41G of the peripheral circuit are formed on the silicon oxide film 40 as shown in FIG. 61. The structure at the left side of FIG. 61 is a structure of connection between the first interconnection layer 30D and the second interconnection layer 35C. In this structure, the second interconnection layer 35C is electrically connected via the plug 44 formed in the connection hole 56 to the first interconnection layer 30D. In this case, the third interconnection layer 41D is a dummy interconnection which is not actually used and serves as a kind of cap which covers the surface of the interconnection hole 56 over the second interconnection layer 35C. More particularly, when the third interconnection layer is patterned, the third interconnection layer 41D protects the plug 44 from being etched. In this sense, the layer 41D should completely cover the connection hole 56 therewith on a plane.

The second structure as viewed from the left side of FIG. 61 is a structure for connection of the first interconnection layer 30E, the second interconnection layer 35D and the third interconnection layer 41E. In this structure, the third interconnection layer 41E, the second interconnection layer 35D and the first interconnection layer 30E are mutually electrically connected via the plug 44 formed on the connection hole 57. The third interconnection layer 41F is electrically connected to the first interconnection layer 30F via the plug 44 formed in the connection hole 58. In this case, the second interconnection layer 35E is a dummy interconnection which is not actually used as an interconnection. The third interconnection layer 41G is electrically connected to the second interconnection layer 35F via the plug 30G formed in the hole 59. In this case, the first interconnection layer 30G is a dummy interconnection not actually used. The dummy interconnections 41D, 35E and 30G are those interconnections which are not connected to other interconnections in regions other than the portions of the connection holes 56, 58, 59. Of course, the plug 44 is made of any type of conductor materials.

Figure 62:
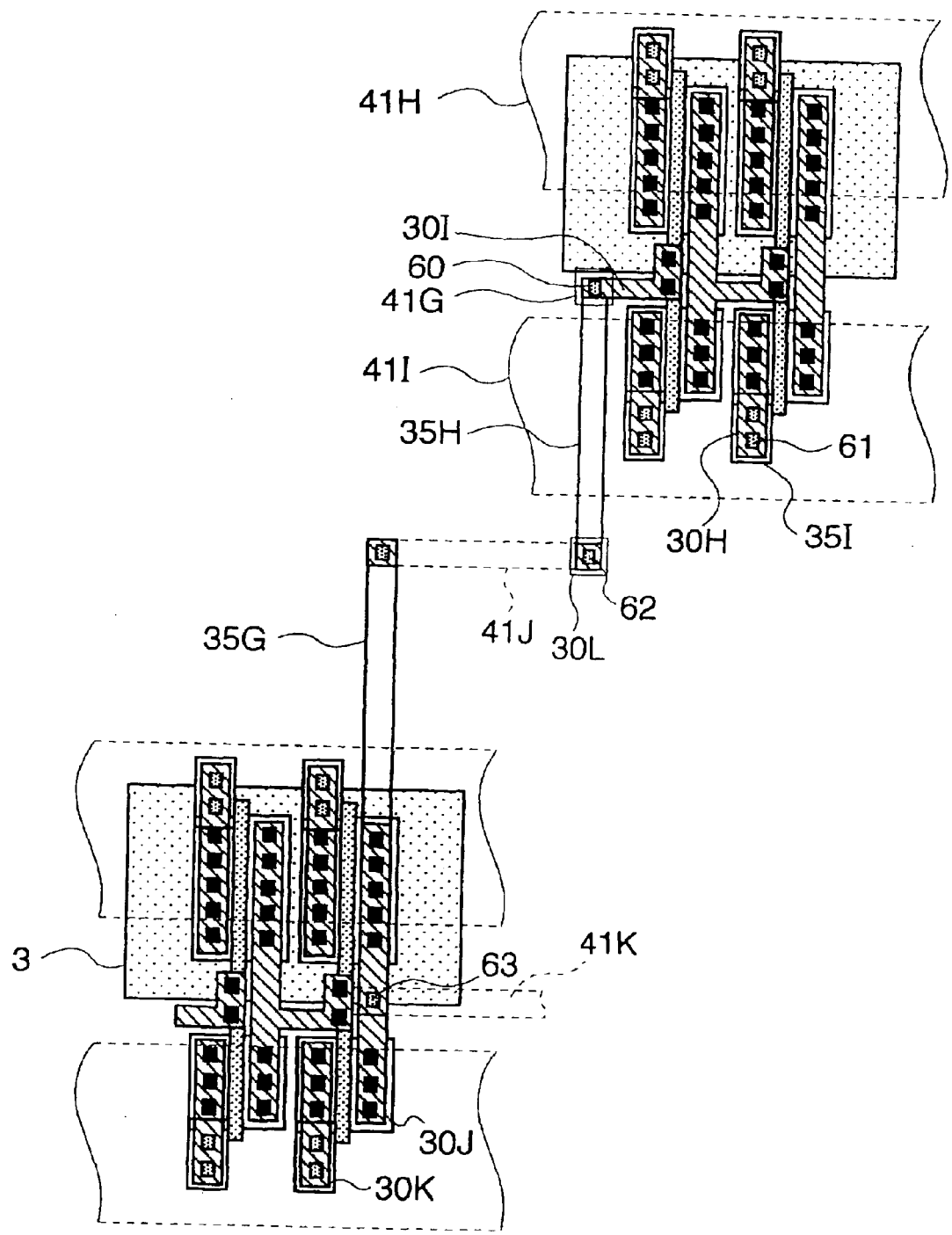
FIG. 62 is a plan view showing the manner of connection among first to third layers of a peripheral circuit of a DRAM according to the Embodiment 6 of the invention.

FIG. 62 is a plan view showing an example of connection of the first to third interconnections of a peripheral circuit. In the figure, interconnections 41H, 41I are third interconnection layers constituting electric power lines, and interconnections 41J, 41K are third interconnection layers constituting signal lines. All the interconnections are formed by patterning from the same layer as a Y select line YS. Interconnections 35G, 35H are second interconnection layers constituting signal lines and are formed by patterning from the same layer as the plate electrode 35 of an information storage capacitor C. Interconnections 30H to 30K are first interconnection layers and are formed by patterning from the same layer as the bit lines $BL_1$, $BL_2$.

In this instance, a third dummy interconnection layer 41G is formed in a connection hole 60 for connection between a second interconnection layer 35H and a first interconnection layer 30I. A second dummy interconnection layer 35I is formed in a connection hole 61 for connection between a third interconnection layer 41I and a first interconnection layer 30H. A first dummy interconnection layer 30L is formed in a connection hole 62 for connection between the third interconnection layer 41J and the Y second interconnection layer 35H. A third interconnection layer 41K, a second interconnection layer 35G and a first interconnection layer 30J are mutually connected via a connection hole 63. It will be noted that the connection holes 60, 61, 62 and 63 are so formed that they arrive at the first interconnection layer prior to the formation of the third interconnection layers.

As will be apparent from FIG. 61, according to the method of this embodiment, there are simultaneously formed by one step the connection hole (56) for electric connection between the second interconnection layer and the first interconnection layer of the peripheral circuit of DRAM, the connection hole (57) for electric connection of the third interconnection layer, the second interconnection layer and the first interconnection layer, the connection hole (58) for electric connection between the third interconnection layer and the first interconnection layer, and the connection hole (59) for electric connection between the third interconnection layer and the second interconnection layer. For the etching, the types of materials for films to be etched and the film thicknesses should be substantially the same for all the connection holes. By this, the connection holes can be formed under substantially the same conditions, ensuring improved reliability of the connections of the interconnections of the peripheral circuit. The second interconnection layers 35C to 35F of the peripheral circuit may be formed simultaneously with the formation of the storage electrode (lower electrode) of the information storage capacitor C.

In the method of this embodiment, although the interconnections of the peripheral circuit are formed simultaneously with the formation of the plate electrode (the upper electrode) of the capacitor C, a resistor element may also be formed at the same time.

Figure 63:
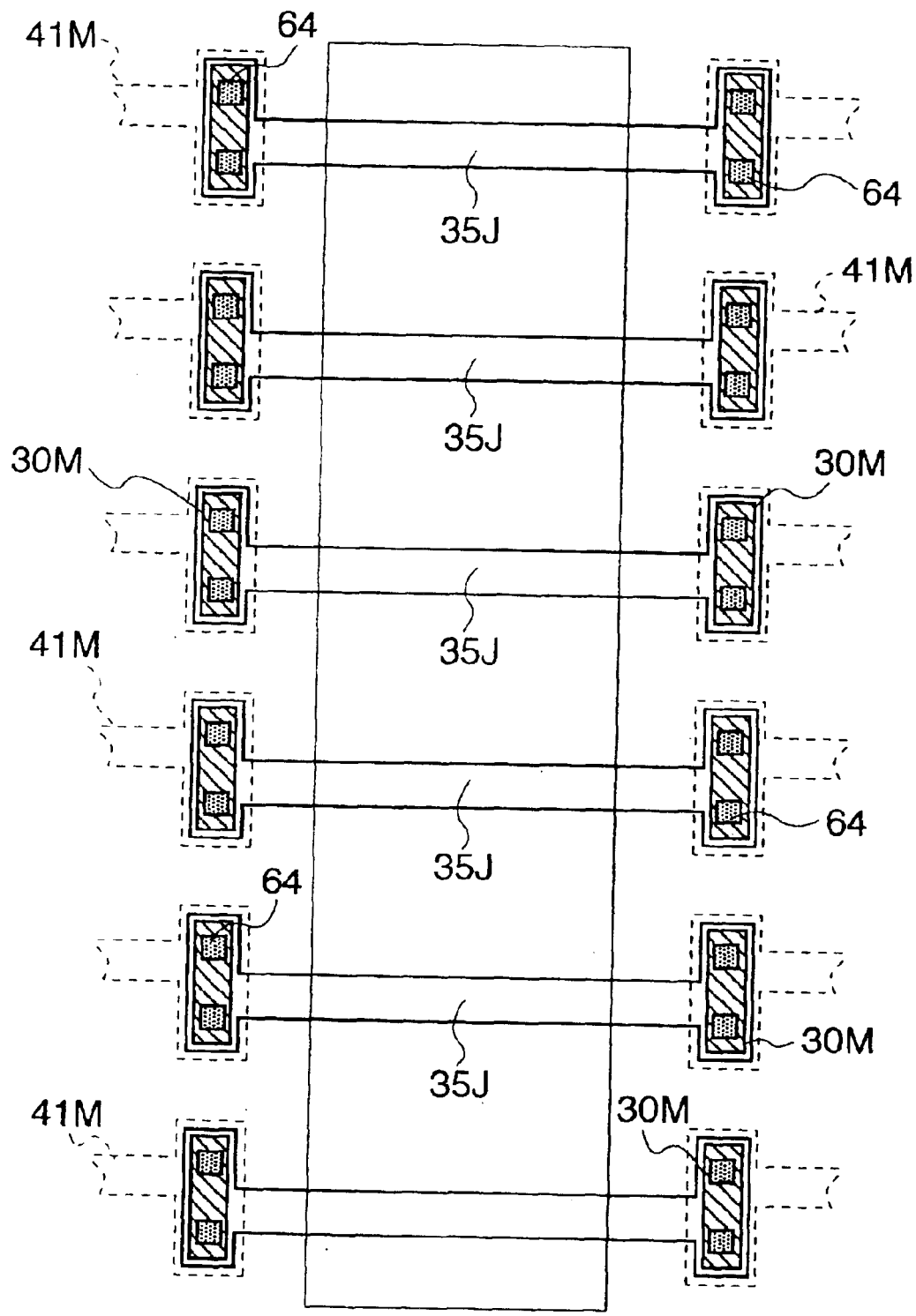
FIG. 63 is a plan view showing a fuse pattern of a redundant circuit of a DRAM according to the Embodiment 6 of the invention.

FIG. 63 shows an example wherein fuses 35J of a redundant circuit which relieve defective bits are formed simultaneously with the formation of the plate electrode and the second interconnection layers of the peripheral circuit. In this instance, each fuse 35J is electrically, connected at ends thereof with third interconnection layers 41M through connection holes 64. At the lower portion of the connection holes, first dummy interconnection layers 30M are formed in order to prevent the connection hole from breaking through the substrate.

The resistor element of the peripheral circuit may be formed simultaneously with the formation of the storage electrode (the lower electrode) of the capacitor C. Alternatively, the resistor element may be formed simultaneously with the formation of the bit lines $BL_1$, $BL_2$.

(Embodiment 7)

Figure 64:
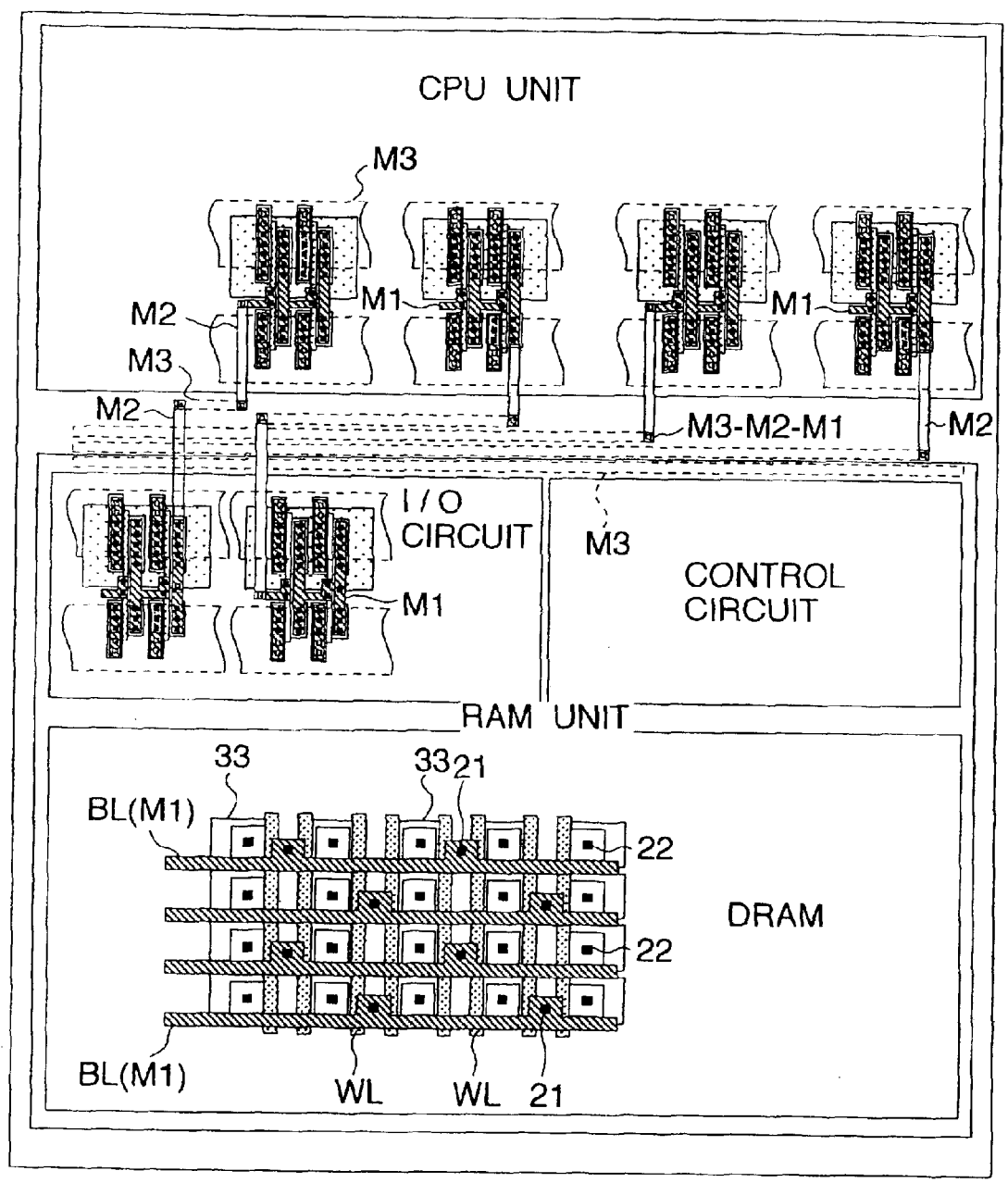
FIG. 64 is a plan view showing the manner of connection among the interconnections of a one chip microcomputer according to the invention.

A DRAM is employed at a RAM portion of a one chip microcomputer forming a logic LSI such as CPU and a memory Sl on the same semiconductor substrate. A one chip microcomputer shown in FIG. 64 includes a DRAM of the invention at a RAM portion. This DRAM is made, like the DRAM of Embodiment 5, by forming first interconnection layers of a peripheral circuit simultaneously with the formation of low resistance bit lines, forming second interconnection layers of the peripheral circuit simultaneously with the formation of a plate electrode of an information storage capacitor, and further forming third interconnection layers simultaneously with the formation of a Y select line.

When using this type of DRAM at the RAM portion of the one chip microcomputer, the manufacturing process of the one chip microcomputer can be simplified with reduced manufacturing costs for the reason that the first interconnection layers, such as for the CPU unit and an input/output (I/O) circuit, are formed simultaneously with the formation of the bit lines BL, the second interconnection layers (M2) are formed simultaneously with the formation of the plate electrode, and the third interconnection layers (M3) are formed simultaneously with the Y select line.

Although various embodiments of the invention have been particularly described hereinabove, the invention is not limited to those embodiments and various variations and modifications may be possible without departing from the spirit of the invention.

The features and advantages of typical embodiments disclosed herein are briefly summarized below.

According to the invention, the interconnections of memory arrays and the interconnections of a peripheral circuit can be reduced in number, so that the number of the steps of manufacturing the DRAM can be reduced with an improved yield and a reduced production cost.

Because the gate electrodes (word lines) can be made low in resistance according to the invention, word drivers and sense amplifiers connected to a given number of memory cells can be reduced in number. This allows a reduced chip size and an improved degree of integration of DRAM.

The first interconnection layers and the second interconnection layers connecting a n channel-type MISFET and a p channel-type MISFET of a peripheral circuit are disposed below the information storage capacitor of a memory cell. Thus, the aspect ratio of connection holes formed over the source and drain regions of these MISFET'S is made small, thereby improving the connection reliability of the interconnections of the peripheral circuit.

What we claim is:

1. A semiconductor integrated circuit device comprising:
   first MISFETs formed in a first region, each of said first MISFETs at least having a source region and a drain region;
   second MISFETs formed in a second region, each of said second MISFETs at least having a source region and a drain region;

at least one bit line formed over said first region;

at least one word line formed in said first region;

at least one capacitor element formed over one of said bit lines, wherein each of said first MISFETs is included in an individual one of plural memory cells, each of said memory cells being coupled to a respective word line, a respective bit line and said capacitor element corresponding thereto;

a first insulating film interposed between said first and second MISFETs and said at least one bit line;

a second insulating film formed over said first insulating film, said second insulating film being interposed between said at least one bit line and said at least one capacitor element; and a wiring layer formed over said second insulating film, wherein each of said at least one bit line is connected to one of said source and drain regions of ones of said first MISFETs corresponding thereto via one of first plugs formed in said first insulating film, wherein each of said at least one capacitor element is connected to the other of said source and drain regions of ones of said first MISFETs corresponding thereto via a corresponding second plug formed in said second insulating film and another of said first plugs, wherein said wiring layer is connected to said source and drain regions of ones of said second MISFETs via respective ones of third plugs formed in said first and second insulating film, and wherein said second plug is formed of a built-up film.

2. A semiconductor integrated circuit device according to claim 1, wherein said built-up film is formed of a titanium nitride film and a tungsten film.

3. A semiconductor integrated circuit device comprising:

first MISFETs formed in a first region, each of said first MISFETs at least having a source region and a drain region;

second MISFETs formed in a second region, each of said second MISFETs at least having a source region and a drain region;

at least one bit line formed over said first region;

at least one word line formed in said first region;

at least one capacitor element formed over one of said bit lines, wherein each of said first MISFETs is included in an individual one of plural memory cells, each of said memory cells being coupled to a respective word line, a respective bit line and said capacitor element corresponding thereto;

a first insulating film interposed between said first and second MISFETs and said at least one bit line;

a second insulating film formed over said first insulating film, said second insulating film being interposed between said at least one bit line and said at least one capacitor element; and a wiring layer formed over said second insulating film, wherein each of said at least one bit line is connected to one of said source and drain regions of ones of said first MISFETs corresponding thereto via one of first plugs formed in said first insulating film, wherein each of said at least one capacitor element is connected to the other of said source and drain regions of ones of said first MISFETs corresponding thereto via a corresponding second plug formed in said second insulating film and another of said first plugs, wherein said wiring layer is connected to said source and drain regions of ones of said second MISFETs via respective ones of third plugs formed in said first and second insulating film, and wherein said third plugs are formed of a built-up film.

4. A semiconductor integrated circuit device according to claim 3, wherein said built-up film is formed of a titanium nitride film and a tungsten film.

* * * * *